United States Patent
Nakamura et al.

(10) Patent No.: US 8,299,599 B2
(45) Date of Patent: Oct. 30, 2012

(54) SEMICONDUCTOR DEVICE

(75) Inventors: Hiroyuki Nakamura, Kanagawa (JP);
Atsushi Fujiki, Kanagawa (JP);
Tatsuhiro Seki, Kanagawa (JP); Nobuya Koike, Kanagawa (JP); Yukihiro Sato, Kanagawa (JP); Kisho Ashida, Hitachinaka (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 55 days.

(21) Appl. No.: 13/040,234

(22) Filed: Mar. 3, 2011

(65) Prior Publication Data
US 2011/0215400 A1    Sep. 8, 2011

(30) Foreign Application Priority Data
Mar. 8, 2010 (JP) .................. 2010-050806

(51) Int. Cl.
*H01L 23/48* (2006.01)
*H01L 23/10* (2006.01)
(52) U.S. Cl. ......... 257/691; 257/712; 257/713; 257/720
(58) Field of Classification Search .......... 257/690–692, 257/706–722
See application file for complete search history.

(56) References Cited

U.S. PATENT DOCUMENTS

| 7,202,557 | B2* | 4/2007 | Oliver et al. ................. 257/692 |
| 7,999,369 | B2* | 8/2011 | Malhan et al. ................ 257/690 |
| 2004/0184209 | A1 | 9/2004 | Yamamoto |
| 2005/0199999 | A1* | 9/2005 | Shirasawa et al. ........... 257/706 |
| 2009/0016088 | A1* | 1/2009 | Bayerer et al. ............... 257/712 |
| 2009/0290271 | A1* | 11/2009 | Yang et al. .................... 257/690 |
| 2010/0289127 | A1* | 11/2010 | Kanazawa et al. .......... 257/666 |

FOREIGN PATENT DOCUMENTS

| JP | 4-119004 A | 4/1992 |
| JP | 2004-236435 A | 8/2004 |
| JP | 2004-273824 A | 9/2004 |

* cited by examiner

*Primary Examiner* — Cuong Q Nguyen
(74) *Attorney, Agent, or Firm* — Miles & Stockbridge P.C.

(57) ABSTRACT

To improve the performance and reliability of semiconductor devices. For the semiconductor chip CP1, power MOSFETs Q1 and Q2 for the switch, a diode DD1 for detecting the heat generation of the power MOSFET Q1, a diode DD2 for detecting the heat generation of the power MOSFET Q2, and plural pad electrodes PD are formed. The power MOSFET Q1 and the diode DD1 are arranged in a first MOSFET region RG1 on the side of a side SD1, and the power MOSFET Q2 and the diode DD2 are arranged in a second MOSFET region RG2 on the side of a side SD2. The diode DD1 is arranged along the side SD1, the diode DD2 is arranged along the side SD2, and all pad electrodes PD other than the pad electrodes PDS1 and PDS2 for the source are arranged along a side SD3 between the diodes DD1 and DD2.

22 Claims, 22 Drawing Sheets

SEMICONDUCTOR DEVICE

CROSS-REFERENCE TO RELATED APPLICATION

The disclosure of Japanese Patent Application No. 2010-50806 filed on Mar. 8, 2010 including the specification, drawings and abstract is incorporated herein by reference in its entirety.

BACKGROUND OF THE INVENTION

The present invention relates to a semiconductor device, in particular, to a technology that is useful when applied to semiconductor devices having two outputs.

A semiconductor device in a shape of a semiconductor package is manufactured by mounting a semiconductor chip over a chip-mounting part of a lead frame, connecting plural leads of the lead frame with plural electrodes of the semiconductor chip by a bonding wire etc., forming a sealing resin part for sealing the chip-mounting part, the semiconductor chip, the bonding wire and the inner lead part of plural leads, cutting the lead from the lead frame, and bending the outer lead part of the lead.

Japanese Patent Laid-Open No. 1992-119004 (Patent Document 1) describes a technology concerning a power output circuit of a multi-channel output configuration having output circuits of plural systems.

Japanese Patent Laid-Open No. 2004-236435 (Patent Document 2) describes a technology concerning the use of a diode for detecting the overheating of a transistor.

Japanese Patent Laid-Open No. 2004-273824 (Patent Document 3) describes a technology concerning the detection of the temperature of LDMOS with a diode.

SUMMARY OF THE INVENTION

According to the examination by the present inventors, the following was known.

As a switching element, a power MOSFET capable of handling high power is utilized, and, by packaging a semiconductor chip for which the power MOSFET is formed, a semiconductor package for switching can be obtained. For example, by connecting the power MOSFET as a switching element between a power source and a load, and switching ON/OFF of the power MOSFET, it is possible to switch between a state where the output (voltage) of the power source is supplied to the load and a state where no output is supplied.

The switching element is used in such a case where two switching elements are prepared and used while controlling these independently, in addition to a case where it is used solely. For example, two power MOSFETs as the switching element can be connected between a power source and two loads, respectively, to cause one power MOSFET to control ON/OFF of the output (voltage) supply of the power source to one load, and to cause another power MOSFET to control ON/OFF of the output (voltage) supply of the power source to another load.

When each of two power MOSFETs as the switching element is formed into a semiconductor chip independently to give two chips, it is considered to form these two semiconductor chips into packages separately, but, in this case, the number of parts constituting the electronic device containing the switching element increases to cause the increase in the cost and the size of the whole electronic device. On the other hand, it is considered to form these two semiconductor chips into one package, but, in this case, since the semiconductor package contains these two semiconductor chips, the size of the semiconductor package itself increases and the number of semiconductor chips also increases to cause the increase in the cost.

Therefore, the present inventors examined the formation of two power MOSFETs as the switching element in one semiconductor chip. When these two power MOSFETs are formed in one chip, it is possible to decrease the size of the semiconductor package containing these two power MOSFETs and to reduce the cost. The switching of ON/OFF of respective power MOSFETs can be performed by a semiconductor chip for control different from the semiconductor chip in which two power MOSFETs are formed.

When two power MOSFETs as the switching element are formed in one semiconductor chip, however, it was known that following problems occur, as the result of the examination of the present inventors.

The power MOSFET formed in a semiconductor, chip is used as the switching element, and, when excessive heat is generated by an excessive current supplied to the power MOSFET caused by the short circuit of the load connected to the power MOSFET etc., it is necessary to turn off the power MOSFET forcibly and promptly. Therefore, in the semiconductor chip in which the power MOSFET as the switching element is formed, it is effective to previously form a diode for detecting the heat generation (temperature) of the power MOSFET. When an excessive current is supplied to the power MOSFET to generate excessive heat, it is possible to detect it by the diode to turn off the power MOSFET forcibly. When two power MOSFETs as the switching element is formed in one semiconductor chip, as described above, two diodes have only to be formed in the semiconductor chip, the heat generation (temperature) of one power MOSFET has only to be detected by one diode, and the heat generation (temperature) of the other power MOSFET has only to be detected by the other diode.

When one power MOSFET generates excessive heat, it is necessary to detect it with one diode to turn off the one power MOSFET forcibly, but, however, there is such an anxiety that, when the other diode operates erroneously (detects it erroneously), the other power MOSFET, which is in a normal state (that is, not necessary to be turned off), might also be turned off forcibly. The occurrence of such an erroneous operation lowers the performance and reliability of semiconductor devices containing the switching element. Accordingly, it is desired to prevent the erroneous operation of the diode, and to improve the performance and reliability of the semiconductor device containing the switching element.

The present invention has been made in view of the above circumstances and provides a technology capable of improving the performance of semiconductor devices.

Moreover, the present invention provides a technology capable of improving the reliability of semiconductor devices.

The other purposes and the new feature of the present invention will become clear from the description of the present specification and the accompanying drawings.

The following explains briefly the outline of a typical invention among the inventions disclosed in the present application.

A semiconductor device in a typical embodiment is a semiconductor device provided with a first semiconductor chip having a first side and a second side facing the first side, wherein, for the first semiconductor chip, a first circuit, second circuit, a first diode for detecting the heat generation of the first circuit, a second diode for detecting the heat generation of the second circuit, and plural first pad electrodes are formed. The first circuit is arranged so as to lie nearer to the first side instead of the second side in the main surface of the first semiconductor chip, and the second circuit is arranged between the first circuit and the second side in the main surface of the first semiconductor chip. The first diode is arranged so as to lie nearer to the first side instead of the second circuit in the main surface of the first semiconductor chip, and the second diode is arranged so as to lie nearer to the second side instead of the first circuit in the main surface of the first semiconductor chip. The plural first pad electrodes include a pad electrode for a first source connected electrically to the first circuit and a second pad electrode for the source connected electrically to the second circuit, and at least one among the plural first pad electrodes excluding the first and second pad electrodes for the source is arranged between the first diode and the second diode in the main surface of the first semiconductor chip.

The following explains briefly the effect acquired by the typical invention among the inventions disclosed in the present application.

According to the typical embodiment, the performance of the semiconductor device can be improved.

Moreover, the reliability of the semiconductor device can be improved.

DETAILED DESCRIPTION OF THE PREFERRED EMBODIMENTS

Figure 1:
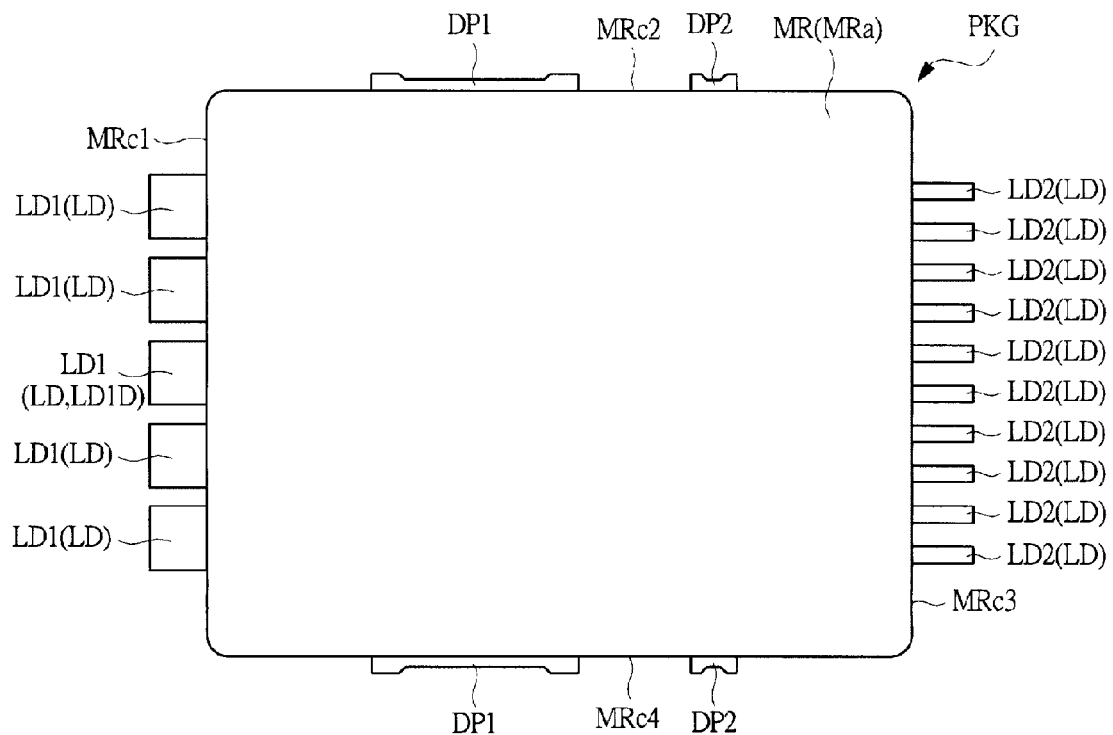
FIG. 1 is the top view of the semiconductor device being an embodiment of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

Hereinafter, the embodiment of the present invention will be described in detail on the basis of the drawings. Meanwhile, in all drawings for explaining embodiments, the same symbol is attached to members having the same function, as a principle, and the repeated explanation thereof is omitted. Moreover, in the following embodiment, the explanation of the same or similar parts is not repeated, as a principle, except for cases that require the explanation in particular.

In the drawings used for the embodiments, in order to make a drawing intelligible, hatching may be omitted even if it is a cross-sectional view. On the other hand, hatching may be attached even when it is a plan view in order to make a drawing intelligible.

In the present application, a field-effect transistor is referred to as a MOSFET (Metal Oxide Semiconductor Field Effect Transistor) or a MOS simply, but it does not exclude a non-oxide film as a gate insulating film. Consequently, in the following explanations, the MOSFET may be replaced by a MISFET (Metal Insulator Semiconductor Field Effect Transistor).

Embodiment 1

A semiconductor device of an embodiment of the present invention will be explained with reference to the drawings.

<About the Structure of the Semiconductor Device (Semiconductor Package)>

Figure 2:
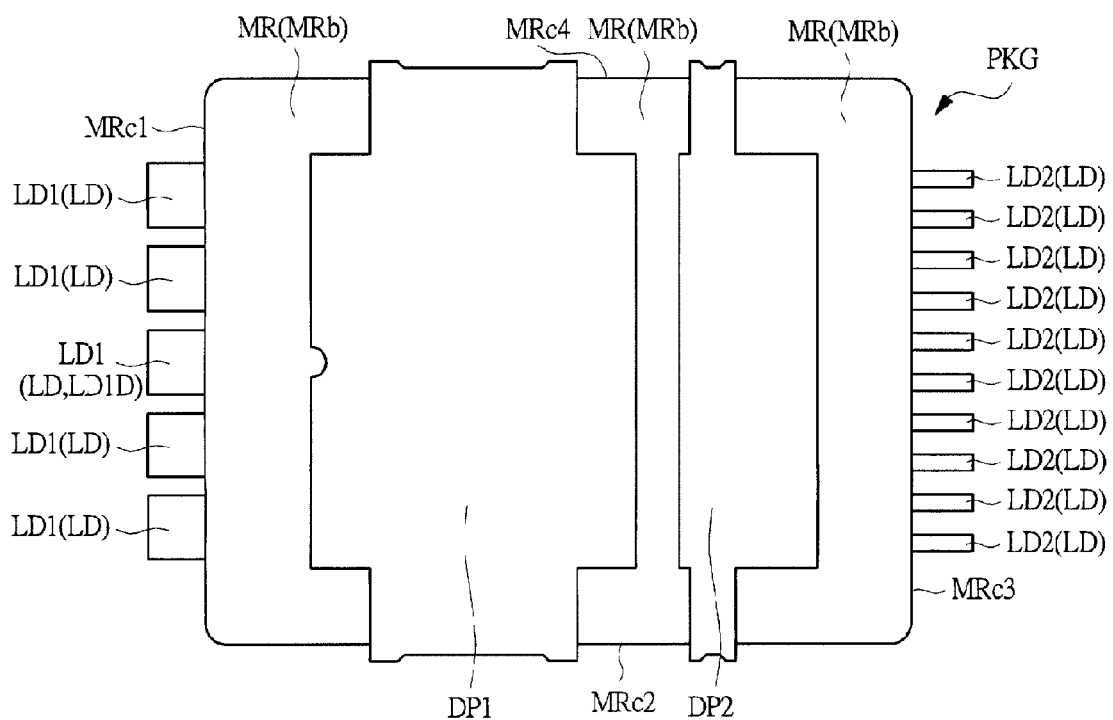
FIG. 2 is the bottom view of the semiconductor device being an embodiment of the present invention.
Figure 3:
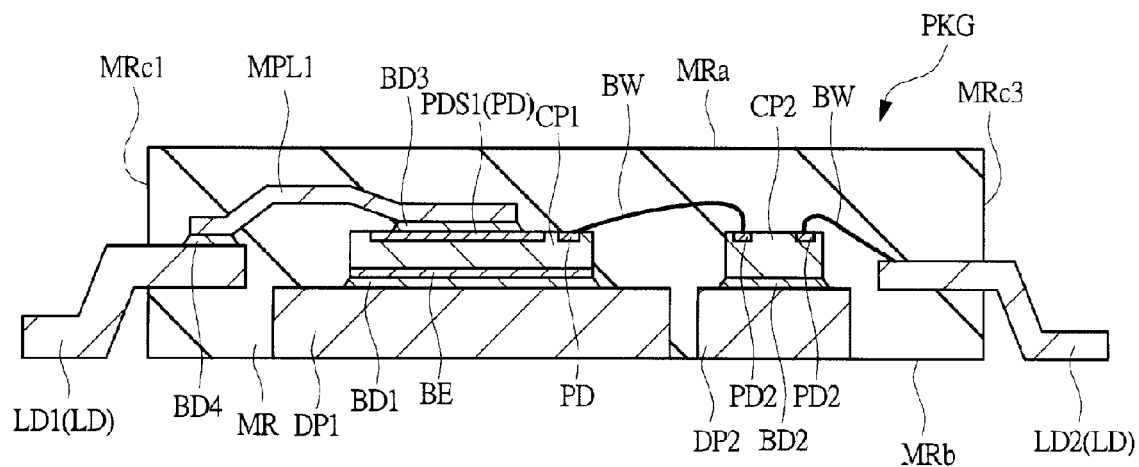
FIG. 3 is the cross-sectional view of the semiconductor device being an embodiment of the present invention.
Figure 4:
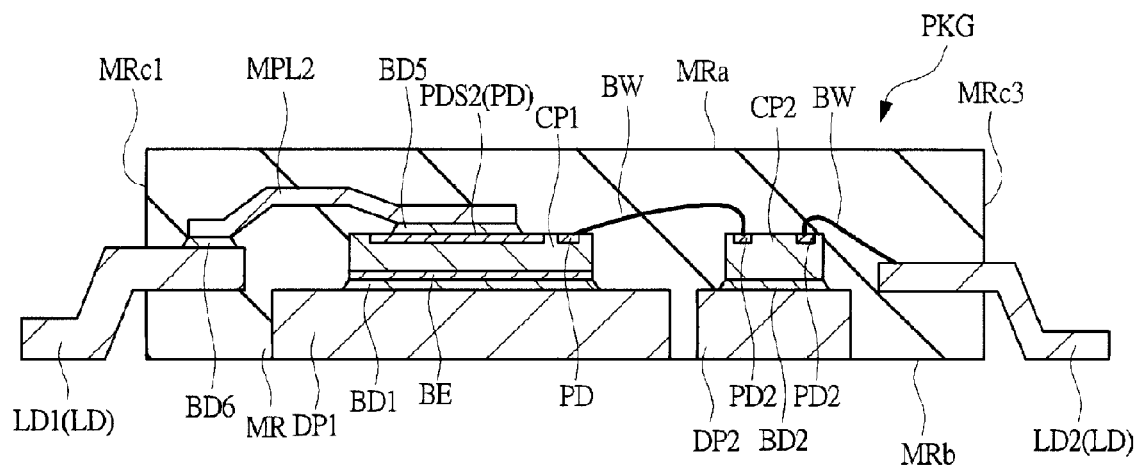
FIG. 4 is the cross-sectional view of the semiconductor device being an embodiment of the present invention.
Figure 5:
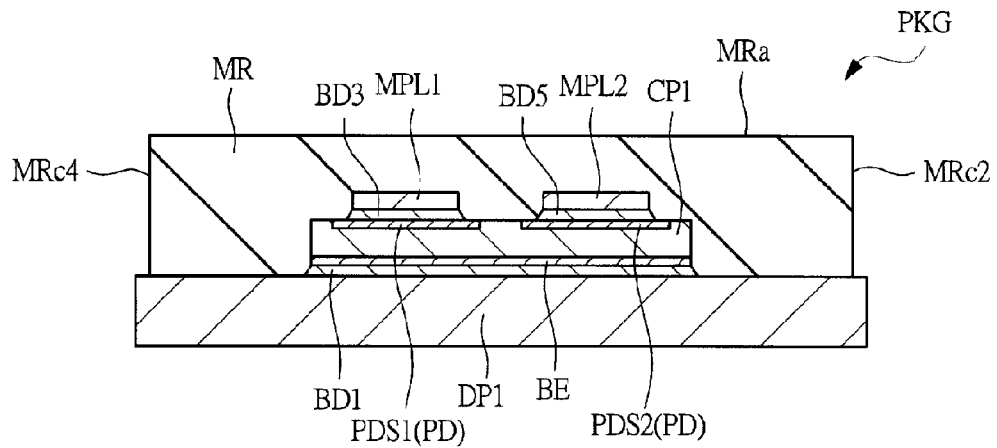
FIG. 5 is the cross-sectional view of the semiconductor device being an embodiment of the present invention.
Figure 6:
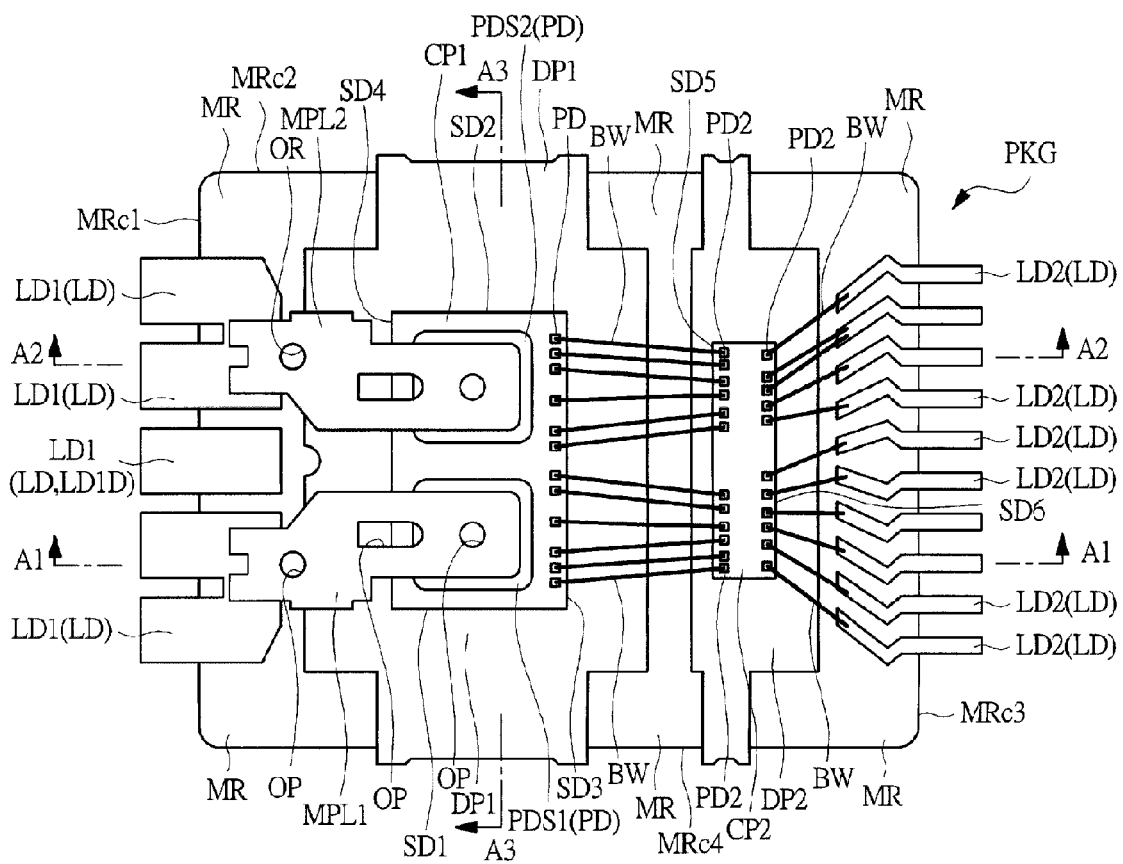
FIG. 6 is the planar perspective view of the semiconductor device being an embodiment of the present invention.
Figure 7:
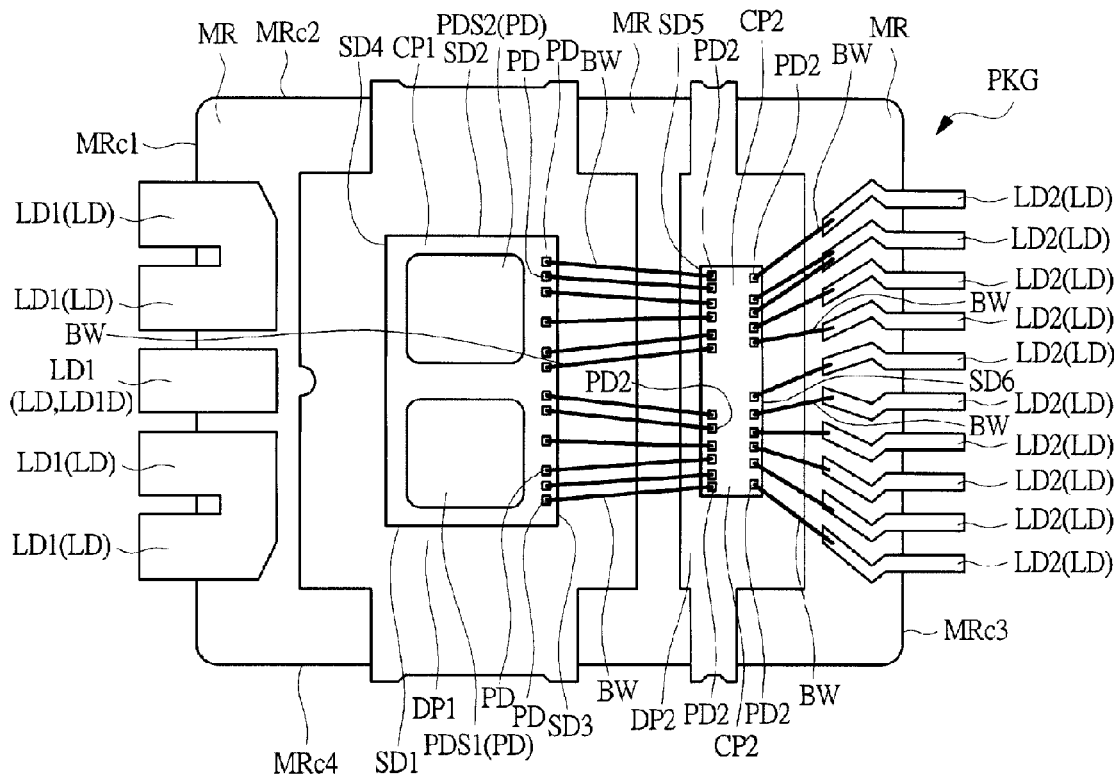
FIG. 7 is the planar perspective view of the semiconductor device being an embodiment of the present invention.
Figure 8:
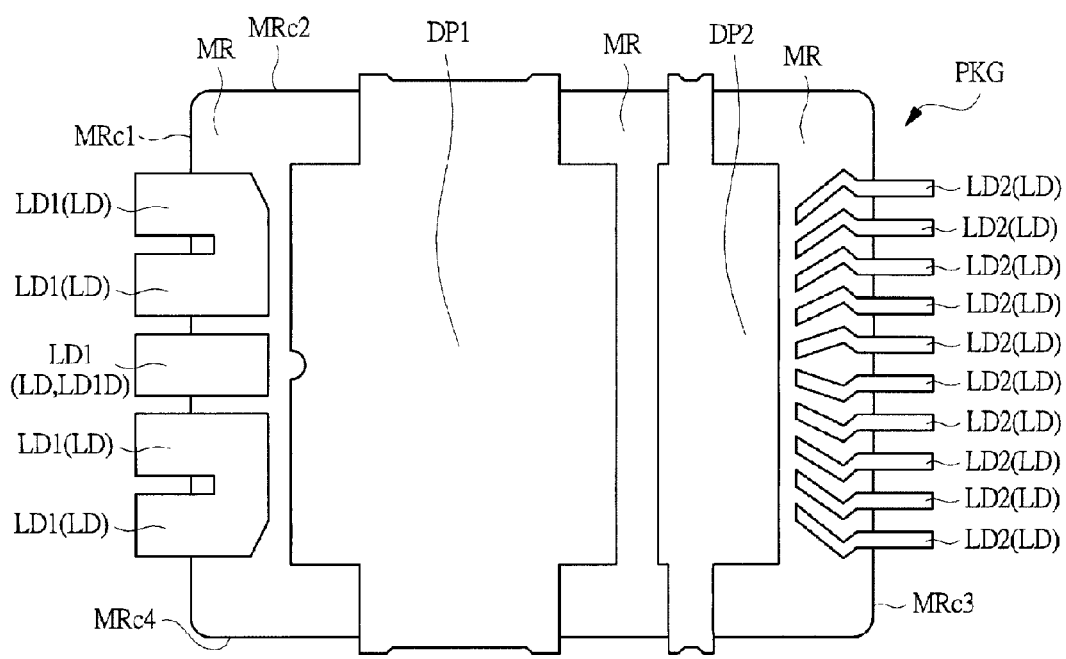
FIG. 8 is the planar perspective view of the semiconductor device being an embodiment of the present invention.

FIG. 1 is the top view (plan view) of a semiconductor device PKG being an embodiment of the present invention, FIG. 2 is a bottom view (plan view) of the semiconductor device PKG, FIGS. 3 to 5 are cross-sectional views of the semiconductor device PKG, and FIGS. 6 to 8 are planar perspective views (top views) of the semiconductor device PKG. The cross-section of the semiconductor device PKG at the position of A1-A1 line in FIG. 6 approximately corresponds to FIG. 3, the cross-section of the semiconductor device PKG at the position of A2-A2 line in FIG. 6 approximately corresponds to FIG. 4, and the cross-section of the semiconductor device PKG at the position of A3-A3 line in FIG. 6 approximately corresponds to FIG. 5. FIG. 6 also shows the planar perspective view of the upper surface side of the semiconductor device PKG when a sealing part MR is seen through. FIG. 7 is the planar perspective view (top view) of the semiconductor device PKG when metal plates MPL1 and MPL2 are seen through (omitted) in FIG. 6. FIG. 8 is the planar perspective view (top view) of the semiconductor device PKG when a bonding wire BW and semiconductor chips CP1 and CP2 are further seen through (omitted) in FIG. 7.

In the semiconductor device PKG in Embodiment 1, a semiconductor chip CP1 for which a power MOSFET (corresponding to power MOSFETs Q1 and Q2 to be described later) being a field-effect transistor for switching is formed, and a semiconductor chip CP2 for control are put (packaged) together in one semiconductor package to form one semiconductor device (semiconductor package) PKG.

The semiconductor device PKG in Embodiment 1 shown in FIGS. 1 to 8 has semiconductor chips CP1 and CP2, die pads (chip-mounting parts) DP1 and DP2 for mounting the semiconductor chips CP1 and CP2, respectively, plural leads LD formed by an electroconductive body, and the sealing part MR for sealing these.

The sealing part (sealing resin part) MR contains a resin material, for example, such as a heat curable resin material, and may contain filler etc. For example, an epoxy resin containing a filler can be used for forming the sealing part MR. In addition to an epoxy-based resin, a biphenyl-based heat curable resin, to which, for example, a phenol-based curing agent, silicone rubber, filler etc. are added, may be used as the material of the sealing part MR for the reason of reducing the stress, etc.

The sealing part MR has an upper surface (front surface) MRa being one main surface, a lower surface (back surface, bottom face) MRb being the main surface on the side opposite to the upper surface MRa, and side surfaces MRc1, MRc2, MRc3 and MRc4 intersecting with the upper surface MRa and the lower surface MRb. That is, the outer appearance of the sealing part MR has a thin plate shape surrounded by the upper surface MRa, lower surface MRb and the side surfaces MRc1, MRc2, MRc3 and MRc4. The planar shape of the upper surface MRa and the lower surface MRb of the sealing part MR is formed, for example, in a rectangular shape, wherein the corner of the rectangle (planar rectangle) can also be rounded. When the planar shape of the upper surface MRa and the lower surface MRb of the sealing part MR is formed in a rectangle, in the sealing part MR, the planar shape (outer shape) intersecting with the thickness thereof becomes rectangular (quadrangular). Among the side surfaces MRc1, MRc2, MRc3 and MRc4 of the sealing part MR, the side surface MRc1 and the side surface MRc3 face each other, the side surface MRc2 and the side surface MRc4 face each other, the side surface MRc1 intersects with the side surfaces MRc2 and MRc4 each other, and the side surface MRc3 intersects with the side surfaces MRc2 and MRc4 each other.

Plural leads (lead parts) LD contain an electroconductive body, and contain preferably a metallic material such as copper (Cu) or copper alloy. In each of plural leads LD, a part thereof is sealed in the sealing part MR, and the other part protrudes from the side surface of the sealing part MR to the outside of the sealing part MR. Hereinafter, among the leads LD, a part positioned in the sealing part MR is referred to as an inner lead part, and a part positioned outside the sealing part MR is referred to as an outer lead part.

Meanwhile, the semiconductor device PKG in Embodiment 1 has such a structure that a part (outer lead part) of respective leads protrudes from the side surface of the sealing part MR, and the explanation will be performed below on the basis of the structure. But the structure is not limited to the above one, and, for example, a configuration, in which respective leads LD scarcely protrude from the side surface of the sealing part MR and a part of respective leads LD is exposed at the lower surface MRb of the sealing part MR (QFN-type configuration), etc. may also be adopted.

Plural leads LD contain plural leads LD1 and plural leads LD2. Plural leads LD1 among plural leads LD are arranged on the side surface MRc1 side of the sealing part MR, and respective outer lead parts of plural leads LD1 protrude from the side surface MRc1 of the sealing part MR to the outside of the sealing part MR. On the other hand, plural leads LD2 among plural leads LD are arranged on the side surface MRc3 side of the sealing part MR, and respective outer lead parts of plural leads LD2 protrude from the side surface MRc3 of the sealing part MR to the outside of the sealing part MR. The outer lead part of respective leads LD (LD1 and LD2) has been bent so that the lower surface near the end part of the outer lead part is positioned approximately on the same plane as the lower surface MRb of the sealing part MR. The outer lead part of the lead LD (LD1 and LD2) functions as a terminal part for external connection (external terminal) of the semiconductor device PKG.

As can be seen from FIGS. 3 and 4 and FIGS. 6 to 8, the die pad DP1 and the die pad DP2 are arranged adjacently so that one side of the die pad DP1 and one side of the die pad DP2 lie along with each other in a separated state with a prescribed interval, the die pad DP1 is arranged on the nearer side to the side surface MRc1 of the sealing part MR, and the die pad DP2 is arranged on the nearer side to the side surface MRc3 of the sealing part MR. The die pad DP1 is a chip-mounting part for mounting the semiconductor chip CP1, and the die pad DP2 is a chip-mounting part for mounting the semiconductor chip CP2. While reflecting that the semiconductor chip CP1 is larger (has a larger planar dimension (area)) in the semiconductor chip CP1 and the semiconductor chip CP2, the die pad DP1 for mounting the semiconductor chip CP1 is larger (has a larger planar dimension (area)) in the die pad DP1 and the die pad DP2.

The portion between the die pad DP1 and the die pad DP2 is filled with a resin material constituting the sealing part MR, and the die pads DP1 and DP2 are insulated mutually. Between the die pads DP1 and DP2, no lead LD is arranged, plural leads LD1 are arranged (arrayed) along the side on the surface MRc1 side of the sealing part MR in the die pad DP1 (the side opposite to the side facing the die pad DP2), and plural leads LD2 are arranged (arrayed) along the side on the surface MRc3 side of the sealing part MR in the die pad DP2 (the side opposite to the side facing the die pad DP1). That is, plural leads LD1 are arranged (arrayed) along the side surface MRc1 of the sealing part MR between the die pad DP1 and the side surface MRc1 of the sealing part MR, and plural leads LD2 are arranged along the side surface MRc3 of the sealing part MR between the die pad DP2 and the side surface MRc3 of the sealing part MR.

At the lower surface MRb of the sealing part MR, respective lower surfaces (back surfaces) of the die pads DP1 and DP2 are exposed. At the upper surface MRa of the sealing part MR, the die pads DP1 and DP2 are not exposed. Moreover, because of the connection of the die pads DP1 and DP2 to the lead frame (the flame rime thereof) when the semiconductor device PKG is manufactured, a part of the die pads DP1 and DP2 are exposed at the side surface MRc2 and side surface MRc4 of the sealing part MR.

The die pads DP1 and DP2 contain an electroconductive body, preferably a metallic material such as copper (Cu) or copper alloy. If the die pads DP1 and DP2 and plural leads LD contained in the semiconductor device PKG are formed from the same material (same metallic material), it is more preferable. This makes it easy to produce the lead frame to which the die pads DP1 and DP2 and plural leads LD are connected, and to manufacture the semiconductor device PKG using the lead frame.

Over the upper surface (main surface) of the die pad DP1, the semiconductor chip CP1 is mounted in such a state where the front surface (main surface, upper surface) thereof fronts up and the back surface (lower surface) thereof fronts to the die pad DP1. Over the upper surface (main surface) of the die pad DP2, the semiconductor chip CP2 is mounted in such a state where the front surface (main surface, upper surface) thereof fronts up and the back surface thereof (lower surface) fronts to the die pad DP2. The semiconductor chip CP1 (back surface thereof) is adhered and fixed to the die pad DP1 (upper surface thereof) via an adhesive layer (joining material) BD1, and the semiconductor chip CP2 (back surface thereof) is adhered and fixed to the die pad DP2 (upper surface thereof) via the adhesive layer (joining material) BD2. The semiconductor chips CP1 and CP2 are sealed in the sealing part MR, and are not exposed from the sealing part MR.

The semiconductor chip CP1 has a back electrode BE formed over the back surface (the main surface on the side to be adhered to the die pad DP1). Therefore, the adhesive layer BD1 for adhering the semiconductor chip CP1 has an electroconductivity, and, via the electroconductive adhesive layer BD1, the back electrode BE of the semiconductor chip CP1 is joined and fixed, and electrically connected to the die pad DP1. The back electrode BE of the semiconductor chip CP1 is connected electrically to the drain of the power MOSFET (corresponds to power MOSFETs Q1 and Q2 to be described later) formed in the semiconductor chip CP1. The adhesive layer BD1 contains, for example, an electroconductive paste type adhesive material such as silver (Ag) paste, or solder etc.

On the other hand, no back electrode is formed for the back surface of the semiconductor chip CP2. Therefore, the adhesive layer BD2 for adhering the semiconductor chip CP2 may be either electroconductive or insulative, but, when the adhesive layer BD2 is formed from the same material as the adhesive layer BD1, the assembling process of the semiconductor device PKG can be simplified.

The semiconductor chips CP1 and CP2 are manufactured by forming various semiconductor elements or semiconductor integrated circuits for the main surface of a semiconductor substrate (semiconductor wafer) having, for example, single crystalline silicon etc., and then, separating the semiconductor substrate into respective semiconductor chips by dicing etc. The semiconductor chips CP1 and CP2 have a plane shape of rectangle (tetragon), which intersects with the thickness direction thereof. The semiconductor chip CP1 has a larger plane area than the semiconductor chip CP2. The difference in the plane area is caused by the reason below. That is, for the semiconductor chip CP2, a controlling circuit for controlling the gate of the semiconductor chip CP1 and the like are formed, and, in consideration of the dimension of the whole semiconductor device PKG, the size of the outer shape needs to be as small as possible. In contrast, for the semiconductor chip CP1, the power MOSFET (corresponding to power MOSFETs Q1 and Q2 to be described later) is formed, and, in the power MOSFET, the ON resistance occurring in the transistor needs to be reduced as far as possible. The reduction of the ON resistance can be actualized by widening the channel width per a unit transistor cell area. Accordingly, the outer size of the semiconductor chip CP1 is formed larger than the outer size of the semiconductor chip CP2.

For the front surface (main surface, upper surface) of the semiconductor chip CP1, plural pad electrodes (pad, bonding pad, terminal) PD are formed. The kind of the pad electrodes PD of the semiconductor chip CP1 will be explained later. For the front surface (main surface, upper surface) of the semiconductor chip CP2, plural pad electrodes (pad, bonding pad, terminal) PD2 are formed. Here, in two main surfaces of the semiconductor chip CP1 positioned on the sides opposite to each other, the main surface on the side for which plural pad electrodes PD are formed is referred to as the front surface of the semiconductor chip CP1, and the main surface on the opposite side to the front surface and on the side facing the die pad DP1 is referred to as the back surface of the semiconductor chip CP1. In the same manner, in two main surfaces positioned on the sides opposite to each other in the semiconductor chip CP2, the main surface on the side for which plural pad electrodes PD2 are formed is referred to as the front surface of the semiconductor chip CP2, and the main surface on the opposite side to the front surface and on the side facing the die pad DP2 is referred to as the back surface of the semiconductor chip CP2.

The front surface of the semiconductor chip CP2 has a rectangular planar shape having two long sides and two short sides shorter than the long side, and plural pad electrodes PD2 are arranged along two long sides in the front surface of the semiconductor chip CP2. Among two long sides of the semiconductor chip CP2, one long side faces the semiconductor chip CP1 and the other long side faces plural leads LD2.

Plural pad electrodes PD of the semiconductor chip CP1 contain two pad electrodes (bonding pads) PDS1 and PDS2 of a large area, and pad electrodes PD other than the pad electrodes PDS1 and PDS2 are set to have a smaller area than the pad electrodes PDS1 and PDS2. The pad electrodes PDS1 and PDS2 are pad electrodes (bonding pads) for the source, and are connected electrically to the source (sources S1 and S2 to be described later) of the power MOSFET formed in the semiconductor chip CP1. The pad electrode PDS1 is a pad electrode connected electrically to the source of a power MOSFET Q1 to be described later formed in the semiconductor chip CP1, and the pad electrode PDS2 is a pad electrode connected electrically to the source of a power MOSFET Q2 to be described later formed in the semiconductor chip CP1, although details will be described later. In the semiconductor chip CP1, the pad electrode PDS1 is not connected electrically with the pad electrode PDS2.

The front surface of the semiconductor chip CP1 has a rectangular planar shape having sides SD1, SD2, SD3 and SD4, wherein, in the front surface of the semiconductor chip CP1, pad electrodes PD other than the pad electrodes PDS1 and PDS2 are arranged along the side SD3 on the side facing the semiconductor chip CP2, and the side SD4 (here, in the semiconductor chip CP1, the side SD4 is a side facing the side SD3) faces plural leads LD1. On the central side of the front surface of the semiconductor chip CP1, the pad electrode PDS1 and the pad electrode PDS2 are arranged side by side in the direction parallel to the sides SD3 and SD4.

Between plural pad electrodes PD other than the pad electrodes PDS1 and PDS2 of the semiconductor chip CP1 and plural pad electrodes PD2, of the semiconductor chip CP2, and between plural leads LD2 (inner lead part thereof) and plural pad electrodes PD2 of the semiconductor chip CP2 are connected electrically via plural bonding wires BW being an electroconductive connection member. The bonding wire BW is an electroconductive connection member, more specifically, an electroconductive wire, and preferably contains a metal thin wire such as a gold (Au) wire, copper (Cu) wire, aluminum (Al) wire or the like. The bonding wire BW is sealed in the sealing part MR, and is not exposed from the sealing part MR.

In a more specific explanation, among plural pad electrodes PD2 of the semiconductor chip CP2, plural pad electrodes PD2 arranged along the side SD5 on the side opposite to the semiconductor chip CP1 in the front surface of the semiconductor chip CP2 are connected electrically with plural pad electrodes PD other than the pad electrodes PDS1 and PDS2 among plural pad electrodes PD of the semiconductor chip CP1 via the bonding wire BW. And, among plural pad electrodes PD2 of the semiconductor chip CP2, plural pad electrodes PD2 arranged along a side SD6 on the side opposite to plural leads LD2 in the front surface of the semiconductor chip CP2 are connected electrically with plural leads LD2 (inner lead part thereof) via the bonding wire BW. That is, in both ends of respective bonding wires BW, one end part is connected to the pad electrode PD2 of the semiconductor chip CP2, and the other end part is connected to the pad electrode PD of the semiconductor chip CP1 or the inner lead part of lead LD2. Meanwhile, the portion between the inner lead parts of adjacent leads LD2, and the portion between the inner lead part of the lead LD2 and the die pad DP2 are filled with materials constituting the sealing part MR.

The pad electrode PDS1 of the semiconductor chip CP1 is connected electrically with the lead LD1 via the metal plate MPL1, and the pad electrode PDS2 of the semiconductor chip CP1 is connected electrically with another lead LD1 via the metal plate MPL2. That is, among the pad electrodes PD and PD2 of the semiconductor chips CP1 and CP2, to the pad electrodes PDS1 and PDS2, the bonding wire BW is not connected but the metal plates MPL1 and MPL2 are connected, and, to the pad electrodes PD and PD2 other than the pad electrodes PDS1 and PDS2, the bonding wire BW is connected. The metal plates MPL1 and MPL2 are sealed in the sealing part MR, and are not exposed from the sealing part MR.

In a more specific explanation, as shown also in FIG. 3, one end part of the metal plate MPL1 is joined and connected electrically to the pad electrode PDS1 of the semiconductor chip CP1 via an electroconductive adhesive layer (joining material) BD3, and the other end part of the metal plate MPL1 is joined and connected electrically to the lead LD1 (inner lead part thereof) via an electroconductive adhesive layer (joining material) BD4. And, as shown also in FIG. 4, one end part of the metal plate MPL2 is joined and connected electrically to the pad electrode PDS2 of the semiconductor chip CP1 via an electroconductive adhesive layer (joining material) BD5, and the other end part of the metal plate MPL2 is joined and connected electrically to the lead LD1 (inner lead part thereof) via an electroconductive adhesive layer (joining material) BD6. To the side surface MRc1 of the sealing part MR, plural leads LD1 are arranged, wherein the metal plate MPL2 is connected to a lead LD1 different from a lead LD1 to which the metal plate MPL1 is connected, so as not to short-circuit the metal plates MPL1 and MPL2 mutually.

The adhesive layers (joining materials) BD3, BD4, BD5 and BD6 used for joining the metal plates MPL1 and MPL2 are required to have electroconductivity, and, for example, an electroconductive paste type adhesive material such as a silver paste, solder etc. can be employed. Moreover, when the adhesive layers (joining materials) BD3, BD4, BD5 and BD6 are formed from the same material each other, the assembling process of the semiconductor device PKG can be simplified.

The metal plates MPL1 and MPL2 are formed from a metal (metallic material) having a high electroconductivity and thermal conductivity such as, for example, copper (Cu), copper (Cu) alloy, aluminum (Al) or aluminum (Al) alloy. From the standpoint of easy processing, a high thermal conductivity and comparatively low price, the metal plates MPL1 and MPL2 are more preferably formed from copper (Cu) or copper (Cu) alloy. The width of the metal plates MPL1 and MPL2 is larger (wider) than the width (diameter) of the bonding wire BW. The pad electrodes PDS1 and PDS2 for the source of the semiconductor chip CP1 are connected electrically with the lead LD1 via the metal plates MPL1 and MPL2, and, therefore, the ON resistance of the power MOSFET (corresponding to power MOSFETs Q1 and Q2 to be described later)

formed for the semiconductor chip CP1 can be reduced, as compared with an case where the pad electrodes PDS1 and PDS2 for the source of the semiconductor chip CP1 are connected with the lead LD1 by a wire. Consequently, the package resistance can be reduced and the conduction loss can be reduced. Moreover, in place of a wire formed from gold (Au), the use of the metal plates MPL1 and MPL2 formed from a metallic material that is less expensive than gold can reduce the cost of the semiconductor device PKG.

Moreover, as shown in FIG. 6, an opening part OP may be provided for respective metal plates MPL1 and MPL2. The opening part OP is provided in order to observe the condition or amount of the adhesive layers BD3 and BD5 joining between the metal plates MPL1 and MPL2 and the pad electrodes PDS1 and PDS2 of the semiconductor chip CP1 from the opening part OP, or to relax the stress occurring in respective metal plates MPL1 and MPL2, in the manufacturing process (assembling process) of the semiconductor device PKG.

Plural leads LD1 are arranged to the side surface MRc1 of the sealing part MR, wherein inner lead parts of an arbitrary number of leads LD1 may be integrally linked in the sealing part MR. In the case of FIGS. 6 to 8, five leads LD1 are arranged to the side surface MRc1 of the sealing part MR, wherein the inner lead parts of two leads LD1 among these are integrally linked with each other in the sealing part MR, to which the metal plate MPL1 is connected via the adhesive layer BD4, and the inner lead parts of other two leads LD1 are integrally linked with each other in the sealing part MR, to which the metal plate MPL2 is connected via the adhesive layer BD6. But, the lead LD1 to which the metal plate MPL1 is connected (that is, the lead LD1 connected electrically to the pad electrode PDS1 of the semiconductor chip CP1 through the metal plate MPL1) is not connected with the lead LD1 to which the metal plate MPL2 is connected (that is, the lead LD1 connected electrically to the pad electrode PDS2 of the semiconductor chip CP1 through the metal plate MPL2), but they are separated and insulated electrically by the resin material constituting the sealing part MR. And, plural leads LD1 are arranged to the side surface MRc1 of the sealing part. MR, wherein plural leads LD1 may include a lead LD1D of a dummy, which is not electrically connected to any of the pad electrodes PD and PD2 of the semiconductor chips CP1 and CP2. In the case of FIG. 6, the lead LD1D of a dummy is arranged between the lead LD1 to which the metal plate MPL1 is connected and the lead LD1 to which the metal plate MPL2 is connected. Meanwhile, the portion between the inner lead part of the lead LD1 and the die pad DP1 is filled with the material constituting the sealing part MR, and they are insulated electrically with each other.

Respective lower surfaces (back surfaces) of the die pads DP1 and DP2 are exposed from the lower surface MRb of the sealing part MR, and the heat generating in the operation of the semiconductor chips CP1 and CP2 is liberated mainly from the back surface of the semiconductor chips CP1 and CP2 through the die pads DP1 and DP2. Therefore, respective die pads DP1 and DP2 have a larger area than that of respective semiconductor chips CP1 and CP2 to be mounted there, which can improve heat-discharging properties. Moreover, the semiconductor chip CP1 generates a larger amount of heat in the semiconductor chips CP1 and CP2. Therefore, by setting the planar area of the die pad DP1 mounting the semiconductor chip CP1 to be larger than the planar area of the die pad DP2 mounting the semiconductor chip CP2, the heat generated in the semiconductor chip CP1 can be discharged effectively to improve further the heat-discharging properties.

Figure 9:
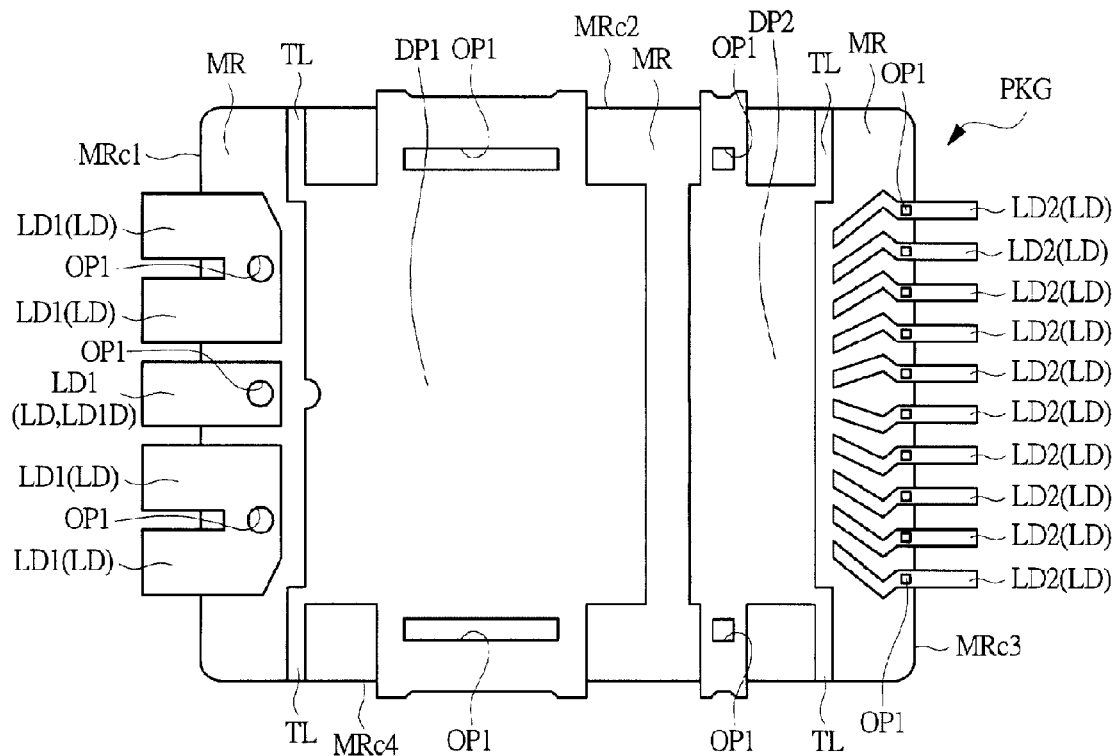
FIG. 9 is a planar perspective view showing a modified example of the semiconductor device being an embodiment of the present invention.

FIG. 9 is a planar perspective view (top view) showing a modified example of the semiconductor device PKG in Embodiment 1, and corresponds to FIG. 8. In the same manner as FIG. 8, FIG. 9 also shows a planar perspective view on the upper surface side of the semiconductor device PKG when the sealing part MR, the metal plates MPL1 and MPL2, the bonding wire BW, and the semiconductor chips CP1 and CP2 are seen through.

The difference between the semiconductor device PKG of the modified example shown in FIG. 9 and the semiconductor device PKG shown in FIGS. 1 to 8 lies in the following point. In the semiconductor device PKG of the modified example shown in FIG. 9, the opening part OP1 is formed at the die pads DP1 and DP2, plural leads LD1 (inner lead part thereof), and plural leads LD2 (inner lead part thereof). The inside of the opening part OP1 is filled with a material that constitutes the sealing part MR. The provision of the opening part OP1 allows the die pads DP1 and DP2, and the leads LD1 and LD2 to make it difficult to draw out from the sealing part MR. When the semiconductor device PKG is manufactured, the lead frame to which the die pads DP1 and DP2, and plural leads LD are connected can be used. In this case, in order to connect stably the die pads DP1 and DP2 to the frame rim of the lead frame, a suspended lead TL may also be added. The part of the suspended lead TL protruding from the sealing part MR is cut and removed after the formation of the sealing part, but the suspended lead TL in the sealing part MR remains. FIG. 9 shows the suspended lead TL remaining in the sealing part MR. The other configuration of the semiconductor device PKG of the modified example shown in FIG. 9 is the same as that of the semiconductor device PKG in FIGS. 1 to 8. Therefore, the explanation thereof will be omitted here.

Figure 10:
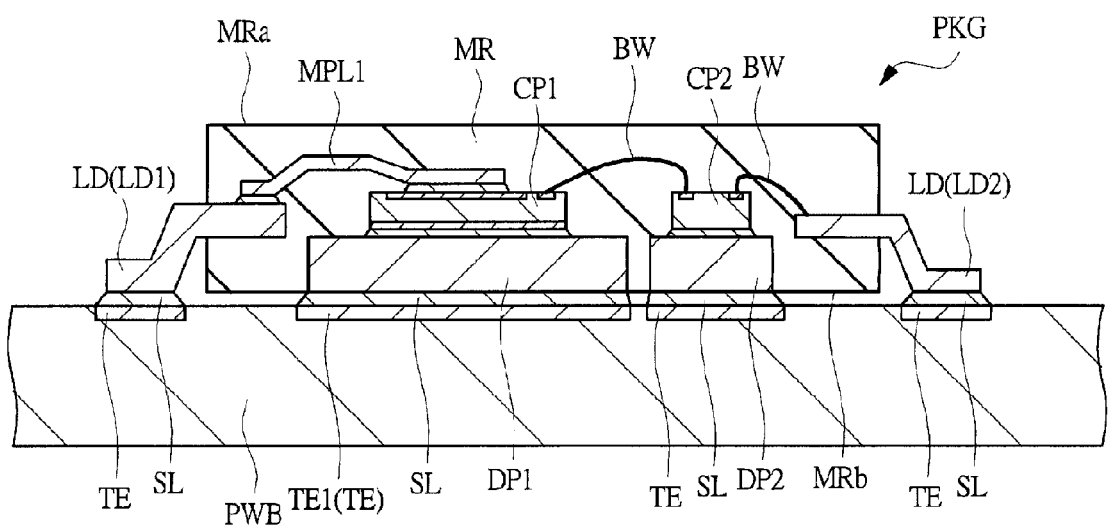
FIG. 10 is a cross-sectional view showing a mounted example of the semiconductor device being an embodiment of the present invention.

Next, FIG. 10 is a cross-sectional view showing a mounted example of the semiconductor device PKG. FIG. 10 shows the cross section corresponding to FIG. 3.

For the upper surface of the mounting substrate (wiring substrate) PWB for mounting the semiconductor device PKG, plural terminals TE are formed. In order to mount the semiconductor device PKG on the mounting substrate PWB, as shown in FIG. 10, the outer lead part of respective leads LD of the semiconductor device PKG is joined and connected electrically with respective terminals TE of the upper surface of the mounting substrate PWB via an electroconductive joining material such as solder SL. In this case, respective lower surfaces of the die pads DP1 and DP2 exposed at the lower surface MRb of the sealing part MR of the semiconductor device PKG are also joined and connected electrically with the terminal TE of the upper surface of the mounting substrate PWB via an electroconductive joining material such as solder SL. The lower surface of the die pad DP2 over which the semiconductor chip CP2 is mounted may not be connected to the terminal TE of the mounting substrate PWB, but, when it is connected to the terminal TE of the mounting substrate PWB, the heat generating in the semiconductor chip CP2 can be discharged to the mounting substrate PWB via the die pad DP2. On the other hand, as described above, the back electrode BE of the semiconductor chip CP1 is connected electrically to the die pad DP1 via the electroconductive adhesive layer BD1. Therefore, among plural terminals TE of the mounting substrate PWB, the terminal TE1 to be connected to the back electrode BE of the semiconductor chip CP1 is connected to the die pad DP1 (lower surface thereof) exposed at the lower surface MRb of the sealing part MR via an electroconductive joining material such as solder SL. This makes it possible to connect electrically plural terminals TE1 of the mounting substrate PWB to the back electrode BE of the semiconductor chip CP1 via the die pad DP1. Moreover, with this, it also becomes possible to discharge the heat generated in the semiconductor chip CP1 to the mounting substrate PWB via the die pad DP1.

As described above, in the semiconductor device PKG, the outer lead part of respective leads LD (LD1 and LD2) and the die pad DP1 exposed at the lower surface MRb of the sealing part MR can function as a terminal part for external connection (external terminal) of the semiconductor device PKG.

For manufacturing the semiconductor device PKG in Embodiment 1, for example, a technique below can be employed. That is, after preparing the lead frame to which the die pads DP1 and DP2, and plural leads LD are connected integrally, a die bonding process is performed to mount and join the semiconductor chips CP1 and CP2 over the die pads DP1 and DP2 of the lead frame via a joining material (the joining material works as the adhesive layers BD1 and BD2). After that, a wire bonding process is performed to connect the pad electrode PD of the semiconductor chip CP1 with the pad electrode PD2 of the semiconductor chip CP2, and the pad electrode PD2 of the semiconductor chip CP2 with the lead LD2, via the bonding wire BW. Then, the pad electrodes PDS1 and PDS2 for the source of the semiconductor chip CP1 are connected with the lead LD1 via the metal plates MPL1 and MPL2. After that, a molding process is performed to form the sealing part MR, and the die pads DP1 and DP2, and the lead LD are cut off (cut from) the lead frame and the outer lead part of the lead LD is bent to manufacture the semiconductor device PKG.

<About the Circuit Configuration of the Semiconductor Device>

Figure 11:
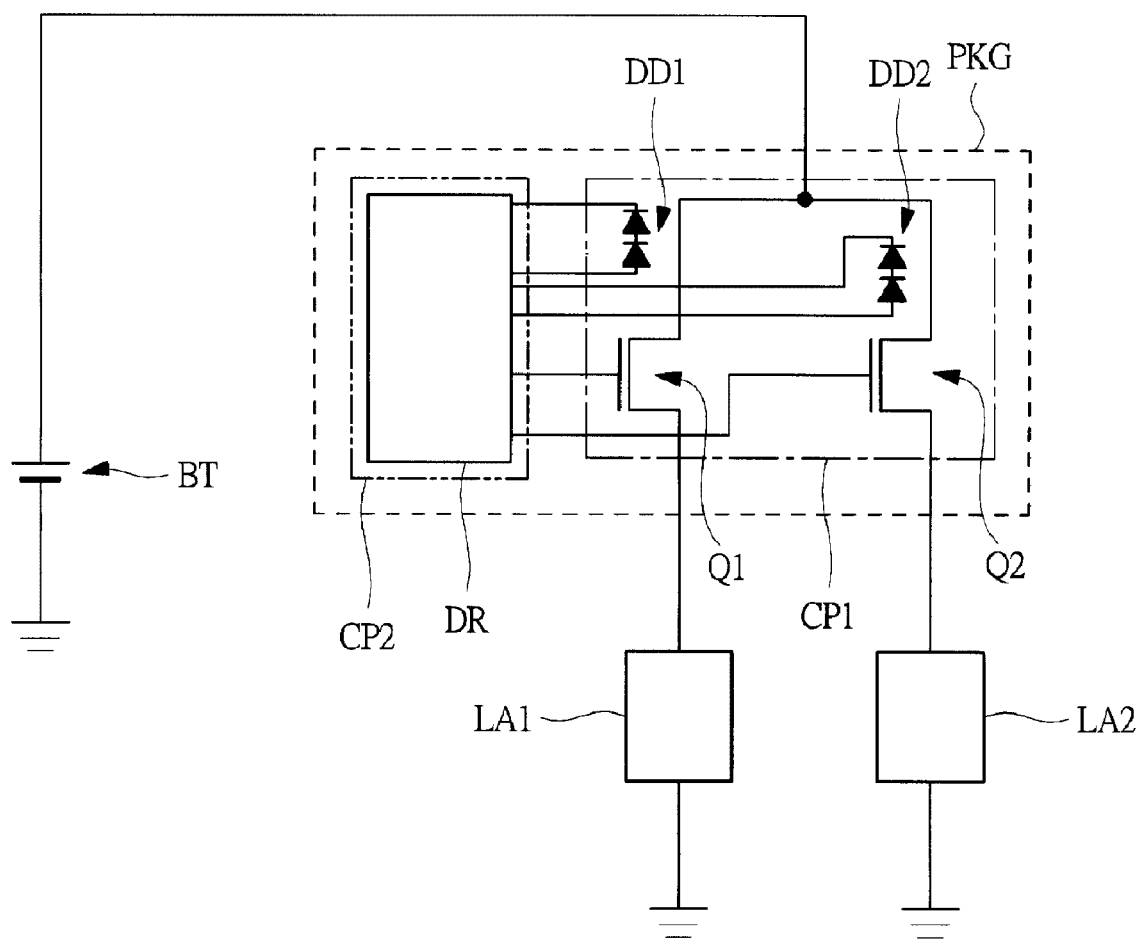
FIG. 11 is a circuit block diagram showing the example of the use of the semiconductor device being an embodiment of the present invention.

Next, the circuit configuration of the semiconductor device PKG will be explained. FIG. 11 is a circuit block diagram showing a use example of the semiconductor device PKG. In FIG. 11, the portion surrounded by a dotted line is a portion constituted by the semiconductor device PKG, the portion surrounded by a dashed one-dotted line is a portion constituted by the semiconductor chip CP1, and the portion surrounded by a dashed two-dotted line is a portion constituted by the semiconductor chip CP2.

As shown in FIG. 11, the semiconductor device PKG has two power MOSFETs (MOSFET: Metal Oxide Semiconductor Field Effect Transistor) Q1 and Q2 for a switch, and a controlling circuit (driving circuit) DR. The power MOSFETs Q1 and Q2 are controlled by a controlling circuit DR, and the controlling circuit DR is also equipped with a function of driver circuit (driving circuit) for driving the power MOSFETs Q1 and Q2. The power MOSFET Q1 and the power MOSFET Q2 are controlled (by the controlling circuit DR) independently from each other.

In Embodiment 1, the power MOSFET Q1 (first circuit) and the power MOSFET Q2 (second circuit) are built in the same semiconductor chip CP1, and the controlling circuit DR is built in another semiconductor chip CP2. Thus, the power MOSFET Q1 (first circuit) and the power MOSFET Q2 (second circuit) are circuits formed in the semiconductor chip CP1, and the controlling circuit DR is a circuit formed in the semiconductor chip CP2. The drain of the power MOSFET Q1 and the drain of the power MOSFET Q2 are connected electrically to the back electrode BE of the semiconductor chip CP1, and, therefore, are connected electrically with each other. Consequently, the back electrode BE of the semiconductor chip CP1 is a back electrode for the drain of the power MOSFETs Q1 and Q2. The drain (common drain) of the power MOSFETs Q1 and Q2 is connected with a power source (such as a battery) BT arranged outside the semiconductor device PKG. On the other hand, the source of the power MOSFET Q1 and the source of the power MOSFET Q2 are not short-circuited, and the source of the power MOSFET Q1 is connected to a load LA1 arranged outside the semiconductor device PKG, and the source of the power MOSFET Q2 is connected to a load LA2 arranged outside the semiconductor device PKG.

The gate of the power MOSFET Q1 and the gate of the power MOSFET Q2, respectively, are connected to the controlling circuit DR. And, it is constituted so that an ON signal (gate voltage that causes the power MOSFET Q1 to be the ON state) supplied to the gate of the power MOSFET Q1 from the controlling circuit DR can cause the power MOSFET Q1 to turn ON, and that an ON signal (gate voltage that causes the power MOSFET Q2 to be the ON state) supplied to the gate of the power MOSFET Q2 from the controlling circuit DR can cause the power MOSFET Q2 to turn ON.

When the power MOSFET Q1 is turned ON by supplying an ON signal to the gate of the power MOSFET Q1 from the controlling circuit DR, the voltage of the power source BT is output from the power MOSFET Q1 and supplied to the load LA1. When the power MOSFET Q1 is turned OFF by supplying an OFF signal to the gate of the power MOSFET Q1 from the controlling circuit DR (or by stopping the supply of the ON signal), the supply of the voltage to the load LA1 from the power source BT is stopped. And, when the power MOSFET Q2 is turned ON by supplying an ON signal to the gate of the power MOSFET Q2 from the controlling circuit DR, the voltage of the power source BT is output from the power MOSFET Q2 and supplied to the load LA2. When the power MOSFET Q2 is turned OFF by supplying an OFF signal to the gate of the power MOSFET Q2 from the controlling circuit DR (or by stopping the supply of the ON signal), the supply of the voltage to the load LA2 from the power source BT is stopped. Such ON/OFF control of the power MOSFETs Q1 and Q2 of the semiconductor chip CP1 is performed by the controlling circuit DR of the semiconductor chip CP2. Since the power MOSFET Q1 and the power MOSFET Q2 are controlled independently from each other by the controlling circuit DR, the ON/OFF switching of the power MOSFET Q1 and the ON/OFF switching of the power MOSFET Q2 can be controlled independently by the controlling circuit DR.

As described above, the semiconductor device PKG can function as a semiconductor device for a switch performing the ON/OFF switching of voltage application to the load LA1 from the power source BT, and the ON/OFF switching of voltage application to the load LA2 from the power source BT. And, respective power MOSFETs Q1 and Q2 of the semiconductor chip CP1 can function as a switch element (switching element). Moreover, since the output of the power MOSFETs Q1 and Q2 is supplied to the loads LA1 and LA2, respective power MOSFETs Q1 and Q2 can also be considered as an output circuit. The semiconductor chip CP1 can also be considered as a semiconductor device having a two-system output circuit (that is, power MOSFET Q1 and power MOSFET Q2).

In the semiconductor chip CP1 of the semiconductor device PKG, diodes DD1 and DD2 for detecting temperature are provided. The diode DD1 is a diode (circuit) for detecting the temperature of the power MOSFET Q1, which may also be considered as a diode (circuit) for detecting the heat generation of the power MOSFET Q1, and is arranged near the power MOSFET Q1 in the semiconductor chip CP1 for making the detection of the temperature (heat generation) of the power MOSFET Q1 possible. The diode DD2 is a diode (circuit) for detecting the temperature of the power MOSFET Q2, which may also be considered as a diode (circuit) for detecting the heat generation of the power MOSFET Q2, and is arranged near the power MOSFET Q2 in the semiconductor chip CP1 for making the detection of the temperature (heat generation) of the power MOSFET Q2 possible. The diodes DD1 and DD2 may also be considered as a temperature-detecting circuit.

Respective anodes and respective cathodes of the diodes DD1 and DD2 are connected to the controlling circuit DR. The diodes DD1 and DD2 have a voltage-current property that changes according to temperature. Therefore, by detecting (monitoring) the voltage-current property of respective diodes DD1 and DD2, the temperature of respective diodes DD1 and DD2 in the semiconductor chip CP1 (corresponding to the temperature of regions where respective diodes DD1 and DD2 are arranged in the semiconductor chip CP1) can be detected. Consequently, in the semiconductor chip CP1, by arranging the diode DD1 near the power MOSFET Q1, the temperature (heat generation) of the power MOSFET Q1 can be detected with the diode DD1, and, by arranging the diode DD2 near the power MOSFET Q2, the temperature (heat generation) of the power MOSFET Q2 can be detected with the diode DD2.

For example, the voltage (voltage between the anode and cathode) of respective diodes DD1 and DD2 is detected (monitored) in a state of applying a constant current to respective diodes DD1 and DD2, and, from the voltage value, the temperature of respective diodes DD1 and DD2 can be known. That is, in respective diodes DD1 and DD2, a higher temperature gives a lower voltage when a constant current is applied. Therefore, the voltage can be used to detect the temperature of respective diodes DD1 and DD2. The controlling circuit DR of the semiconductor chip CP2 supplies a constant current to respective diodes DD1 and DD2 and detects the voltage (voltage between the anode and cathode) of respective diodes. DD1 and DD2. It is also possible to detect (monitor) the current (current between the anode and cathode) of respective diodes DD1 and DD2 in a state of applying a constant voltage to respective diodes DD1 and DD2, and to know the temperature of respective diodes DD1 and DD2 from the current value.

More specifically, when the power MOSFET Q1 generates excessive heat and the temperature of the diode DD1 exceeds a prescribed upper limit temperature (for example, the voltage between the anode and cathode of the diode DD1 becomes lower than a prescribed lower limit in a state of applying a constant current to the diode DD1), the controlling circuit DR supplies the OFF signal to the gate of the power MOSFET Q1 (or stops the supply of the ON signal) to switch the power MOSFET Q1 to the OFF state. When the power MOSFET Q2 generates excessive heat and the temperature of the diode DD2 exceeds a prescribed upper limit temperature (for example, the voltage between the anode and cathode of the diode DD2 becomes lower than a prescribed lower limit in a state of applying a constant current to the diode DD2), the controlling circuit DR supplies the OFF signal to the gate of the power MOSFET Q2 (or stops the supply of the ON signal) to switch the power MOSFET Q2 to the OFF state. Consequently, when the power MOSFET Q1 generates excessive heat, the diode DD1 can detect it and the power MOSFET Q1 can be switched promptly to the OFF state, and, when the power MOSFET Q2 generates excessive heat, the diode DD2 can detect it and the power MOSFET Q2 can be switched promptly to the OFF state.

For example, if the load LA1 short-circuits in such a state where voltage is applied to the load LA1 from the power source BT by switching the power MOSFET Q1 to ON, a high current (a current higher than that at ordinary operation) flows to the power MOSFET Q1 and the power MOSFET Q1 generates excessive heat. By detecting the temperature rise caused by the excessive heat generation of the power MOSFET Q1 with the diode DD1, when the load LA1 short-circuits, the power MOSFET Q1 can promptly be switched to the OFF state. In the same manner, if the load LA2 short-circuits in such a state where voltage is applied to the load LA2 from the power source BT by switching the power MOSFET Q2 to ON, a high current (a current higher than that at ordinary operation) flows to the power MOSFET Q2 and the power MOSFET Q2 generates excessive heat. By detecting the temperature rise caused by the excessive heat generation of the power MOSFET Q2 with the diode DD2, when the load LA2 short-circuits, the power MOSFET Q2 can promptly be switched to the OFF state.

As the loads LA1 and LA2, any such an electronic device (or an electronic part) may be applied that is desired to be connected to the power source BT via the semiconductor device PKG for a switch. In this case, when a pair of electronic devices (or electronic parts) that are desired to be connected to the same power source BT are used as the loads LA1 and LA2, the semiconductor device PKG in Embodiment is particularly useful. Moreover, when a pair of electronic devices (or electronic parts) that have approximately the same configuration and are desired to be controlled independently are used as the loads LA1 and LA2, the semiconductor device PKG in Embodiment 1 is particularly useful. In the case of in-car application (automotive application), since there are many pairs of electronic devices (which are the loads LA1 and LA2) that have approximately the same configuration and are desired to be controlled independently, the semiconductor device PKG in Embodiment 1 is particularly useful when it is used for in-car application (automotive application). In the case of the in-car application, for example, light, motor, etc. can be applied as the loads LA1 and LA2. Examples of motors in the case include a motor for a power window, a motor for a door mirror, etc.

In the semiconductor device PKG in Embodiment 1, the diodes DD1 and DD2 are built in the semiconductor chip CP1 to make it possible to switch promptly the power MOSFET Q1 or Q2 to the OFF state when the power MOSFET Q1 or Q2 generates excessive heat. Therefore, the application thereof to semiconductor devices for which a high reliability is required such as in-car application (automotive application) is particularly useful.

<About the Layout of the Semiconductor Chip>

Next, the chip layout of the semiconductor chip CP1 will be explained with reference to FIGS. 12 and 13.

Figure 12:
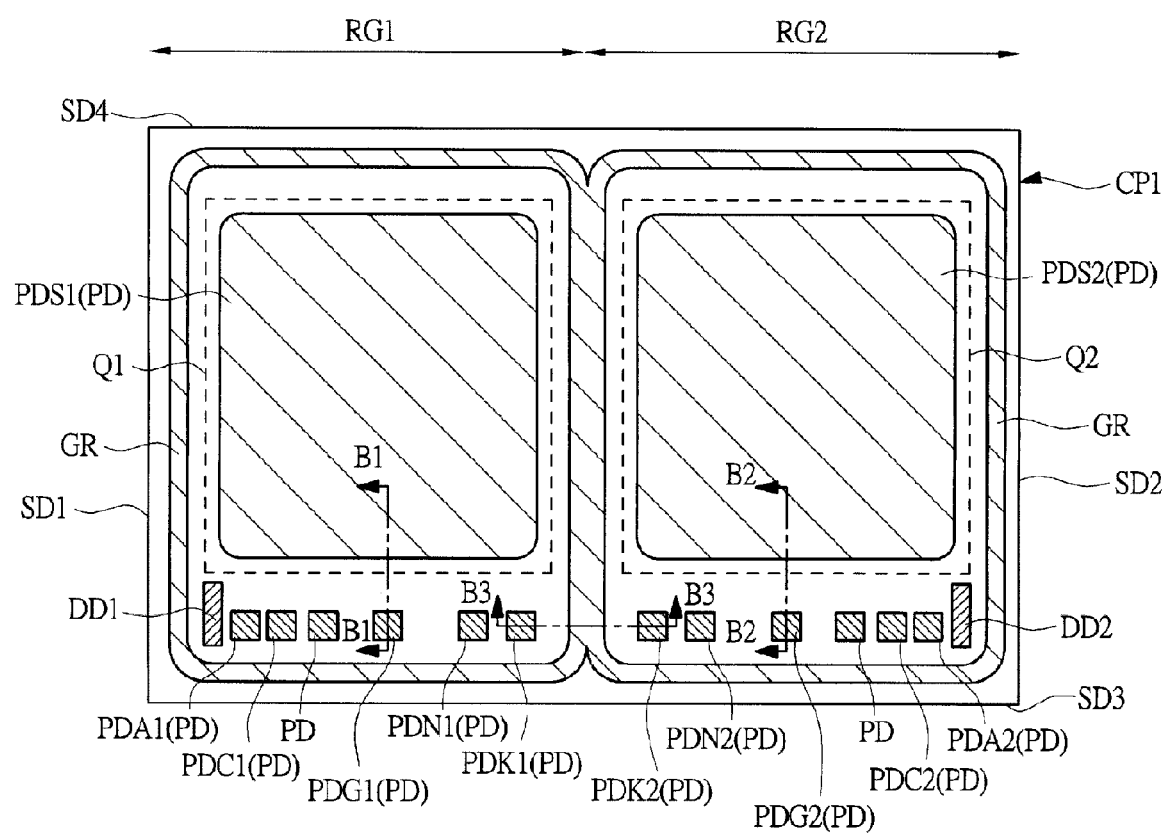
FIG. 12 is a plan view showing the chip layout of a semiconductor chip for use in the semiconductor device being an embodiment of the present invention.
Figure 13:
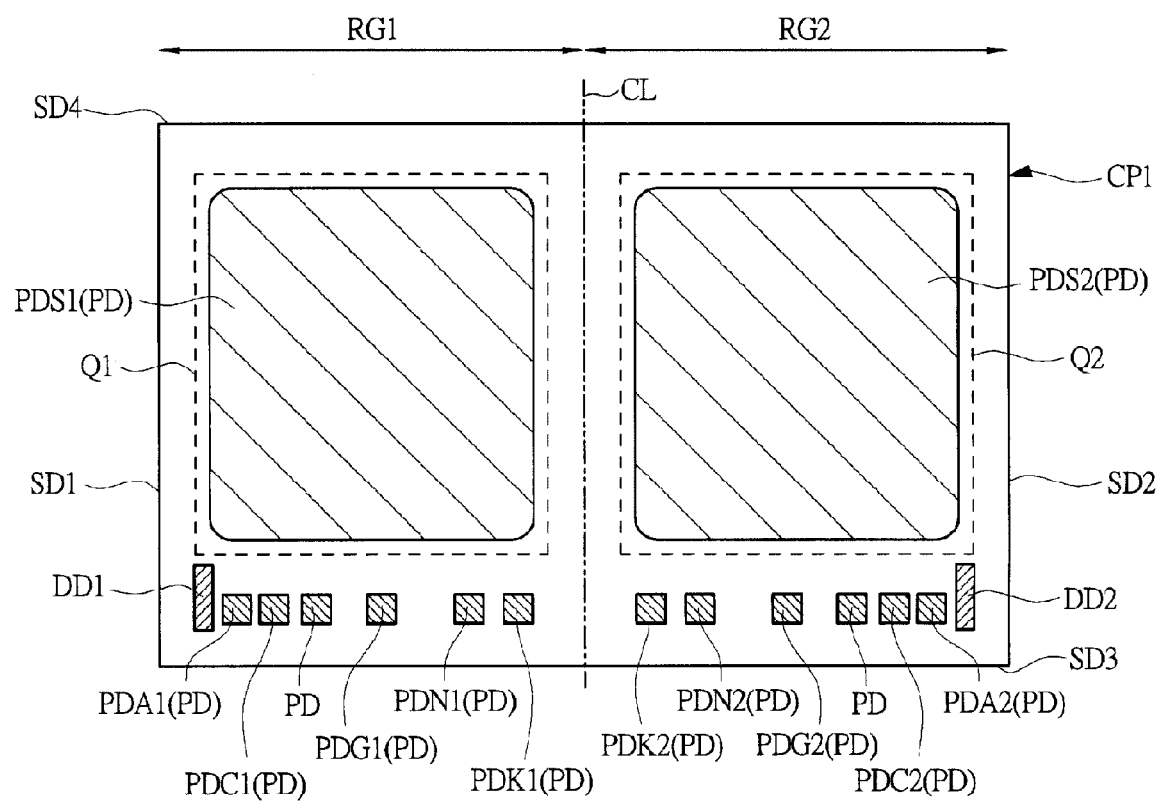
FIG. 13 is a plan view showing the chip layout of the semiconductor chip for use in a semiconductor device being an embodiment of the present invention.

FIGS. 12 and 13 are plan views (top views) showing the chip layout of the semiconductor chip CP1, which shows the front surface side of the semiconductor chip CP1 (that is, the main surface of the side on which the pad electrode PD is formed). FIG. 12 shows a case where a guard ring GR is provided, and FIG. 13 shows a case where no guard ring is provided. Meanwhile, although FIGS. 12 and 13 are plan views, in order to make the understanding easy, they are shown with hatching attached to pad electrodes PD, regions where the diode DD1 or the diode DD2 is formed, and the guard ring GR. The diodes DD1 and DD2, and the guard ring GR are actually covered by a protective film 12 to be described later, but, in FIGS. 12 and 13, they are shown in a seen through state.

As described above, the semiconductor chip CP1 in Embodiment 1 is a semiconductor chip for which the power MOSFETs Q1 and Q2 are formed, and, as shown in FIGS. 12 and 13, has a first MOSFET region RG1 where a vertical power MOSFET corresponding to the power MOSFET Q1 is formed, and a second MOSFET region RG2 where a vertical power MOSFET corresponding to the power MOSFET Q2 is formed. The first MOSFET region. RG1 and the second MOSFET region RG2 are arranged over the front surface of the semiconductor chip CP1 side by side, and are separated electrically from each other by an insulating film for separating elements etc. That is, when viewed from above, an approximately half of the semiconductor chip CP1 is a first MOSFET region RG1, and the remaining approximately half is a second MOSFET region RG2.

In a more specific explanation, viewed from above, when the semiconductor chip CP1 is divided into two divisions (regions) evenly between two sides SD1 and SD2 facing each other of the semiconductor chip CP1, one is the first MOSFET region RG1 where a vertical power MOSFET corresponding to the power MOSFET Q1 is formed, and the other is the second MOSFET region RG2 where a vertical power MOSFET corresponding to the power MOSFET Q2 is formed. That is, viewed from above, one side (side of the side SD1) is the first MOSFET region RG1 and the other side (side of the side SD2) is the second MOSFET region RG2, with the centerline CL between them in the main surface of the semiconductor chip CP1. Here, the centerline CL is an imaginary line, and is shown by a dashed two-dotted line in FIG. 13, and FIGS. 23 to 25 to be described later. Meanwhile, in FIG. 12 the centerline CL is not shown in order to prevent the drawing from becoming indistinct, but, in FIG. 12, too, the centerline CL lies in the same position as that in FIG. 13. Since the centerline CL is an imaginary line linking the center of the side SD3 and the center of the side SD4, it is parallel to the sides SD1 and SD2. The centerline CL is also a line that bisects the semiconductor chip CP1 between the side SD1 and the side SD2. The boundary between the first MOSFET region RG1 and the second MOSFET region RG2 approximately coincides with the centerline CL.

Meanwhile, the semiconductor chip CP1 has a rectangular planar shape, and four sides SD1, SD2, SD3 and SD4 constituting the rectangle. Among these, the side SD1 and the side SD2 face each other, the side SD3 and the side SD4 face each other, the side SD1 and the sides SD3 and SD4 intersect with each other, and the side SD2 and the sides SD3 and SD4 intersect with each other. In other words, the side SD3 and the sides SD1 and SD2 intersect with each other, and the side SD4 and the sides SD1 and side SD2 intersect with each other. The sides SD1, SD2, SD3 and SD4 constitute the outer periphery of the main surface (here, front surface) of the semiconductor chip CP1, and, in plan view, respective sides SD1, SD2, SD3 and SD4 of the semiconductor chip CP1 correspond to respective side surfaces of the semiconductor chip CP1.

In the semiconductor chip CP1, the vertical power MOSFET corresponding to the power MOSFET Q1 is formed in the first MOSFET region RG1 but not formed in the second MOSFET region RG2, and the vertical power MOSFET corresponding to the power MOSFET Q2 is formed in the second MOSFET region RG2 but not formed in the first MOSFET region RG1. And, in the semiconductor chip CP1, the diode DD1 is formed in the first MOSFET region RG1, and the diode DD2 is formed in the second MOSFET region RG2.

Here, the vertical power MOSFET corresponding to the power MOSFET Q1 is formed over a considerable degree of the area of the first MOSFET region RG1, but is formed not in the whole region of the first MOSFET region RG1. In regions where the diode DD1 is arranged, pad electrodes PD other than the pad electrode PDS1 for the source are arranged and the guard ring GR is arranged, no vertical power MOSFET is formed. In the same manner, the vertical power MOSFET corresponding to the power MOSFET Q1 is formed over a considerable degree of the area of the first MOSFET region RG2, but is formed not in the whole region of the first MOSFET region RG2. In regions where the diode DD2 is arranged, pad electrodes PD other than the pad electrode PDS2 for the source are arranged and the guard ring GR is arranged, no vertical power MOSFET is formed. In FIGS. 12 and 13, the region, where the vertical power MOSFET corresponding to the power MOSFET Q1 is formed, is schematically shown by surrounding it by a dotted line with a symbol Q1, and the region, where the vertical power MOSFET corresponding to the power MOSFET Q2 is formed, is schematically shown by surrounding it by a dotted line with a symbol Q2.

As shown in FIGS. 12 and 13, plural pad electrodes PD are formed over the front surface of the semiconductor chip CP1. Respective pad electrodes PD are formed from an electroconductive body film (pattern of an electroconductive body film) exposed from an opening part (corresponding to an opening part 13 to be described later) formed in a surface protective film (corresponding to a protective film 12 to be described later) of the semiconductor chip CP1.

As described above, plural pad electrodes PD of the semiconductor chip CP1 have the pad electrodes PDS1 and PDS2 for the source, and, in addition, have pad electrodes PDG1 and PDG2 for the gate, pad electrodes PDA1 and PDA2 for the anode, pad electrodes PDC1 and PDC2 for the cathode, pad electrodes PDN1 and PDN2 for the sense source, and pad electrodes PDK1 and PDK2 for the sense Kelvin.

Over the front surface of the semiconductor chip CP1, the pad electrode PDS1 for the source, the pad electrode PDG1 for the gate, the pad electrode PDA1 for the anode, the pad electrode PDC1 for the cathode, the pad electrode PDN1 for the sense source, and the pad electrode PDK1 for the sense Kelvin are arranged (formed) in the first MOSFET region RG1. And, over the front surface of the semiconductor chip CP1, the pad electrode PDS2 for the source, the pad electrode PDG2 for the gate, the pad electrode PDA2 for the anode, the pad electrode PDC2 for the cathode, the pad electrode PDN2 for the sense source, and the pad electrode PDK2 for the sense Kelvin are arranged (formed) in the second MOSFET region RG2.

The pad electrode (bonding pad) PDS1 arranged in the first MOSFET region RG1 is connected electrically to the source of the power MOSFET (Q1) formed in the first MOSFET region RG1. The pad electrode (bonding pad) PDG1 arranged in the first MOSFET region RG1 is connected electrically to the gate of the power MOSFET (Q1) formed in the first MOSFET region RG1. The pad electrode (bonding pad) PDA1 arranged in the first MOSFET region RG1 is connected electrically to the anode of the diode (DD1) formed in the first MOSFET region RG1. The pad electrode (bonding pad) PDC1 arranged in the first MOSFET region RG1 is connected electrically to the cathode of the diode (DD1) formed in the first MOSFET region RG1.

The pad electrode (bonding pad) PDN1 arranged in the first MOSFET region RG1 is a pad electrode (pad electrode for the sense source) for detecting (monitoring) the voltage (potential) of the source of the power MOSFET (Q1) formed in the first MOSFET region RG1, and is connected electrically to the source of the power MOSFET (Q1) formed in the first MOSFET region RG1. The pad electrode (bonding pad) PDK1 arranged in the first MOSFET region RG1 is a pad electrode (pad electrode for the sense Kelvin) for detecting (monitoring) the source current of the power MOSFET (Q1) formed in the first MOSFET region RG1, and is connected electrically to the pad electrode PDS1 (PD) formed in the first MOSFET region RG1.

The pad electrode (bonding pad) PDS2 arranged in the second MOSFET region RG2 is connected electrically to the source of the power MOSFET (Q2) formed in the second MOSFET region RG2. The pad electrode (bonding pad) PDG2 arranged in the second MOSFET region RG2 is connected electrically to the gate of the power MOSFET (Q2) formed in the second MOSFET region RG2. The pad electrode (bonding pad) PDA2 arranged in the second MOSFET region RG2 is connected electrically to the anode of the diode (DD2) formed in the second MOSFET region RG2. The pad electrode (bonding pad) PDC2 arranged in the second MOSFET region RG2 is connected electrically to the cathode of the diode (DD2) formed in the second MOSFET region RG2.

The pad electrode (bonding pad) PDN2 arranged in the second MOSFET region RG2 is a pad electrode (pad electrode for the sense source) for detecting (monitoring) the voltage (potential) of the source of the power MOSFET (Q2) formed in the second MOSFET region RG2, and is connected electrically to the source of the power MOSFET (Q2) formed in the second MOSFET region RG2. The pad electrode (bonding pad) PDK2 arranged in the second MOSFET region RG2 is a pad electrode (pad electrode for the sense Kelvin) for detecting (monitoring) the source current of the power MOSFET (Q2) formed in the second MOSFET region RG2, and is connected electrically to the pad electrode PDS2 (PD) formed in the second MOSFET region RG2.

As described above, among plural pad electrodes PD formed over the front surface of the semiconductor chip CP1, the pad electrode PD connected electrically to an element or a circuit formed in the first MOSFET region RG1 via the internal wiring of the semiconductor chip CP1 is arranged in the first MOSFET region RG1, in the front surface of the semiconductor chip CP1. Among plural pad electrodes PD formed over the front surface of the semiconductor chip CP1, the pad electrode PD connected electrically to an element or a circuit formed in the second MOSFET region RG2 via the internal wiring of the semiconductor chip CP1 is arranged in the second MOSFET region RG2, in the front surface of the semiconductor chip CP1.

Over the whole surface of the back surface of the semiconductor chip CP1, the above-described back electrode BE is formed, and the back electrode BE is connected electrically to both the drain of the power MOSFET (Q1) formed in the first MOSFET region RG1 and the drain of the power MOSFET (Q2) formed in the second MOSFET region RG2.

In the case of FIG. 12, the guard ring GR is formed at the periphery of the first MOSFET region RG1 and at the periphery of the second MOSFET region RG2, in the main surface of the semiconductor chip CP1. That is, in the first MOSFET region RG1 of the semiconductor chip CP1, there are arranged the vertical power MOSFET corresponding to the power MOSFET Q1, the diode DD1, and the pad electrode PD to be arranged in the first MOSFET region RG1, in the region surrounded by the guard ring GR. And, in the second MOSFET region RG2 of the semiconductor chip CP1, there are arranged the vertical power MOSFET corresponding to the power MOSFET Q2, the diode DD2, and the pad electrode PD to be arranged in the second MOSFET region RG2, in the region surrounded by the guard ring GR. In the semiconductor chip CP1, the guard ring GR is formed from an electroconductive body layer (electroconductive body film) positioned at the same layer as the electroconductive body layer (electroconductive body film) constituting the pad electrode PD, but is separated from the pad electrode PD. Since the guard ring GR is covered by the surface protective film (corresponding to a protective film 12 to be described later) of the semiconductor chip CP1, the guard ring GR is not exposed at the surface of the semiconductor chip CP1.

<About the Structure of the Semiconductor Chip>

Next, the configuration of the semiconductor chip CP1 for which the power MOSFETs Q1, and Q2, and the diodes DD1 and DD2 are formed will be explained in more detail.

Figure 14:
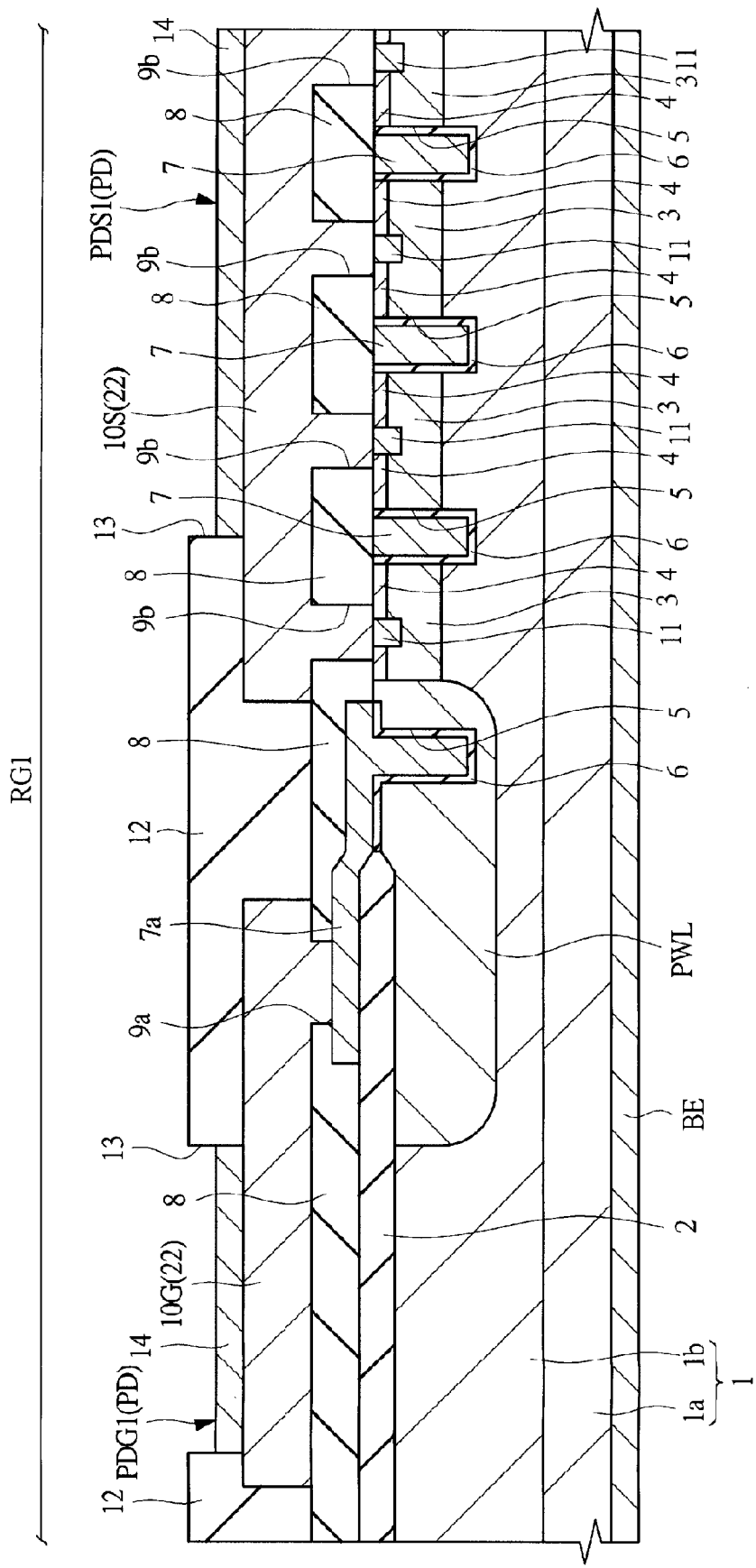
FIG. 14 is the principal part cross-sectional view of the semiconductor chip for use in the semiconductor device being an embodiment of the present invention.
Figure 15:
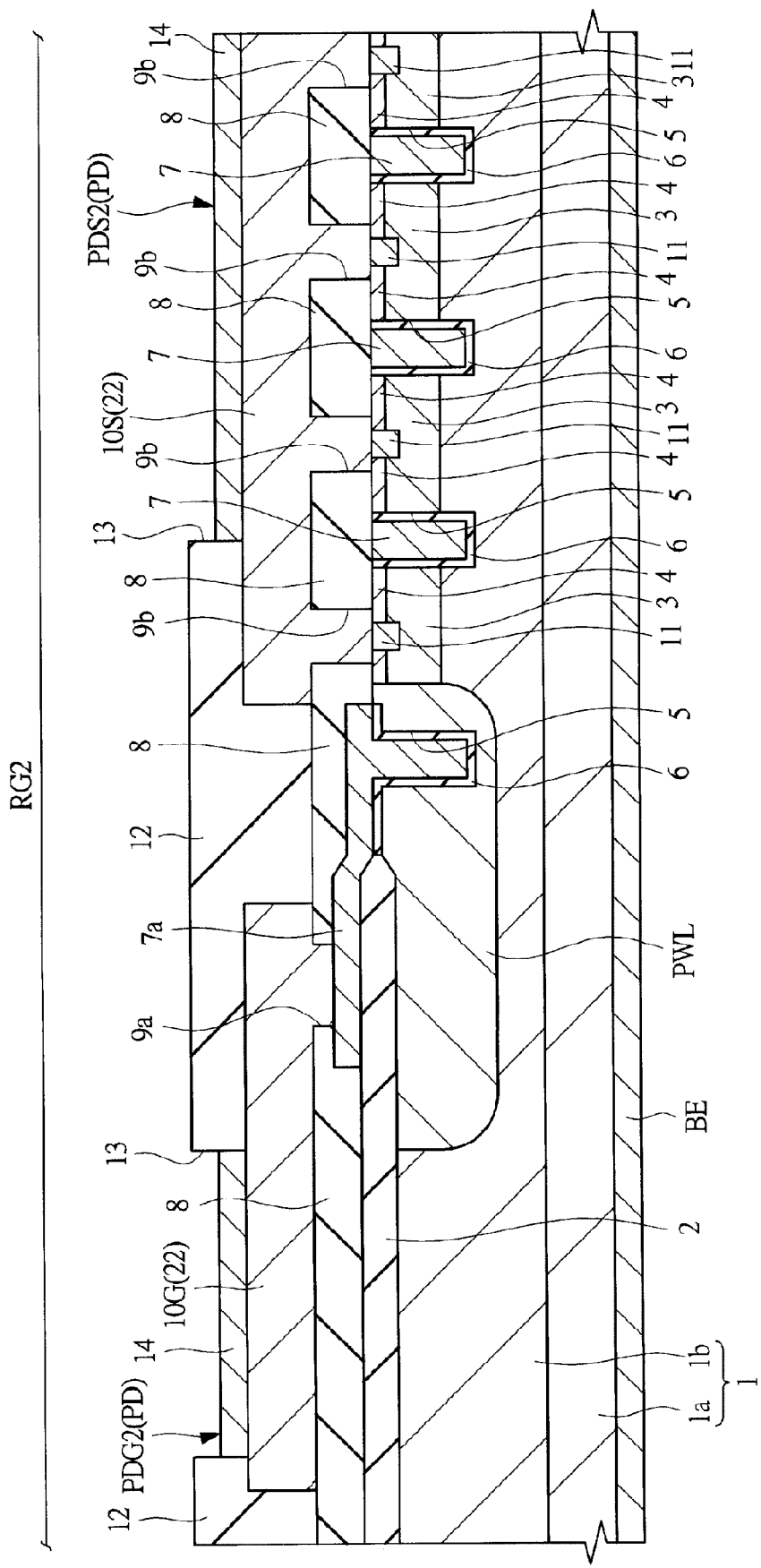
FIG. 15 is the principal part cross-sectional view of the semiconductor chip for use in the semiconductor device being an embodiment of the present invention.
Figure 16:
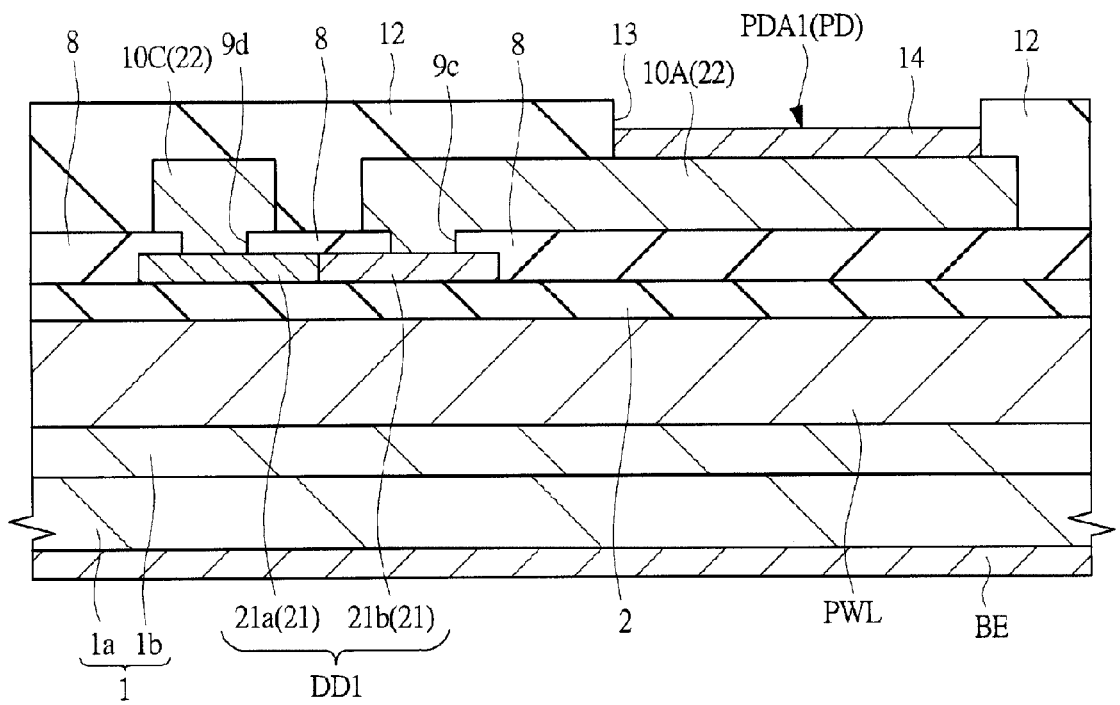
FIG. 16 is the principal part cross-sectional view of the semiconductor chip for use in the semiconductor device being an embodiment of the present invention.
Figure 17:
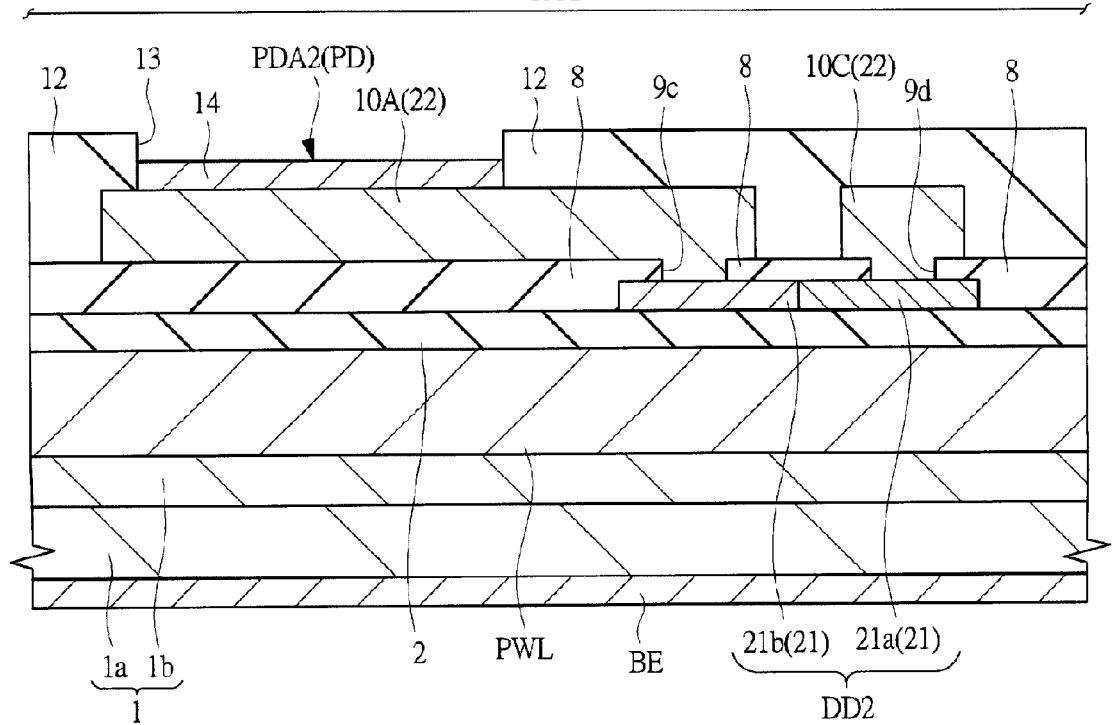
FIG. 17 is the principal part cross-sectional view of the semiconductor chip for use in the semiconductor device being an embodiment of the present invention.
Figure 18:
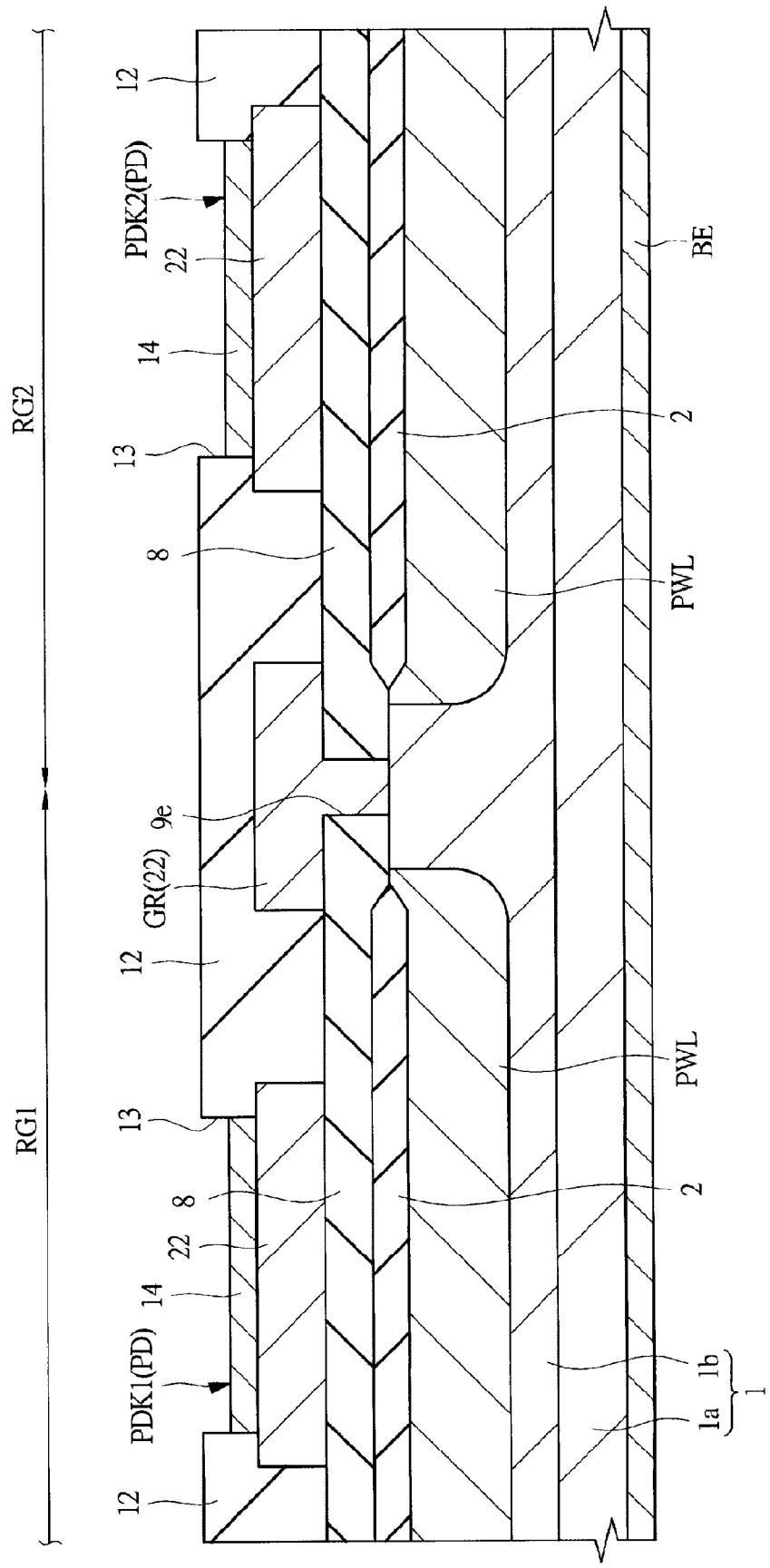
FIG. 18 is the principal part cross-sectional view of the semiconductor chip for use in the semiconductor device being an embodiment of the present invention.

FIGS. 14 to 18 are principal part cross-sectional views of the semiconductor chip CP1. FIG. 14, among these, shows the cross-sectional view of apart of the first MOSFET region RG1. Specifically, FIG. 14 shows the cross-sectional view intersecting with both the pad electrode PDG1 for the gate and the pad electrode PDS1 for the source, and the cross-sectional view at the B1-B1 line shown in FIG. 12 approximately corresponds to FIG. 14. FIG. 15 shows the cross-sectional view of a part of the second MOSFET region RG2. Specifically, FIG. 15 shows the cross-sectional view intersecting with both the pad electrode PDG2 for the gate and the pad electrode PDS2 for the source, and the cross-sectional view at the B2-B2 line shown in FIG. 12 approximately corresponds to FIG. 15. FIG. 16 shows the cross-sectional view of a part of the first MOSFET region RG1. Specifically, FIG. 16 shows the cross-sectional view intersecting with the diode DD1 and the pad electrode PDA1 for the anode. FIG. 17 shows the cross-sectional view of a part of the second MOSFET region RG2. Specifically, FIG. 17 shows the cross-sectional view intersecting with the diode DD2 and the pad electrode PDA2 for the anode. FIG. 18 shows the cross-sectional view intersecting with the boundary between the first MOSFET region RG1 and the second MOSFET region RG2, and the cross-sectional view at the B3-B3 line shown in FIG. 12 approximately corresponds to FIG. 18.

The power MOSFETs Q1 and Q2, and the diodes DD1 and DD2 are formed for the main surface of a semiconductor substrate (hereinafter, simply referred to as a substrate) 1 constituting the semiconductor chip CP1. As shown in FIGS. 14 to 18, the substrate 1 has substrate main body (semiconductor substrate, semiconductor wafer) 1a constituted by an $n^+$ type single crystalline silicon in which, for example, arsenic (As) has been introduced, etc., and an epitaxial layer (semiconductor layer) 1b that is formed over the main surface of the substrate main body 1a and constituted by, for example, an $n^-$ type silicon single crystal. Consequently, the substrate 1 is a so-called epitaxial wafer. Over the main surface of the epitaxial layer 1b, a field insulating film (element isolation region) 2 containing, for example, silicon oxide etc. is formed. The field insulating film 2 is formed from an insulator such as silicon oxide, and can function as the element isolation region for defining (demarcating) an active region.

In the first MOSFET region RG1, plural unit transistor cells constituting the power MOSFET Q1 are formed in the active region surrounded by the field insulating film 2 and a p type well PWL of the lower layer thereof, and the power MOSFET Q1 is formed by connecting parallel these plural unit transistor cells provided in the first MOSFET region RG1. In the same manner, in the second MOSFET region RG2, plural unit transistor cells constituting the power MOSFET Q2 are formed in the active region surrounded by the field insulating film 2 and the p type well PWL of the lower layer thereof, and the power MOSFET Q2 is formed by connecting parallel these plural unit transistor cells provided in the second MOSFET region RG2. Respective unit transistor cells are formed from, for example, an n-channel type power MOSFET having a trench gate structure.

The substrate main body 1a and epitaxial layer 1b have such a function as the drain region of the unit transistor cell. For the back surface of the substrate 1 (semiconductor chip CP1), a back electrode (back drain electrode, drain electrode) BE for the drain electrode is formed. The back electrode BE is formed by stacking, for example, a titanium (Ti) layer, a nickel (Ni) layer and a gold (Au) layer in this order from the back surface of the substrate 1. In the semiconductor device PKG, the back electrode BE of the semiconductor chip CP1 is joined and connected electrically to the die pad DP1 via the adhesive layer BD1.

A p type semiconductor region 3 formed in the epitaxial layer 1b has a function as the channel-forming region of the unit transistor cell. Furthermore, an $n^+$ type semiconductor region 4 formed above the p type semiconductor region 3 has a function as the source region of the unit transistor cell. Accordingly, the semiconductor region 4 is a semiconductor region for the source.

In the substrate 1, a trench 5 is formed, extending from the main surface thereof in the thickness direction of the substrate 1. The trench 5 is formed from the upper surface of the $n^+$ type semiconductor region 4 so as to pass through the $n^+$ type semiconductor region 4 and the p type semiconductor region 3, and to end in the epitaxial layer 1b that is a lower layer thereof. Over the bottom surface and side surface of the trench 5, a gate insulating film 6 containing a silicon oxide etc. is formed. In the trench 5, a gate electrode 7 is embedded via the gate insulating film 6. The gate electrode 7 contains, for example, a polycrystalline silicon film in which an n type impurity (for example, phosphorous) has been introduced. The gate electrode 7 has a function as the gate electrode of the unit transistor cell.

For a part over the field insulating film 2, a gate-extracting wiring part 7a is formed, which is constituted by an electroconductive film positioned at the same layer as the gate electrode 7, and the gate electrode and the gate-extracting wiring part 7a are formed integrally and are connected electrically each other. Meanwhile, in a region not shown in the cross-sectional view in FIG. 14, respective gate electrodes 7 in the first MOSFET region RG1 are integrally connected with the gate-extracting wiring part 7a in the first MOSFET region RG1, and, in a region not shown in the cross-sectional view in FIG. 15, respective gate electrodes 7 in the second MOSFET region RG2 are integrally connected with the gate-extracting wiring part 7a in the second MOSFET region RG2. The gate-extracting wiring part 7a is connected electrically with a gate wiring 10G through a contact hole (opening part, through hole) 9a formed in an insulating film 8 covering the part 7a.

On the other hand, a source wiring 10S is connected electrically with the $n^+$ type semiconductor region 4 for the source through a contact hole (opening part, through hole) 9b formed in the insulating film 8. The source wiring 10S is connected electrically with a $p^+$ semiconductor region 11 formed above the p type semiconductor region 3 and between adjacent $n^+$ type semiconductor regions 4, and is connected electrically with the p-type semiconductor region 3 for forming a channel through the above.

As shown in FIGS. 16 and 17, a polycrystalline silicon film 21 for forming a diode is formed over the field insulating film (element isolation region) 2. The polycrystalline silicon film 21 has an n type silicon part (n type silicon region) 21a in which an n type impurity (for example, phosphorous) has been introduced, and a p type silicon part (p type silicon region) 21b in which a p type impurity (for example, boron) has been introduced, wherein the n type silicon part 21a and the p type silicon part 21b are adjacent to each other, and a PN-junction is formed at the boundary between the p type silicon part 21b and the n type silicon part 21a. The polycrystalline silicon film 21 can be formed by an electroconductive film positioned at the same layer as the gate electrode 7 and the gate-extracting wiring part 7a, wherein the polycrystalline silicon film 21 and the gate electrode 7 (and the gate-extracting wiring part 7a) are separated from each other and are not connected electrically.

As the result of the formation of the PN-junction between the p type silicon part 21b and the n type silicon part 21a (at the boundary), the diode DD1 or the diode DD2 is formed. That is, the p type silicon part 21b of the polycrystalline silicon film 21 formed in the first MOSFET region RG1 works as the anode of the diode DD1, and the n type silicon part 21a of the polycrystalline silicon film 21 formed in the first MOSFET region RG1 works as the cathode of the diode DD1. The p type silicon part 21b of the polycrystalline silicon film 21 formed in the second MOSFET region RG2 works as the anode of the diode DD2, and the n type silicon part 21a of the polycrystalline silicon film 21 formed in the second MOSFET region RG2 works as the cathode of the diode DD2. The polycrystalline silicon film 21 formed in the first MOSFET region RG1 (that is, the polycrystalline silicon film 21 forming the diode DD1) and the polycrystalline silicon film 21 formed in the second MOSFET region RG2 (that is, the polycrystalline silicon film 21 forming the diode DD2) are formed by an electroconductive film (polycrystalline silicon film) positioned at the same layer, but are separated from each other and not connected electrically.

In order to form the n type silicon part 21a and the p type silicon part 21b for the polycrystalline silicon film when manufacturing the semiconductor chip CP1, ion implantation using a photoresist pattern formed by a photolithographic method as an ion implantation-preventing mask, etc. can be used. In an explanation with an example, after forming a polycrystalline silicon film over the whole main surface of the substrate 1, in the polycrystalline silicon film, an n type impurity (for example, phosphorous etc.) is ion-implanted in a region into which an n type impurity is to be introduced, and a p type impurity (for example, boron etc.) is ion-implanted in a region into which a p type impurity is to be introduced. In this case, when the n type impurity is ion-implanted, the region into which the p type impurity is to be introduced is covered by a photoresist pattern, and, when the p type impurity is ion-implanted, the region into which the n type impurity is to be introduced is covered by the photoresist pattern. Here, the region into which the n type impurity is to be introduced includes a region where the formation of the gate electrode 7, the wiring part 7a and the n type silicon part 21a is intended, and the region into which the p type impurity is to be introduced includes a region where the formation of the p type silicon part 21b is intended. After that, the polycrystalline silicon film can be patterned using a photolithographic method and a dry etching method to form the gate electrode 7, the wiring part 7a and the polycrystalline silicon film 21 containing the patterned polycrystalline silicon.

An anode wiring 10A is connected electrically with the p type silicon part 21b of the polycrystalline silicon film 21 through a contact hole (opening part, through hole) 9c formed in the insulating film 8. A cathode wiring 10C is connected electrically with the n type silicon part 21a of the polycrystalline silicon film 21 through a contact hole (opening part, through hole) 9d formed in the insulating film 8.

The gate wiring 10G, the source wiring 10S, the anode wiring 10A and the cathode wiring 10C are formed by forming an electroconductive body film 22 over the insulating film 8 in which the contact holes 9a, 9b, 9c and 9d (and also a contact hole 9e to be described later) are formed so as to be embedded into the contact holes 9a, 9b, 9c and 9d (and also the contact hole 9e to be described later), and patterning the electroconductive body film 22. That is, the gate wiring 10G, the source wiring 10S, the anode wiring 10A and the cathode wiring 10C are formed from the patterned electroconductive body film 22. Or, the patterned electroconductive body film 22 can also be considered as a wiring. The electroconductive body film 22 contains a metal film, preferably an aluminum film or an aluminum alloy film. Consequently, the gate wiring 10G, the source wiring 10S, the anode wiring 10A and the cathode wiring 10C contain the electroconductive body film 22 positioned at the same layer, but they are separated from one another.

The guard ring GR, too, is formed from the patterned electroconductive body film 22. That is, the guard ring GR contains the electroconductive body film 22 positioned at the same layer as the gate wiring 10G, the source wiring 10S, the anode wiring 10A and the cathode wiring 10C, but are separated from one another. The guard ring GR extends over the insulating film 8, but is connected electrically with the substrate 1 (epitaxial layer 1b) through the contact hole (opening part, through hole) 9e formed in the insulating film 8.

The electroconductive body film 22 (including the gate wiring 10G, source wiring 10S, anode wiring 10A, cathode wiring 10C and guard ring GR) is covered by a protective film (insulating film) 12 of an insulator containing polyimide resin etc. That is, over the insulating film 8, the protective film 12 is formed so as to cover the electroconductive body film 22 (including the gate wiring 10G, source wiring 10S, anode wiring 10A, cathode wiring 10C and guard ring GR). The protective film 12 is a film (insulating film) positioned at the top of the semiconductor chip CP1. In the protective film 12, plural opening parts 13 are formed, and, from respective opening parts 13, a part of the electroconductive body film 22 is exposed. The electroconductive body film 22 exposed from the opening part 13 works as the pad electrode PD.

That is, the gate wiring 10G exposed from the opening part 13 in the first MOSFET region RG1 forms the pad electrode PDG1 for the gate of the power MOSFET Q1, and the gate wiring 10G exposed from the opening part 13 in the second MOSFET region RG2 forms the pad electrode PDG2 for the gate of the power MOSFET Q2. Meanwhile, in the semiconductor chip CP1, since the gate wiring 10G in the first MOSFET region RG1 and the gate wiring 10G in the second MOSFET region RG2 are separated from each other and are not connected electrically, no electric connection exists between the pad electrode PDG1 and the pad electrode PDG2.

The source wiring 10S exposed from the opening part 13 in the first MOSFET region RG1 forms the pad electrode PDS1 for the source of the power MOSFET Q1, and the source wiring 10S exposed from the opening part 13 in the second MOSFET region RG2 forms the pad electrode PDS2 for the source of the power MOSFET Q2. Meanwhile, in the semiconductor chip CP1, since the source wiring 10S in the first MOSFET region RG1 and the source wiring 10S in the second MOSFET region RG2 are separated from each other and are not connected electrically, no electric connection exists between the pad electrode PDS1 and the pad electrode PDS2.

The anode wiring 10A exposed from the opening part 13 in the first MOSFET region RG1 forms the pad electrode PDA1 for the anode of the diode DD1, and the anode wiring 10A exposed from the opening part 13 in the second MOSFET region RG2 forms the pad electrode PDA2 for the anode of the diode DD2. Meanwhile, in the semiconductor chip CP1, since the anode wiring 10A in the first MOSFET region RG1 and the anode wiring 10A in the second MOSFET region RG2 are separated from each other and not connected electrically, no electric connection exists between the pad electrode PDA1 and the pad electrode PDA2.

The cathode wiring 10C exposed from the opening part 13 in the first MOSFET region RG1 forms the pad electrode PDC1 for the cathode of the diode DD1, and the cathode wiring 10C exposed from the opening part 13 in the second MOSFET region RG2 forms the pad electrode PDC2 for the cathode of the diode DD1 (pad electrodes PDC1 and PDC2 are not shown in cross-sectional views in FIGS. 14 to 18). Meanwhile, in the semiconductor chip CP1, since the cathode wiring 10C in the first MOSFET region RG1 and the cathode wiring 10C in the second MOSFET region RG2 are separated from each other and not connected electrically, no electric connection exists between the pad electrode PDC1 and the pad electrode PDC2.

Moreover, the pad electrodes PDN1 and PDN2 for the sense source and the pad electrodes PDK1 and PDK2 for the sense Kelvin are also formed by the exposure of the electroconductive body film 22 from the opening part 13.

Over the surface of the pad electrode PD (including pad electrodes PDS1, PDS2, PDG1, PDG2, PDA1, PDA2, PDC1, PDC2, PDN1, PDN2, PDK1 and PDK2) (that is, over a part of the electroconductive body film 22 exposed at the bottom part of the opening part 13), a metal layer 14 is occasionally formed by a plating method etc. The metal layer 14 contains, for example, a laminated film of a copper (Cu) film, a nickel (Ni) film and a gold (Au) film formed in this order from the bottom, a laminated film of a titanium (Ti) film, a nickel (Ni) film and a gold (Au) film formed in this order from the bottom, etc. The formation of the metal layer 14 over the surface of the pad electrode PD can suppress or prevent the oxidation of the surface of aluminum of the electroconductive body film 22.

In the semiconductor device PKG, as is understood from FIGS. 3 to 6, the metal plates MPL1 and MPL2 are joined to the pad electrodes PDS1 and PDS2, and the bonding wire BW is connected to pad electrodes PD (PDG1, PDG2, PDA1, PDA2, PDC1, PDC2, PDN1, PDN2, PDK1 and PDK2) other than the pad electrodes PDS1 and PDS2, among plural pad electrodes PD of the semiconductor chip CP1.

In the semiconductor chip CP1 having such a configuration, the operating current of a unit transistor of the power MOSFETs Q1 and Q2 is intended to flow between the epitaxial layer 1b for the drain and the $n^+$ type semiconductor region 4 for the drain in the thickness direction of the substrate 1 along the side surface of the gate electrode 7 (that is, the side surface of the trench 5). That is, the channel is formed along the thickness direction of the semiconductor chip CP1.

As described above, the semiconductor chip CP1 is a semiconductor chip for which the vertical MOSFET (power MOSFET) having a trench type gate structure is formed, wherein each of the power MOSFETs Q1 and Q2 is formed by a trench gate type MISFET. Here, the vertical MOSFET corresponds to a MOSFET in which a current between the source-drain flows in the thickness direction of the semiconductor substrate (substrate 1) (the direction approximately perpendicular to the main surface of the semiconductor substrate). Here, a case where an n channel type power MOSFET is formed as the power MOSFETs Q1 and Q2, is explained, but a p channel type power MOSFET may be formed as the power MOSFETs Q1 and Q2 by reversing the electroconductive type of the n type and the p type, etc.

<About the Position of the Diode in the Semiconductor Chip>

Next, the position of the diodes DD1 and DD2 in the semiconductor chip CP1 will be explained in more detail. (0120)

Figure 19:
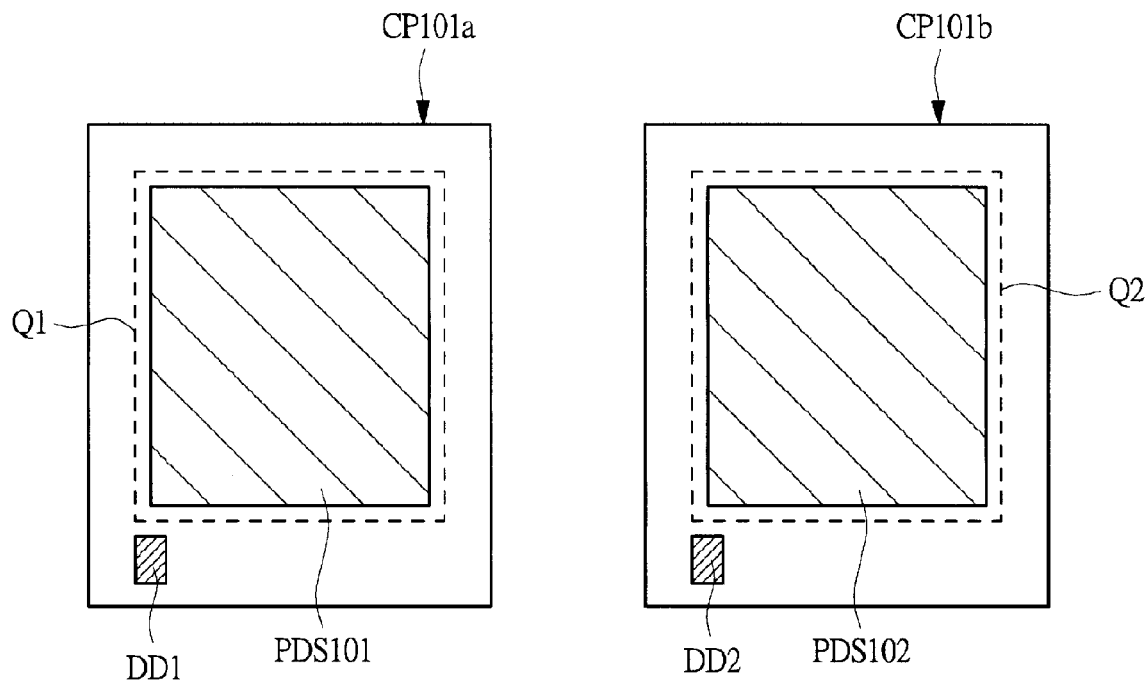
FIG. 19 is a plan view showing the chip layout of a semiconductor chip in a first Comparative Example.
Figure 20:
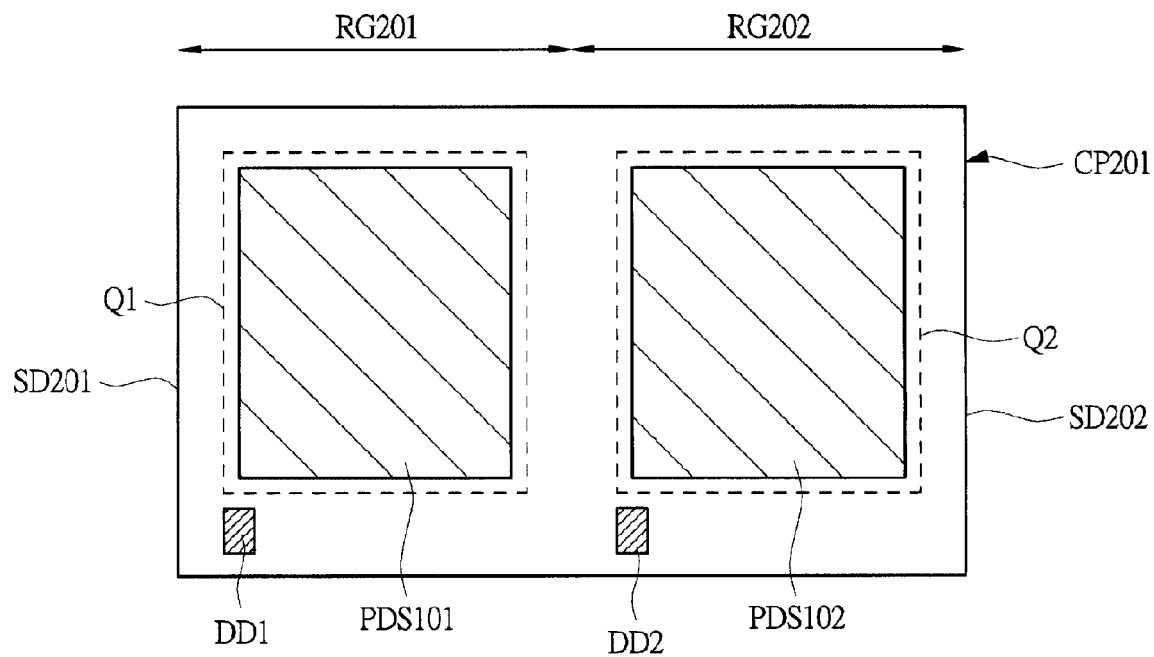
FIG. 20 is a plan view showing the chip layout of a semiconductor chip in a second Comparative Example.

FIG. 19 is a plan view (top view) showing the chip layout of semiconductor chips CP101a and CP101b in a first Comparative Example, and FIG. 20 is a plan view (top view) showing the chip layout of a semiconductor chip CP201 in a second Comparative Example, both corresponding to FIG. 13. Meanwhile, although FIGS. 19 and 20 are plan views, in order to make the understanding easy, they are shown with hatching attached to regions where the pad electrode PDS101 or the PDS102 for the source, or the diode DD1 or the DD2 is formed. But, in FIGS. 19 and 20, the diagrammatic representation of pad electrodes other than the pad electrodes PDS101 and PDS102 for the source is omitted.

In the semiconductor chips CP101a and CP101b in a first Comparative Example shown in FIG. 19, the semiconductor chip CP101a is a semiconductor chip for which the power MOSFET Q1 is formed, and the semiconductor chip CP101b is a semiconductor chip for which the power MOSFET Q2 is formed. That is, differing from Embodiment 1 in which the power MOSFETs Q1 and Q2 are made into one chip, in the first Comparative Example, the power MOSFETs Q1 and Q2 are constituted by two semiconductor chips CP101a and CP101b, wherein the power MOSFET Q1 is constituted by the semiconductor chip CP101a and the power MOSFET Q2 is constituted by the semiconductor chip CP101b. And, the diode DD1 is also built in the semiconductor chip CP101a, and the diode DD2 is also built in the semiconductor chip CP101b.

Meanwhile, the pad electrode PDS101 shown in FIGS. 19 and 20 is a pad electrode (bonding pad) connected electrically to the source of the power MOSFET Q1, and the pad electrode PDS102 shown in FIGS. 19 and 20 is a pad electrode (bonding pad) connected electrically to the source of the power MOSFET Q2. In FIGS. 19 and 20, the region, where the vertical power MOSFET corresponding to the power MOSFET Q1 is formed, is schematically shown by surrounding it by a dotted line with a symbol Q1, and the region, where the vertical power MOSFET corresponding to the power MOSFET Q2 is formed, is schematically shown by surrounding it by a dotted line with a symbol Q2.

However, as shown in FIG. 19, in the case in the first Comparative Example in which the power MOSFETs Q1 and Q2 are constituted by two semiconductor chips CP101a and CP101b, a following problem occurs.

That is, when the power MOSFETs Q1 and Q2 are constituted by two semiconductor chips CP101a and CP101b, it is considered to package separately the semiconductor chip CP101a and the semiconductor chip CP101b. In this case, consequently, there exists a semiconductor package containing the semiconductor chip CP101a and a semiconductor package containing the semiconductor chip CP101b in electronic devices containing the power MOSFETs Q1 and Q2 as a switching element. This increases the number of parts constituting the electronic device containing the power MOSFETs Q1 and Q2 as a switching element to increase the cost, and makes the whole dimension of the electronic device larger. On the other hand, it is considered to form the semiconductor chip CP101a and the semiconductor chip CP101b into one package. In this case, since the semiconductor package contains both the semiconductor chip CP101a and the semiconductor chip CP101b, the semiconductor package itself has an enlarged dimension. This leads to increase the dimension of electronic devices containing the power MOSFETs Q1 and Q2 as a switching element. In addition, since two semiconductor chips CP101a and CP101b are used for constituting the power MOSFETs Q1 and Q2, the number of semiconductor chips used becomes larger to increase the cost.

Accordingly, it is considered to form the power MOSFETs Q1 and Q2 into one chip. In each of the semiconductor chip CP1 in Embodiment 1 and the semiconductor chip CCP201 in the second Comparative Example shown in FIG. 20, the power MOSFETs Q1 and Q2 are formed into one chip (that is, the power MOSFETs Q1 and Q2 are built in one semiconductor chip).

Since the formation of the power MOSFETs Q1 and Q2 into one chip causes one semiconductor package formed by packaging the semiconductor chip to contain the power MOSFETs Q1 and Q2, it is possible to reduce the number of parts constituting electronic devices containing the power MOSFETs Q1 and Q2 as a switching element to suppress the cost, and to make the whole dimension of the electronic device smaller. Moreover, by forming the power MOSFETs Q1 and Q2 into one chip, it is possible to reduce the dimension of semiconductor packages containing the power MOSFETs Q1 and Q2, and to reduce the cost. Furthermore, since the number of semiconductor chips to be used is also reduced to make the cost reduction possible in this regard.

Incidentally, as described above, the diode DD1 or DD2 is used for detecting temperature rise caused by excessive heat generation of the power MOSFET Q1 or Q2. When the power MOSFETs Q1 and Q2 are constituted by two semiconductor chips CP101a and CP101b as in the first Comparative Example, as shown in FIG. 19, the diode DD1 is also built in the semiconductor chip CP101a in which the power MOSFET Q1 is formed, and the diode DD2 is also built in the semiconductor chip CP101b in which the power MOSFET Q2 is formed. This makes it possible to cause the diode DD1 to detect the temperature rise caused by excessive heat generation of the power MOSFET Q1, and to cause the diode DD2 to detect the temperature rise caused by excessive heat generation of the power MOSFET Q2, in the semiconductor chip CP101a.

Figure 21:
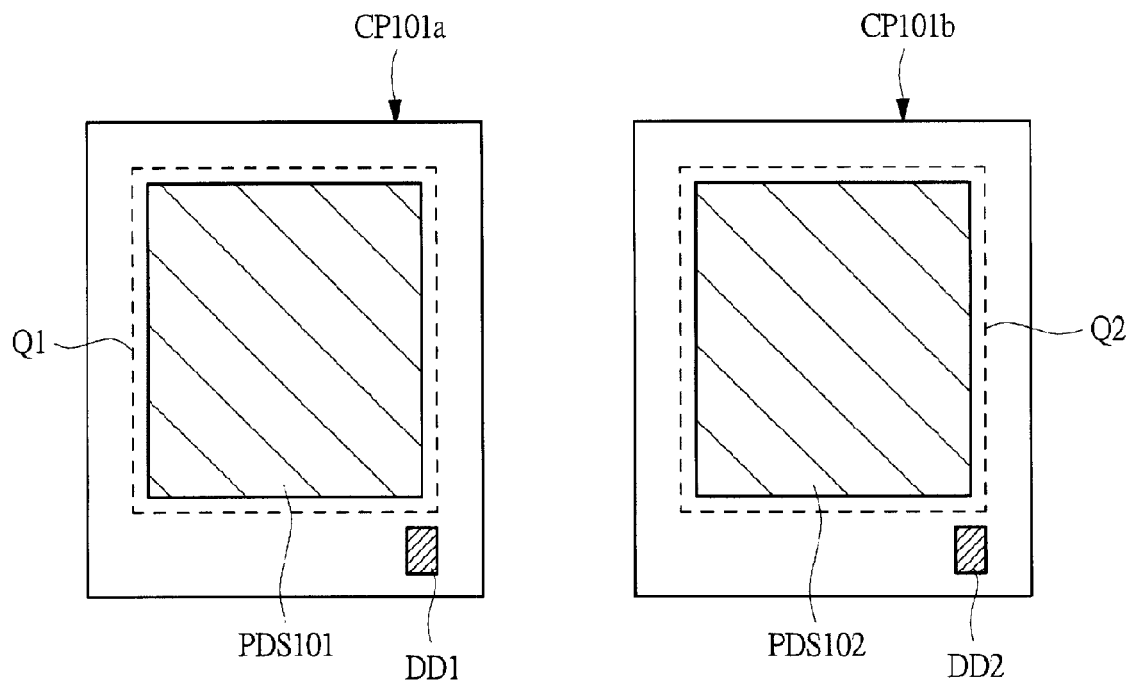
FIG. 21 is a plan view showing the chip layout of the semiconductor chip in the first Comparative Example.

In a case of constituting the power MOSFETs Q1 and Q2 by two semiconductor chips CP101a and CP101b as is the case for the first Comparative Example, the use of semiconductor chips having the same configuration is desirable for the semiconductor chip CP101a and the semiconductor chip CP101b. Because, in the case, it is possible to manufacture plural semiconductor chips having the same configuration using a semiconductor wafer, then to select arbitrary two semiconductor chips from the plural semiconductor chips, and to use one as the semiconductor chip CP101a and the other as the semiconductor chip CP101b. Therefore, there occurs no need to produce separately semiconductor chips for the semiconductor chip CP101a and the semiconductor chip CP101b, to reduce the manufacturing cost of the semiconductor chip. Consequently, as shown in FIG. 19, the arrangement position of the diode DD1 in the semiconductor chip CP101a and the arrangement position of the diode DD2 in the semiconductor chip CP101b are the same each other. In FIG. 19, the diode DD1 is arranged near the bottom-left corner part of the semiconductor chip CP101a, and, in the same manner, the diode DD2 is arranged near the bottom-left corner part of the semiconductor chip CP101b. FIG. 21 shows the semiconductor chips CP101a and CP101b having a modified arrangement position of the diodes DD1 and DD2 in the first Comparative Example shown in FIG. 19. As described above, since the semiconductor chip CP101a and the semiconductor chip CP101b are semiconductor chips having the same configuration, in FIG. 21, the diode DD1 is arranged near the bottom-right corner part of the semiconductor chip CP101a, and, in the same manner, the diode DD2 is arranged near the bottom-right corner part of the semiconductor chip CP101b.

On the other hand, when the power MOSFETs Q1 and Q2 are built in one semiconductor chip CP201, it is considered to couple (link) two semiconductor chips CP101a and CP101b in the first Comparative Example shown in FIG. 19 to form into one semiconductor chip CP201. The semiconductor chip CP201 in the second Comparative Example shown in FIG. 20 corresponds to one semiconductor chip formed by coupling (linking) two semiconductor chips CP101a and CP101b in the first Comparative Example 2 shown in FIG. 19.

Consequently, the semiconductor chip CP201 in the second Comparative Example shown in FIG. 20 has a first MOSFET region RG201 corresponding to the semiconductor chip CP101a and a second MOSFET region RG202 corresponding to the semiconductor chip CP101b. Therefore, the semiconductor chip CP201 in the second Comparative Example is in such a state that the vertical power MOSFET corresponding to the power MOSFET Q1 and the diode DD1 are formed in the first MOSFET region RG201, and that the vertical power MOSFET corresponding to the power MOSFET Q2 and the diode DD2 are formed in the second MOSFET region RG202. Meanwhile, the first MOSFET region RG201 corresponds to the first MOSFET region RG1 in Embodiment 1, and the second MOSFET region RG202 corresponds to the second MOSFET region RG2 in Embodiment 1, but arrangement positions of the diodes DD1 and DD2 and pad electrode PD in the second Comparative Example differ from those in Embodiment 1, which will be described in detail later.

Respective semiconductor chips CP101a and CP101b in the first Comparative Example in FIG. 19 have diodes DD1 and DD2 arranged near the bottom-left corner part, respectively, and, corresponding to the arrangement, the semiconductor chip CP201 in the second Comparative Example in FIG. 20 has the diode DD1 arranged near the bottom-left corner part of the first MOSFET region RG201 and the diode DD2 arranged near the bottom-left corner part of the second MOSFET region RG202. In the semiconductor chip CP201 in the second. Comparative Example shown in FIG. 20, however, such a problem as described below occurs.

In the semiconductor chip CP201 in the second Comparative Example shown in FIG. 20, when the power MOSFET Q2 generates excessive heat, the temperature mainly of the second MOSFET region RG202 rises, and, since this can be detected with the diode DD2 arranged at the bottom-left of the second MOSFET region RG202, a controlling circuit (a circuit corresponding to the controlling circuit DR) can promptly turn off the power MOSFET Q2. In this case, since the diode DD1 arranged at the bottom-left of the first MOSFET region RG201 lies apart from the power MOSFET Q2, it does not detect the excess temperature rise of the power MOSFET Q2 and the power MOSFET Q1 is not turned off.

On the other hand, in the semiconductor chip CP201 in the second Comparative Example shown in FIG. 20, when the power MOSFET Q1 generates excessive heat, the temperature mainly of the first MOSFET region RG201 rises, and, since the diode DD1 arranged at the bottom-left of the first MOSFET region RG201 can detect the rise, the controlling circuit can promptly turn off the power MOSFET Q1. In this case, since the diode DD2 arranged at the bottom-left of the second MOSFET region RG202 lies near the power MOSFET Q1, too, not only the diode DD1 but also even the diode DD2 detects the excessive temperature rise of the power MOSFET Q1 to cause such an anxiety that the controlling circuit turns off the power MOSFET Q2 according to the detection of the diode DD2. This is the malfunction (erroneous detection) of the diode DD2.

Figure 22:
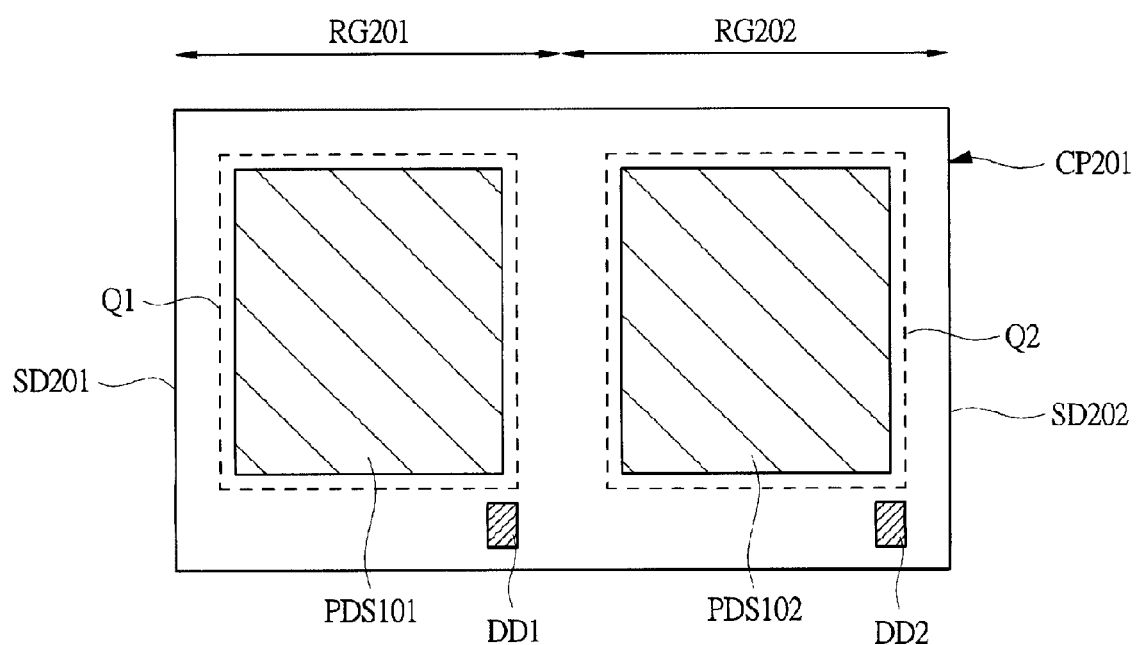
FIG. 22 is a plan view showing the chip layout of the semiconductor chip in the second Comparative Example.

The semiconductor chip CP201 in the second Comparative Example shown in FIG. 22 corresponds to one formed by coupling (linking) two semiconductor chips CP101a and CP101b in the first Comparative Example shown in FIG. 21 to be one semiconductor chip. Corresponding to that each of diodes DD1 and DD2 is arranged near the bottom-right corner part in respective semiconductor chips CP101a and CP101b in the first Comparative Example in FIG. 21, in the semiconductor chip CP201 in the second Comparative Example in FIG. 22, the diode DD1 is arranged near the bottom-right corner part of the first MOSFET region RG201, and the diode DD2 is arranged near the bottom-right corner part of the second MOSFET region RG202.

In the semiconductor chip CP201 in the second Comparative Example shown in FIG. 22, when the power MOSFET Q1 generates excessive heat, the diode DD1 arranged at the bottom-right of the first MOSFET region RG201 can detect this, and the controlling circuit can promptly turn the power MOSFET Q1 off. In this case, since the diode DD2 arranged at the bottom-right of the second MOSFET region RG202 lies apart from the power MOSFET Q1, it does not detect the excessive temperature rise of the power MOSFET Q1 and the power MOSFET Q2 is not turned off.

On the other hand, in the semiconductor chip CP201 in the second Comparative Example shown in FIG. 22, when the power MOSFET Q2 generates excessive heat, the diode DD2 arranged at the bottom-right of the second MOSFET region RG202 can detect this and the controlling circuit can promptly turn off the power MOSFET Q2. In this case, since the diode DD1 arranged at the bottom-right of the first MOSFET region RG201, too, lies near the power MOSFET Q2, not only the diode DD2 but even also the diode DD1 detects the excessive temperature rise of the power MOSFET Q2 to cause such an anxiety that the controlling circuit turns off the power MOSFET Q1 according to the detection of the diode DD1. This is the malfunction (erroneous detection) of the diode DD1.

Essentially, the power MOSFET Q1 and the power MOSFET Q2 should be controlled independently from each other, and, when the temperature of the power MOSFET Q1 rises excessively, the power MOSFET Q1 needs to be turned off but the power MOSFET Q2 does not need to be turned off, and, when the temperature of the power MOSFET Q2 rises excessively, the power MOSFET Q2 needs to be turned off but the power MOSFET Q1 does not need to be turned off. That is, it is required that the diode DD1 can detect sensitively the excessive temperature rise (heat generation) of the power MOSFET Q1 but is insensitive to the temperature rise (heat generation) of the power MOSFET Q2, and that, on the other hand, the diode DD2 can detect sensitively the excessive temperature rise (heat generation) of the power MOSFET Q2 but is insensitive to the temperature rise (heat generation) of the power MOSFET Q1. Consequently, the present inventors found that the prevention of the malfunction of the diodes DD1 and DD2 was extremely important in the semiconductor chip in which the power MOSFETs Q1 and Q2 were formed, and that devising good arrangement positions of the diodes DD1 and DD2 were important for the purpose.

Figure 23:
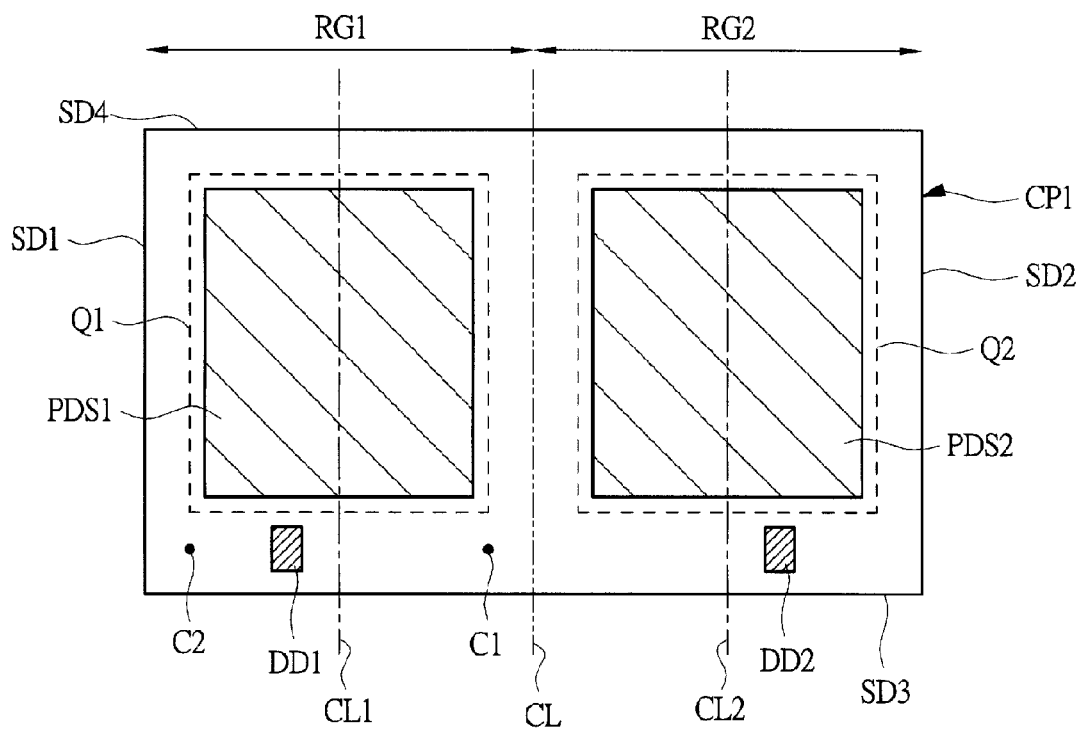
FIG. 23 is a plan view showing the arrangement position of diodes in the semiconductor chip for use in the semiconductor device being an embodiment of the present invention.
Figure 24:
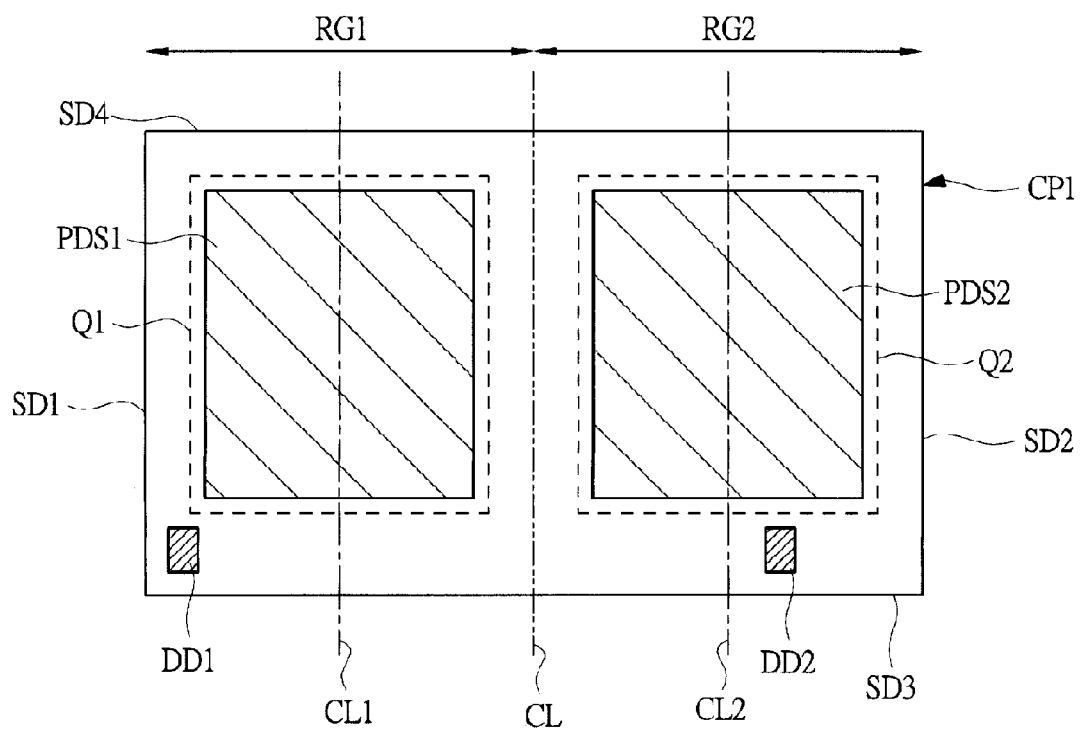
FIG. 24 is a plan view showing the arrangement position of diodes in the semiconductor chip for use in the semiconductor device being an embodiment of the present invention.
Figure 25:
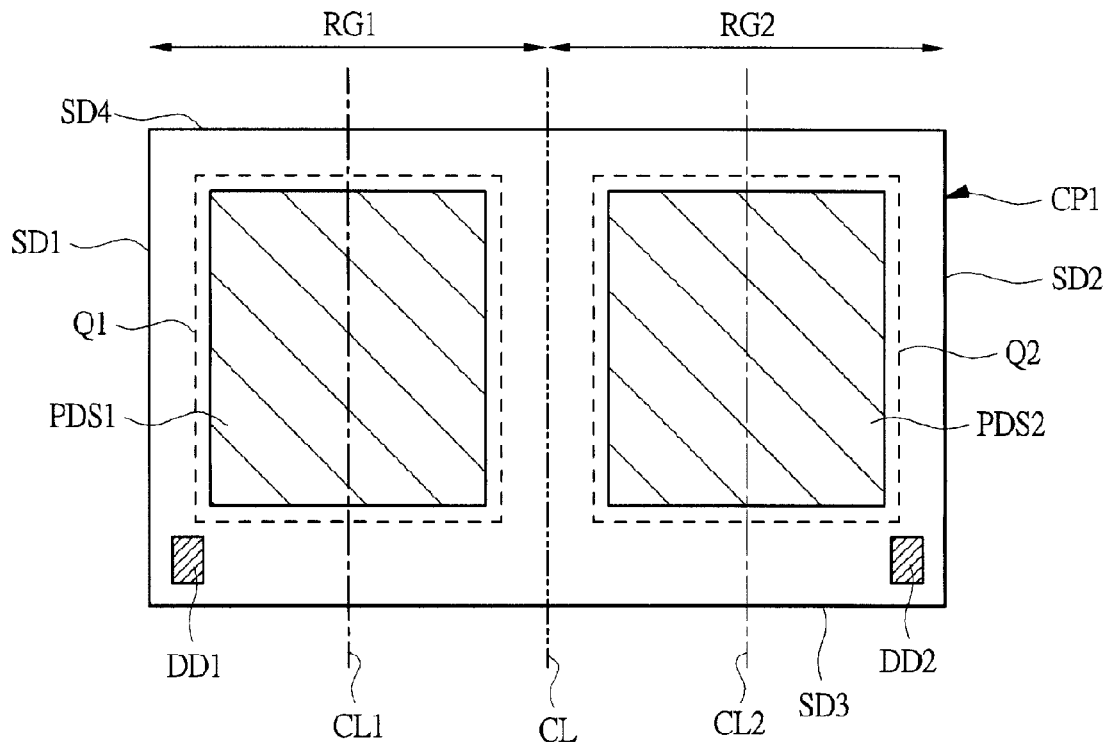
FIG. 25 is a plan view showing the arrangement position of diodes in the semiconductor chip for use in the semiconductor device being an embodiment of the present invention.

FIGS. 23 to 25 are plan views showing the arrangement position of the diodes DD1 and DD2 in the semiconductor chip CP1 in Embodiment 1, which correspond to FIGS. 12 and 13 or FIGS. 19 to 22. Meanwhile, although FIGS. 23 to 25 are plan views, they are shown with hatching attached to regions where the pad electrode PDS1 or PDS2 for the source is formed or regions where the diode DD1 or DD2 is formed, in order to make the understanding easy. But, in FIGS. 23 to 25, the diagrammatic representation is omitted for pad electrodes PD other than the pad electrodes PDS1 and PDS2 for the source. And, in FIGS. 23 to 25, the region, where the vertical power MOSFET corresponding to the power MOSFET Q1 is formed, is schematically shown by surrounding it with a dotted line having the symbol Q1, and the region, where the vertical power MOSFET corresponding to the power MOSFET Q2 is formed, is schematically shown by surrounding it with a dotted line having the symbol Q2.

In Embodiment 1, the power MOSFETs Q1 and Q2 are formed for one semiconductor chip CP1. And, in the semiconductor chip CP1, as shown also in FIGS. 12 and 13 and FIGS. 23 to 25, the diode DD1 is also formed (arranged) in the first MOSFET region RG1 where the power MOSFET Q1 (the vertical power MOSFET corresponding to it) is formed, and the diode DD2 is also formed (arranged) in the second MOSFET region RG2 where the power MOSFET Q2 (the vertical power MOSFET corresponding to it) is formed. The positions of the diodes DD1 and DD2 are designed so that the diode DD1 arranged in the first MOSFET region RG1 lies apart from the power MOSFET Q2 (the vertical power MOSFET corresponding to it) as far as possible, and that the diode DD2 arranged in the second MOSFET region RG2 lies apart from the power MOSFET Q1 (the vertical power MOSFET corresponding to it) as far as possible. That is, the position of the diodes DD1 and DD2 is designed according to the following standpoint.

In Embodiment 1, firstly, as a first requisite, the diode DD1 is arranged so as to lie nearer to the side SD1 of the semiconductor chip CP1, instead of the second MOSFET region RG2 (more specifically, the power MOSFET Q2 formed in the second MOSFET region RG2), in the main surface (the first MOSFET region RG1 thereof) of the semiconductor chip CP1. And, the diode DD2 is arranged so as to lie nearer to the side SD2 of the semiconductor chip CP1, instead of the first MOSFET region RG1 (more specifically, the power MOSFET Q1 formed in the second MOSFET region RG1), in the main surface (the second MOSFET region RG2 thereof) of the semiconductor chip CP1.

When the first requisite is described from another standpoint, it is so designed in the semiconductor chip CP1 that the interval from the diode DD1 (the region where it is formed) to the side SD1 is smaller (shorter) than the interval from the diode DD1 (the region where it is formed) to the power MOSFET Q2 (the region where a vertical power MOSFET corresponding to it is formed). And, it is so designed in the semiconductor chip CP1 that the interval from the diode DD2 (the region where it is formed) to the side SD2 is smaller (shorter) than the interval from the diode DD2 (the region where it is formed) to the power MOSFET Q1 (the region where a vertical power MOSFET corresponding to it is formed).

When the first requisite is described from furthermore another standpoint, the diode DD1 lies on the side nearer to the side SD1 than the centerline CL1 of the first MOSFET region RG1, and the diode DD2 lies on the side nearer to the side SD2 than, the centerline CL2 of the second MOSFET region RG2. That is, the diode DD1 lies between the side SD1 and the centerline CL1 of the first MOSFET region RG1 in the main surface of the semiconductor chip CP1, and the diode DD2 lies between the side SD2 and the centerline CL2 of the second MOSFET region RG2 in the main surface of the semiconductor chip CP1. The centerlines CL1 and CL2 are imaginary lines, and are shown by a dashed one-dotted line in FIGS. 23 to 25. The centerline CL1 is parallel to the side SD1, and the centerline CL2 is parallel to the side SD2. The centerline CL1 is also a line bisecting the first MOSFET region RG1 between the side SD1 and the centerline CL, and the centerline CL2 is also a line bisecting the second MOSFET region RG2 between the side SD2 and the centerline CL.

Any of cases in FIGS. 23 to 25 satisfies the first requisite.

Here, the side SD1 and the side SD2 of the semiconductor chip CP1 are sides that face each other in the main surface of the semiconductor chip CP1, and, preferably, the side SD1 and the side SD2 are parallel to each other. In the main surface of the semiconductor chip CP1, between the side SD1 and the side SD2 (more specifically, approximately on the middle of the side SD1 and the side SD2), the boundary between the first MOSFET region RG1 and the second MOSFET region RG2 (the boundary approximately corresponds to the centerline CL) lies, wherein the first MOSFET region RG1 lies on the side of the side SD1, and the second MOSFET region RG2 lies on the side of the side SD2. Accordingly, the side SD1 forms the end part of the first MOSFET region RG1, and side SD2 forms the end part of the second MOSFET region RG2. Consequently, the power MOSFET Q1 (a vertical power MOSFET corresponding to it) is arranged so as to lie nearer to the side SD1, instead of the side SD2, in the main surface of the semiconductor chip CP1, and the power MOSFET Q2 (a vertical power MOSFET corresponding to it) is arranged so as to lie nearer to the side SD2, instead of the side SD1 in the main surface of the semiconductor chip CP1. That is, in the main surface of the semiconductor chip CP1, the power MOSFET Q2 is arranged between the power MOSFET Q1 and the side SD2, and the power MOSFET Q1 is arranged between the power MOSFET Q2 and the side SD1.

The case of the semiconductor chip CP201 in the second Comparative Example, wherein two semiconductor chips (CP101a and CP101b) having substantially the same configuration are coupled (linked) to form one semiconductor chip, can not satisfy the first requisite. The reason is that, when the diode DD1 is arranged so as to lie nearer to the side SD201 of the semiconductor chip CP201, instead of the power MOSFET Q2 as in FIG. 20, the diode DD2 is arranged, consequently, so as to lie nearer to the power MOSFET Q1, instead of the side SD202 of the semiconductor chip CP201. And, when the diode DD2 is arranged so as to lie nearer to the side SD202 of the semiconductor chip CP201, instead of the power MOSFET Q1 as in FIG. 22, the diode DD1 is arranged, consequently, so as to lie nearer to the power MOSFET Q2, instead of the side SD201 of the semiconductor chip CP201. When the diode DD2 lies near the power MOSFET Q1 as is the case for the semiconductor chip CP201 in FIG. 20, and when the diode DD1 lies near the power MOSFET Q2 as is the case for the semiconductor chip CP201 in FIG. 22, differing from Embodiment 1, either the diode DD1 or the diode DD2 may function erroneously, as described above.

In contrast, in Embodiment 1, as the result of satisfying the first requisite, that is, arranging the diode DD1 so as to lie nearer to the side SD1 of the semiconductor chip CP1, instead of the power MOSFET Q2 in the first MOSFET region RG1 of the semiconductor chip CP1, the interval (spacing) between the diode DD1 and the power MOSFET Q2 becomes large. Consequently, the diode DD1 is hardly influenced by the heat generation of the power MOSFET Q2, and the malfunction of the diode DD1 caused by the heat generation of the power MOSFET Q2 can be suppressed or prevented. And, in Embodiment 1, as the result of satisfying the first requisite, that is, arranging the diode DD2 so as to lie nearer to the side SD2 of the semiconductor chip CP1, instead of the power MOSFET Q1 in the second MOSFET region RG2 of the semiconductor chip CP1, the interval (spacing) between the diode DD2 and the power MOSFET Q1 becomes large. Consequently, the diode DD2 is hardly influenced by the heat generation of the power MOSFET Q1, and the malfunction of the diode DD2 caused by the heat generation of the power MOSFET Q1 can be suppressed or prevented. This can improve the performance of the semiconductor device, and improve the reliability of the semiconductor device.

Since each of cases in FIGS. 23 to 25 satisfies the first requisite, it is possible to set both the interval (spacing)

between the diode DD1 and the power MOSFET Q2, and the interval (spacing) between the diode DD2 and the power MOSFET Q1 to be large, in the semiconductor chip CP1, and to suppress or prevent the malfunction of the diodes DD1 and DD2.

In order to make it possible to prevent the malfunction of the diodes DD1 and DD2 as far as possible, it is desired to set the interval between the diode DD1 and the second MOSFET region RG2 (power MOSFET Q2) to be as large as possible, and to set the interval between the diode DD2 and the first MOSFET region RG1 (power MOSFET Q1) to be as large as possible in the semiconductor chip CP1, in addition to the satisfaction of the first requisite. In the semiconductor chip CP1, the interval between the diode DD1 and the second MOSFET region RG2 (power MOSFET Q2) can be made approximately the maximum when the diode DD1 is arranged along the side SD1, and the interval between the diode DD2 and the first MOSFET region RG1 (power MOSFET Q1) can be made approximately the maximum when the diode DD2 is arranged along the side SD2. Therefore, in Embodiment 1, as shown in FIG. 25, the diode DD1 is preferably arranged along the side SD1 in the main surface of the semiconductor chip CP1, and the diode DD2 is preferably arranged along the side SD2 in the main surface of the semiconductor chip CP1. This can result in the largest interval between the diode DD1 and the second MOSFET region RG2 (power MOSFET Q2), and between the diode DD2 and the first MOSFET region. RG1 (power MOSFET Q1) in the semiconductor chip CP1 to enhance the effect of preventing the malfunction of the diodes DD1 and DD2.

That is, each of cases in FIGS. 23 to 25 can give the effect of suppressing or preventing the malfunction of the diodes DD1 and DD2 because it satisfies the first requisite, but the case in FIG. 25 (the case in which the diode DD1 is arranged along the side SD1, and the diode DD2 is arranged along the side SD2) can give the highest effect of preventing the malfunction of the diodes DD1 and DD2. This can further improve the performance of the semiconductor device, and further improve the reliability of the semiconductor device.

<About the Pad Electrode in the Semiconductor Chip>

In Embodiment 1, not only the arrangement position of the diodes DD1 and DD2, but also the arrangement position of the pad electrode PD is devised, in order to enable the malfunction of the diodes DD1 and DD2 to be prevented as far as possible.

Figure 26:
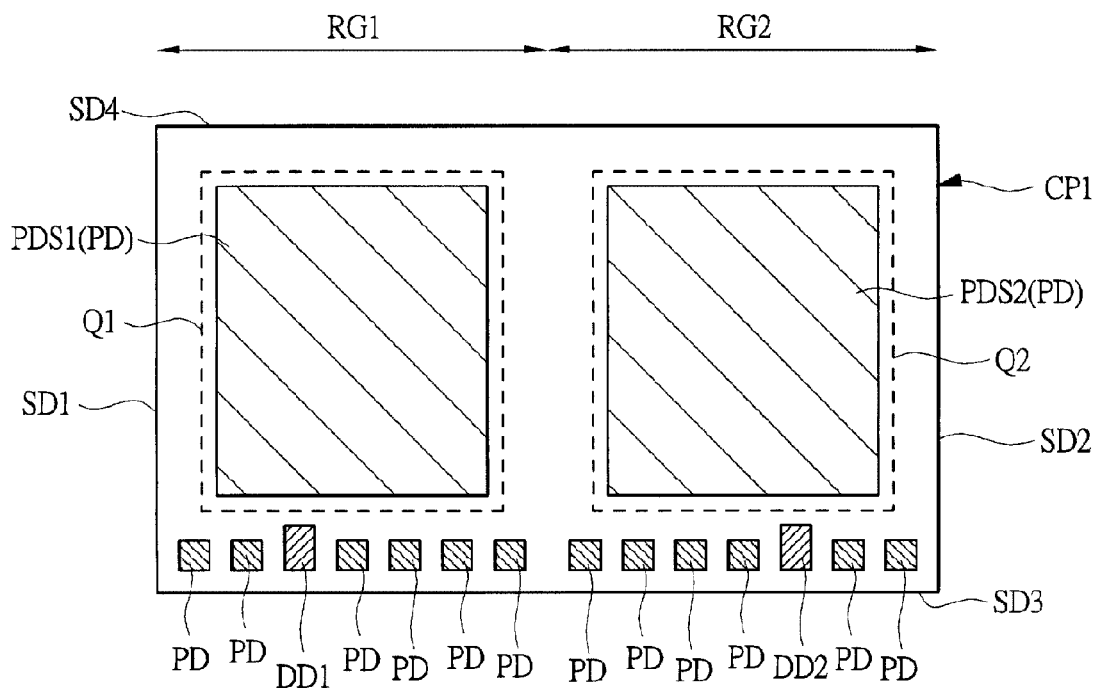
FIG. 26 is a plan view showing the arrangement position of diodes and pad electrodes in the semiconductor chip for use in the semiconductor device being an embodiment of the present invention.
Figure 27:
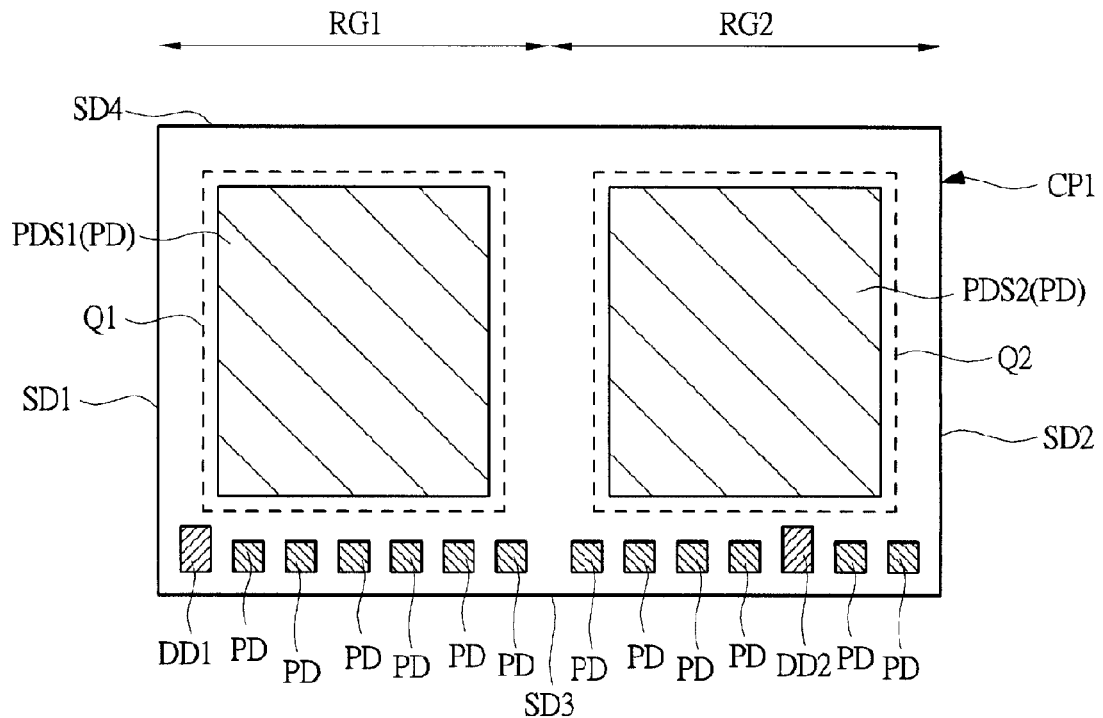
FIG. 27 is a plan view showing the arrangement position of diodes and pad electrodes in the semiconductor chip for use in the semiconductor device being an embodiment of the present invention.
Figure 28:
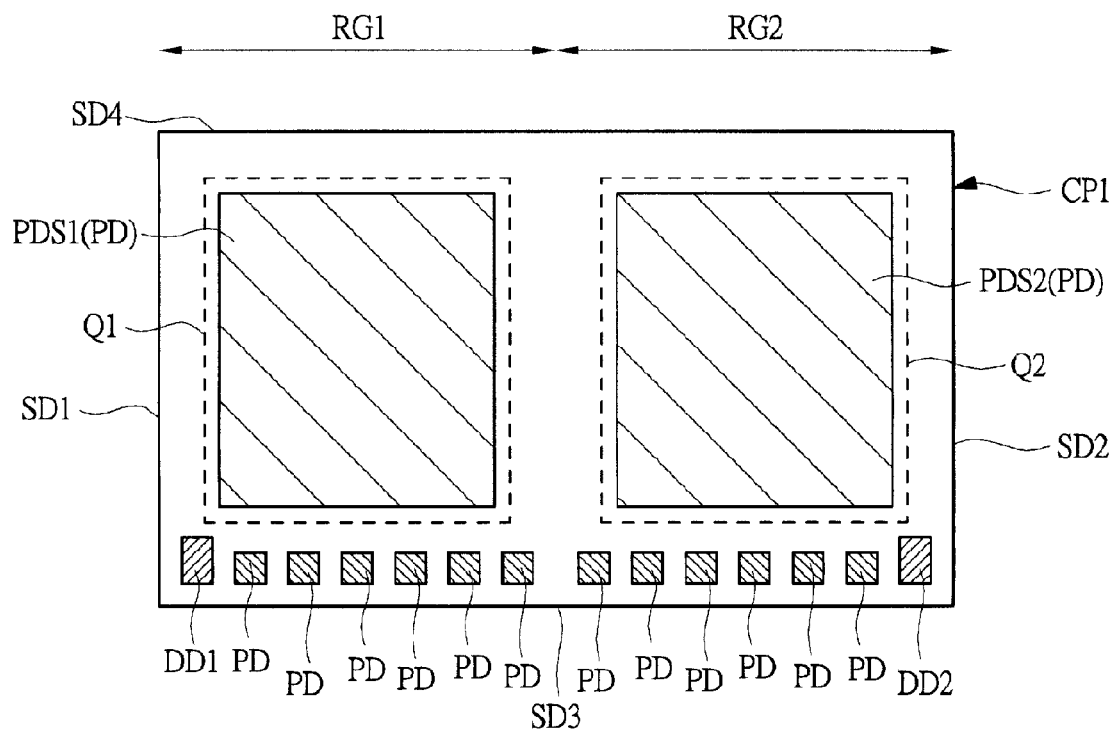
FIG. 28 is a plan view showing the arrangement position of diodes and pad electrodes in the semiconductor chip for use in the semiconductor device being an embodiment of the present invention.

FIGS. 26 to 28 are plan views showing the arrangement position of the diodes DD1 and DD2 and the pad electrode PD in the semiconductor chip CP1 in Embodiment 1. In FIGS. 23 to 25, the diagrammatic representation of pad electrodes PD other than the pad electrodes PDS1 and PDS2 for the source is omitted, but, in FIGS. 26 to 28, all pad electrodes PD including the pad electrodes PDS1 and PDS2 for the source are shown. Meanwhile, FIG. 26 corresponds to a drawing formed by recording additionally pad electrodes PD other than the pad electrodes PDS1 and PDS2 for the source in FIG. 23, FIG. 27 corresponds to a drawing formed by recording additionally pad electrodes PD other than the pad electrodes PDS1 and PDS2 for the source in FIG. 24, and FIG. 28 corresponds to a drawing formed by recording additionally pad electrodes PD other than the pad electrodes PDS1 and PDS2 for the source in FIG. 25. Although FIGS. 26 to 28 are plan views, they are shown with hatching attached to regions where the pad electrode PD, or the diode DD1 or DD2 is formed, in order to make the understanding easy. And, in FIGS. 26 to 28, the region, where the vertical power MOSFET corresponding to the power MOSFET Q1 is formed, is schematically shown by surrounding it by a dotted line with a symbol Q1, and the region, where the vertical power MOSFET corresponding to the power MOSFET Q2 is formed, is schematically shown by surrounding it by a dotted line with a symbol Q2.

In Embodiment 1, as a second requisite, at least one of pad electrodes PD excluding the pad electrodes PDS1 and PDS2 for the source is arranged between the diode DD1 and the diode DD2 in the main surface of the semiconductor chip CP1.

Any of cases in FIGS. 26 to 28 satisfies the second requisite. That is, among pad electrodes PD that belong to the semiconductor chip CP1 and pad electrodes PD excluding the pad electrodes PDS1 and PDS2 (12 pad electrodes PD in the case in FIGS. 26 to 28), 8 pad electrodes PD are arranged between the diode DD1 and the diode DD2 in the case in FIG. 26, 10 pad electrodes PD are arranged between the diode DD1 and the diode DD2 in the case in FIG. 27, and all 12 pad electrodes PD are arranged between the diode DD1 and the diode DD2 in the case in FIG. 28.

The pad electrodes PDS1 and PDS2 for the source have a larger area than pad electrodes PD other than the pad electrodes PDS1 and PDS2. In the semiconductor chip CP1, it is so constituted that the pad electrode PDS1 for the source is formed just above the vertical power MOSFET corresponding to the power MOSFET Q1, and that high current flows in the pad electrode PDS1 for the source when the power MOSFET Q1 is turned ON. And, in the semiconductor chip CP1, it is so constituted that the pad electrode PDS2 for the source is formed just above the vertical power MOSFET corresponding to the power MOSFET Q2, and that high current flows through the pad electrode PDS2 for the source when the power MOSFET Q2 is turned ON. Consequently, the pad electrodes PDS1 and PDS2 are potential sources of the heat generation, with the power MOSFETs Q1 and Q2. Since high current flows through the pad electrodes PDS1 and PDS2 for the source as compared with pad electrodes PD other than the pad electrodes PDS1 and PDS2 for the source, the metal plates MPL1 and MPL2 are connected instead of the bonding wire BW.

On the other hand, among plural pad electrodes PD belonging to the semiconductor chip CP1, pad electrodes PD excluding the pad electrodes PDS1 and PDS2 for the source are, formed just above the field insulating film (element isolation region) 2. And, since pad electrodes PD other than the pad electrodes PDS1 and PDS2 for the source have a smaller current flowing through them than the pad electrodes PDS1 and PDS2 for the source, they do not form a heat generation source, and the bonding wire BW is connected to them.

Even when the interval (spacing) between the diode DD1 and the power MOSFET Q2, and the interval (spacing) between the diode DD2 and the power MOSFET Q1 are made large by satisfying the first requisite, if the power MOSFET Q2 generates heat excessively, the heat reaches eventually the diode DD1, and if the power MOSFET Q1 generates heat excessively, the heat reaches eventually the diode DD2. In order to prevent the malfunction of the diodes DD1 and DD2 as far as possible, it is effective not to allow the heat generated by the power MOSFET Q2 to reach easily the diode DD1, and not to allow the heat generated by the power MOSFET Q1 to reach easily the diode DD2.

The arrangement of at least one among pad electrodes PD excluding the pad electrodes PDS1 and PDS2 for the source between the diode DD1 and the diode DD2 in the main surface of the semiconductor chip CP1, as the second requisite, makes it possible not to allow the heat generated by the power MOSFET Q2 to reach easily the diode DD1, and not to allow the heat generated by the power MOSFET Q1 to reach easily the diode DD2. Because, such a heat discharge route is formed that the heat is discharged from the pad electrode PD arranged between the diode DD1 and the diode DD2 through the connection member (here, the bonding wire BW) connected to the electrode to the outside of the semiconductor chip CP1.

That is, by arranging the pad electrode PD (but, excluding the pad electrodes PDS1 and PDS2 for the source) between the diode DD1 and the diode DD2, when the power MOSFET Q2 generates excessive heat, the heat can be discharged, before the heat reaches the diode DD1, from the pad electrode PD positioned in a middle thereof (the pad electrode PD positioned between the diode DD1 and the diode DD2) to the outside of the semiconductor chip CP1 via the bonding wire BW. Consequently, the temperature rise of the diode DD1 caused by the heat generation of the power MOSFET Q2 can be suppressed, and the malfunction of the diode DD1 can be suppressed or prevented. And, by arranging the pad electrode PD (but, excluding the pad electrodes PDS1 and PDS2 for the source) between the diode DD1 and the diode DD2, when the power MOSFET Q1 generates excessive heat, the heat can be discharged, before the heat reaches the diode DD2, from the pad electrode PD positioned in a middle thereof (the pad electrode PD positioned between the diode DD1 and the diode DD2) to the outside of the semiconductor chip CP1 via the bonding wire BW. Consequently, the temperature rise of the diode DD2 caused by the heat generation of the power MOSFET Q1 can be suppressed, and the malfunction of the diode DD2 can be suppressed or prevented.

Under pad electrodes PD other than the pad electrodes PDS1 and PDS2 for the source, the field insulating film (element isolation region) 2 is arranged. The field insulating film (element isolation region) 2 also contributes to suppress the heat transfer from the power MOSFET Q2 to the diode DD1 when the power MOSFET Q2 generates excessive heat, and the heat transfer from the power MOSFET Q1 to the diode DD2 when the power MOSFET Q1 generates excessive heat. Thus, by arranging the pad electrode PD (but, excluding the pad electrodes PDS1 and PDS2 for the source) between the diode DD1 and the diode DD2, the field insulating film 2 extends under the pad electrode PD, which can suppress the temperature rise of the diode DD1 caused by the heat generation of the power MOSFET Q2 and the temperature rise of the diode DD2 caused by the heat generation of the power MOSFET Q1, to suppress or prevent the malfunction of the diodes DD1 and DD2.

As described above, the pad electrode PD (but, excluding the pad electrodes PDS1 and PDS2 for the source) positioned between the diode DD1 and the diode DD2 can act so as to hinder the heat transfer from the power MOSFET Q2 to the diode DD1, and the heat transfer from the power MOSFET Q1 to the diode DD2. Consequently, in Embodiment 1, by arranging at least one among pad electrodes PD excluding the pad electrodes PDS1 and PDS2 for the source between the diode DD1 and the diode DD2 in the main surface of the semiconductor chip CP1, as the second requisite, the effect of preventing the malfunction of the diodes DD1 and DD2 can be enhanced. This can improve the performance of the semiconductor device, and improve the reliability of the semiconductor device.

In order to make it possible to prevent as far as possible the malfunction of the diodes DD1 and DD2, in addition to satisfying the second requisite, the setting of the arrangement position of the pad electrode PD as described below is preferable. That is, it is preferable to arrange all pad electrodes PD excluding the pad electrodes PDS1 and PDS2 for the source among plural pad electrodes PD belonging to the semiconductor chip CP1 between the diode DD1 and the diode DD2 in the main surface of the semiconductor chip CP1. Pad electrodes PD other than the pad electrodes PDS1 and PDS2 for the source may hinder the heat transfer in the semiconductor chip CP1, as described above. Therefore, by arranging all pad electrodes PD excluding the pad electrodes PDS1 and PDS2 for the source that may work as a heat generation source (that is, pad electrodes that may hinder the heat transfer) between the diode DD1 and the diode DD2, the temperature rise of the diode DD1 caused by the heat generation of the power MOSFET Q2, and the temperature rise of the diode DD2 caused by the heat generation of the power MOSFET Q1 can be suppressed or prevented appropriately. Consequently, the effect of preventing the malfunction of the diodes DD1 and DD2 can be enhanced. Consequently, the performance of the semiconductor device can further be improved, and the reliability of the semiconductor device may further be improved.

Since any of cases in FIGS. 26 to 28 has the arrangement of the pad electrode PD satisfying the second requisite, they can give the effect of suppressing or preventing the malfunction of the diodes DD1 and DD2, and the case in FIG. 28 (the case where all pad electrodes PD other than the pad electrodes PDS1 and PDS2 for the source are arranged between the diode DD1 and the diode DD2) can make the effect of preventing the malfunction of the diodes DD1 and DD2 highest.

Further, it is more preferable to arrange all pad electrodes PD excluding the pad electrodes PDS1 and PDS2 for the source among plural pad electrodes PD belonging to the semiconductor chip CP1 between the diode DD1 and the diode DD2 along the side SD3 of the semiconductor chip CP1 in the main surface of the semiconductor chip CP1. To pad electrodes PD other than the pad electrodes PDS1 and PDS2 for the source, one end of the bonding wire BW is connected as described above, and the other end of the bonding wire BW is connected to the pad electrode PD2 of the semiconductor chip CP2. The arrangement of pad electrodes PD excluding the pad electrodes PDS1 and PDS2 for the source along the side SD3 of the semiconductor chip CP1 makes it easy to connect the bonding wire BW to pad electrodes PD other than the pad electrodes PDS1 and PDS2 for the source, and makes it easy to connect the pad electrode PD of the semiconductor chip CP1 (but, excluding the pad electrodes PDS1 and PDS2 for the source) with the pad electrode PD2 of the semiconductor chip CP2 by the bonding wire BW.

As shown in FIG. 28, and FIGS. 12 and 13, it is preferable that the diode DD1 is arranged near the corner part formed by the side SD1 and the side SD3 in the main surface of the semiconductor chip CP1, and that the diode DD2 is arranged near the corner part formed by the side SD2 and the side SD3 in the main surface of the semiconductor chip CP1. This makes it possible to arrange the diodes DD1 and DD2 without reducing the area of the region where the power MOSFETs Q1 and Q2 (vertical power MOSFETs corresponding to them) are formed, and to enlarge both the interval between the diode DD1 and the power MOSFET Q2 and the interval between the diode DD2 and the power MOSFET Q1, in the semiconductor chip CP1, to enhance effectively the effect of preventing the malfunction of the diodes DD1 and DD2. And, the arrangement of the diode DD1 near the corner formed by the side SD1 and the side SD3 and the arrangement of the diode DD2 near the corner formed by the side SD2 and the side SD3 make it possible to arrange pad electrodes PD (but, excluding the pad electrodes PDS1 and PDS2 for the source) arranged between the diode DD1 and the diode DD2 in the position along the side SD3, in the main surface of the semiconductor chip CP1. The effect obtained by arranging pad electrodes PD along the side SD3 is as described above.

Among plural pad electrodes PD belonging to the semiconductor chip CP1, pad electrodes PD connected electrically to the power MOSFET Q1 or the diode DD1 (including above-described pad electrodes PDG1, PDA1, PDC1, PDN1 and PDK1) are arranged in the first MOSFET region RG1 in the main surface of the semiconductor chip CP1. And, among plural pad electrodes PD belonging to the semiconductor chip CP1, pad electrodes PD connected electrically to the power MOSFET Q2 or the diode DD2 (including above-described pad electrodes PDG2, PDA2, PDC2, PDN2 and PDK2) are arranged in the second MOSFET region RG2 in the main surface of the semiconductor chip CP1. From another standpoint, among plural pad electrodes PD belonging to the semiconductor chip CP1, pad electrodes PD connected electrically to the power MOSFET Q1 or the diode DD1 (including above-described pad electrodes PDG1, PDA1, PDC1, PDN1 and PDK1) are arranged so as to lie nearer to the side SD1, instead of the side SD2 in the main surface of the semiconductor chip CP1. And, among plural pad electrodes PD belonging to the semiconductor chip CP1, pad electrodes PD connected electrically to the power MOSFET Q2 or the diode DD2 (including above-described pad electrodes PDG2, PDA2, PDC2, PDN2 and PDK2) are arranged so as to lie nearer to the side SD2, instead of the side SD1. This makes it possible to shorten the wiring connecting the power MOSFETs Q1 and Q2 and the diodes DD1 and DD2 with plural pad electrodes PD (the wiring formed from the electroconductive body film 22), and, therefore, the routing of the wiring becomes easy, and the wiring resistance can be reduced.

The pad electrodes PDS1 and PDS2 for the source are arranged between plural pad electrodes PD excluding the pad electrodes PDS1 and PDS2 for the source and the side SD4, in the main surface of the semiconductor chip CP1. From another standpoint, pad electrodes PD other than the pad electrodes PDS1 and PDS2 for the source are arranged on the side of the side SD3 (that is, so as to lie nearer to the side SD3 instead of the side SD4), and the pad electrodes PDS1 and PDS2 for the source are arranged on the side of the side SD4 (that is, so as to lie nearer to the side SD4 instead of the side SD3), in the main surface of the semiconductor chip CP1. And, the pad electrode PDS1 for the source is arranged so as to lie nearer to the side SD1, instead of the side SD2 in the main surface of the semiconductor chip CP1, and the pad electrode PDS2 for the source is arranged so as to lie nearer to the side SD2, instead of the side SD1 in the main surface of the semiconductor chip CP1. That is, the pad electrode PDS2 for the source is arranged between the pad electrode PDS1 for the source and the side SD2 in the main surface of the semiconductor chip CP1, and the pad electrode PDS1 for the source is arranged between the pad electrode PDS2 for the source and the side SD1 in the main surface of the semiconductor chip CP1. Consequently, plural pad electrodes PD (including the pad electrodes PDS1 and PDS2 for the source) belonging to the semiconductor chip CP1 can be arranged effectively over the main surface of the semiconductor chip CP1.

In the semiconductor chip CP1, the pad electrode PDS1 for the source is formed (arranged) at the upper part of the power MOSFET Q1 (the vertical power MOSFET corresponding to it), and the pad electrode PDS2 for the source is formed (arranged) at the upper part of the power MOSFET Q2 (the vertical power MOSFET corresponding to it). This makes it possible to connect the pad electrode PDS1 for the source with the power MOSFET Q1 (the vertical power MOSFET corresponding to it) through the shortest route, and to connect the pad electrode PDS2 for the source with the power MOSFET Q2 (the vertical power MOSFET corresponding to it) through the shortest route. Consequently, the ON resistance of the power MOSFETs Q1 and Q2 can be reduced.

Among plural pad electrodes PD belonging to the semiconductor chip CP1, each of the pad electrodes PDS1 and PDS2 for the source has preferably a larger planar area than each of pad electrodes PD excluding the pad electrodes PDS1 and PDS2 for the source. That is, the planar area of respective pad electrodes PDS1 and PDS2 for the source is preferably larger than the planar area of respective pad electrodes PD excluding these. This can give effectively a larger area to the pad electrodes PDS1 and PDS2 for the source through which a higher current flows as compared with pad electrodes PD other than the pad electrodes PDS1 and PDS2 for the source. Consequently, the current loss can be reduced, and the ON resistance of the power MOSFETs Q1 and Q2 can effectively be reduced. Moreover, as a result, the metal plates MPL1 and MPL2 can be connected easily to the pad electrodes PDS1 and PDS2 for the source.

Among plural pad electrodes PD belonging to the semiconductor chip CP1, to each of pad electrodes PD arranged between the diode DD1 and the diode DD2 (that is, pad electrodes PD other than the pad electrodes PDS1 and PDS2 for the source), the bonding wire BW is connected. On the other hand, to the pad electrodes PDS1 and PDS2 for the source, the above-described metal plates MPL1 and MPL2 are connected respectively.

Figure 29:
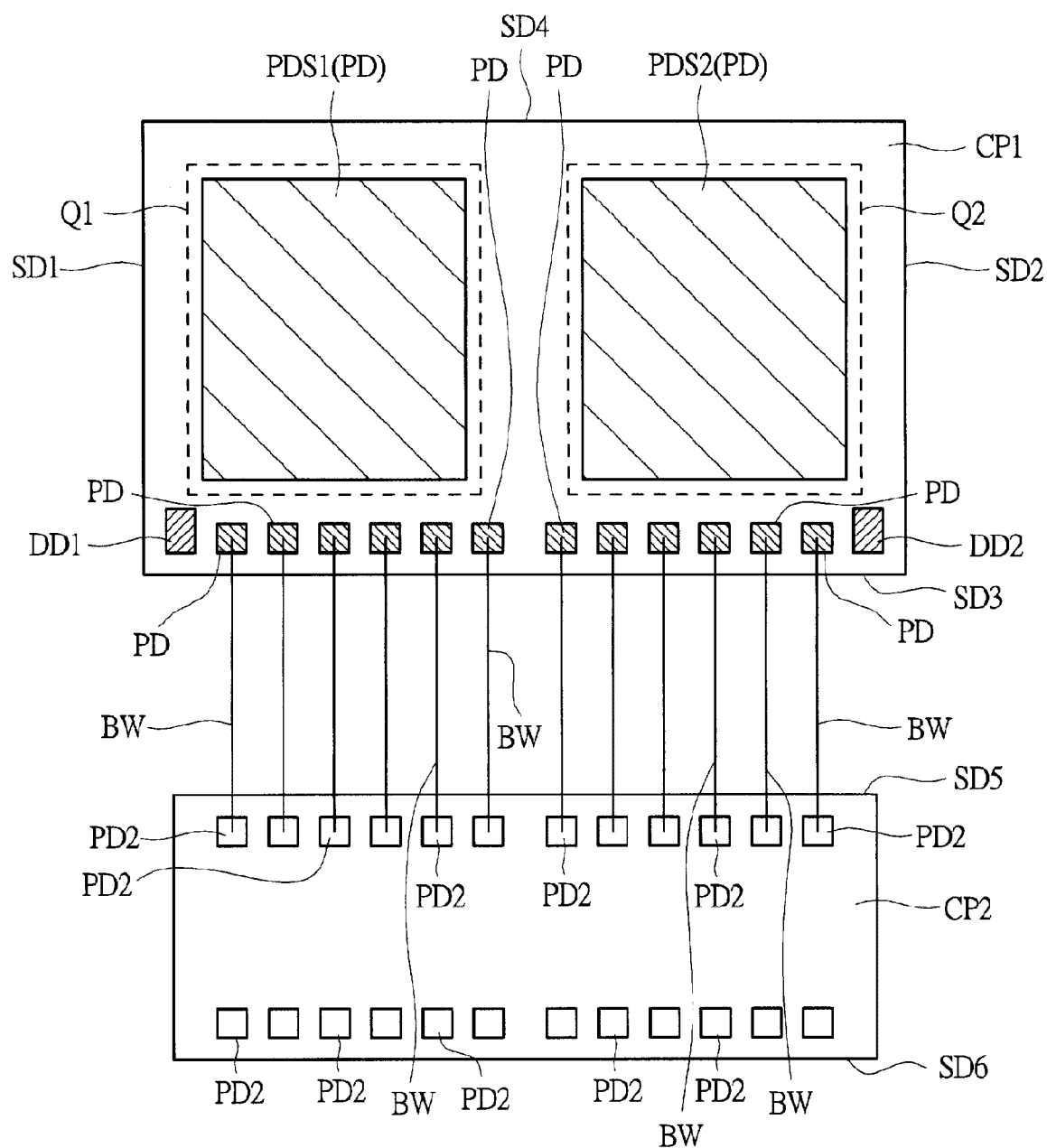
FIG. 29 is a plan view showing the arrangement position of semiconductor chips and the connection relationship by a bonding wire in the semiconductor device being an embodiment of the present invention.

FIG. 29 is a plan view showing the arrangement position and the connection relation by the bonding wire BW of the semiconductor chip CP1 and the semiconductor chip CP2, in the semiconductor device PKG according to Embodiment 1. FIG. 29 approximately corresponds to a drawing shown by picking out only the semiconductor chips CP1 and CP2, and the bonding wire BW connecting the semiconductor chips CP1 and CP2 (pad electrodes PD and PD2 thereof) from FIG. 7.

In the semiconductor device PKG according to Embodiment 1, in order to make it easy to connect the semiconductor chip CP1 with the semiconductor chip CP2, the semiconductor chip CP2 for controlling the semiconductor chip CP1 is arranged so as to lie nearer to the side SD3, instead of the side SD4 of the semiconductor chip CP1, as shown in FIG. 29, and also in FIGS. 6 to 7. And, plural pad electrodes PD arranged along the side SD3 (that is, pad electrodes PD other than the pad electrodes PDS1 and PDS2) are connected electrically with plural pad electrodes PD2 of the semiconductor chip CP2 via the plural bonding wires BW, in the main surface of the semiconductor chip CP1.

In this case, as shown in FIG. 29 and also in FIGS. 6 and 7, more preferably the semiconductor chips CP1 and CP2 are arranged so that the side SD5 of the semiconductor chip CP2 faces the side SD3 of the semiconductor chip CP1. And, more preferably, plural pad electrodes PD2 (pad electrodes PD2 to be connected electrically to the pad electrode PD of the semiconductor chip CP1) are arranged (arrayed) along the side SD5, in the main surface of the semiconductor chip CP2. This makes it possible to connect easily and appropriately the pad electrode PD (the pad electrode PD to be connected electrically to the pad electrode PD2 of the semiconductor chip CP2) in the semiconductor chip CP1 with the pad electrode PD2 (the pad electrode PD2 to be connected electrically to the pad electrode PD of the semiconductor chip CP1) in the semiconductor chip CP2 via the bonding wire BW.

As shown in FIG. 29 and FIGS. 6 and 7, the semiconductor chip CP2 has the side SD5 and the side SD6 facing each other. And, it is more preferable to arrange the pad electrode PD2 to be connected electrically to the pad electrode PD of the semiconductor chip CP1 along the side SD5 in the main surface of the semiconductor chip CP2, and to arrange the pad electrode PD2 to be connected electrically to the lead LD2 along the side SD6 in the main surface of the semiconductor chip CP2, among plural pad electrodes PD2 belonging to the semiconductor chip CP2. This makes it possible to connect easily and appropriately the semiconductor chip CP2 (the pad electrode PD2 thereof) with the semiconductor chip CP1 (the pad electrode PD thereof), and the semiconductor chip CP2 (the pad electrode PD2 thereof) with the lead LD2 (via the bonding wire BW).

In the semiconductor device PKG according to Embodiment 1, when the load LA1 short-circuits etc. and the power MOSFET Q1 generates excessive heat in the semiconductor chip CP1, the diode DD1 detects it to make it possible to turn off promptly the power MOSFET Q1, and to stop promptly the excessive heat generation of the power MOSFET Q1. In this case, in Embodiment 1, since the malfunction of the diode DD2 can be prevented as described above, the power MOSFET Q2 can be used normally as a switching element. And, when the load LA2 short-circuits etc. and the power MOSFET Q2 generates excessive heat in the semiconductor chip CP1, the diode DD2 detects it to make it possible to turn off promptly the power MOSFET Q2, and to stop promptly the excessive heat generation of the power MOSFET Q2. In this case, since the malfunction of the diode DD1 can be prevented as described above, the power MOSFET Q1 can be used normally as a switching element. As described above, in the power MOSFETs Q1 and Q2 that are controlled independently, it is possible to turn off only a power MOSFET to be turned off, and not to turn off a power MOSFET not to be turned off, and, therefore, the power MOSFETs Q1 and Q2 to be controlled independently can appropriately be controlled.

<Simulation Result>

Figure 30:
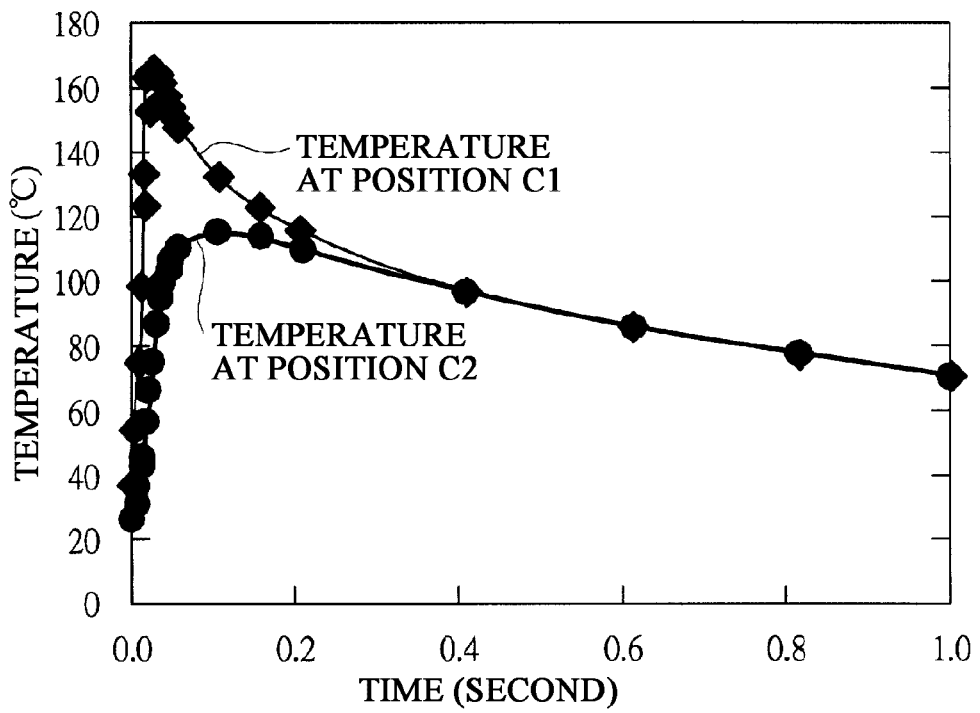
FIG. 30 is a graph showing the simulation result of the temperature change in the semiconductor chip in which the power MOSFET is formed.
Figure 31:
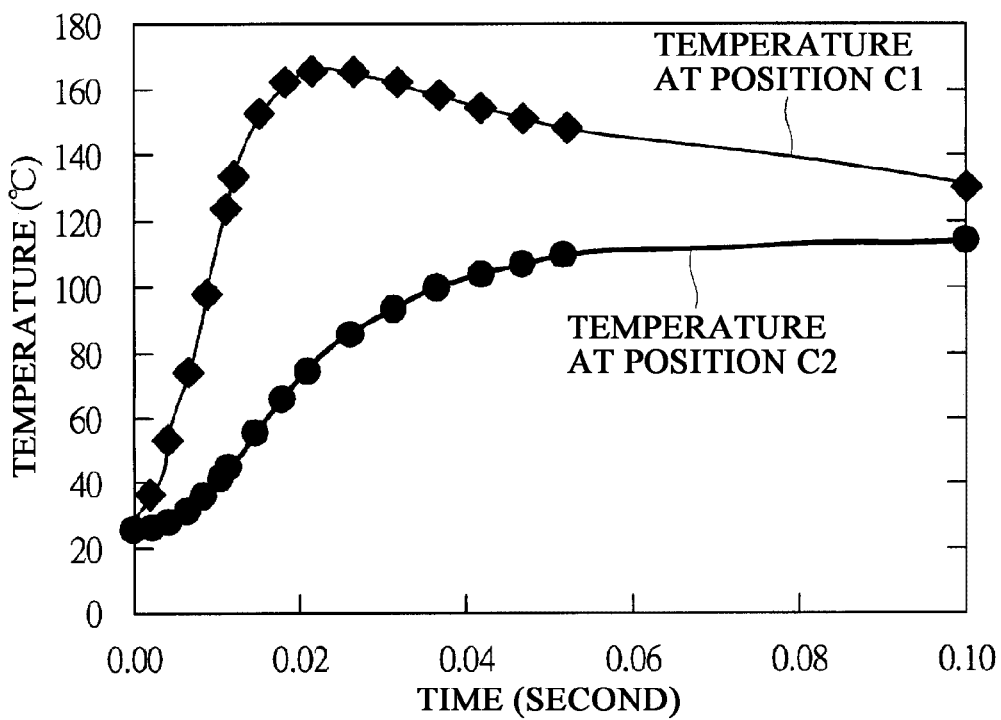
FIG. 31 is a graph showing the simulation result of the temperature change in the semiconductor chip in which the power MOSFET is formed.

FIGS. 30 and 31 are graphs showing the simulation result of the temperature change in a semiconductor chip in which the power MOSFETs Q1 and Q2 are formed. FIG. 30 shows the temperature change at the position corresponding to the position C1 shown in FIG. 23, and the temperature change at the position corresponding to the position C2 shown in FIG. 23, when the power MOSFET Q2 generates excessive heat in a semiconductor chip corresponding to the semiconductor chip CP1 according to Embodiment 1. FIG. 31 is an enlarged graph showing the range of 0 to 0.1 second in FIG. 30. Here, the start time of the heat generation of the power MOSFET Q2 corresponds to the start point (0 second) on the horizontal axis of graphs in FIGS. 30 and 31, and the elapsing time from the time point at which the power MOSFET Q2 began to generate heat is set as the horizontal axis of graphs in FIGS. 30 and 31. The graphs in FIGS. 30 and 31 have the vertical axis corresponding to the temperature, and show the temperature at the position corresponding to the position C1 shown in FIG. 23 and the temperature at the position corresponding to the position C2 in FIG. 23. The simulation is performed in such a state where, in the power MOSFETs Q1 and Q2, the power MOSFET Q2 generates heat and the power MOSFET Q1 does not generate heat. As to the amount of the heat generated by the power MOSFET Q2, a case is assumed where an excessive current (for example, a current that might flow when the load LA2 short-circuits) is applied to the power MOSFET Q2 as compared with the current that is ordinarily applied to the power MOSFET Q2 during the ON state of the power MOSFET Q2.

When the power MOSFET Q2 generates excessive heat, the temperature rises not only in the region where the power MOSFET Q2 is formed, but also at the positions C1 and C2.

In this case, as shown in the graphs in FIGS. 30 and 31, the temperature rises rapidly at the position C1 positioned near the power MOSFET Q2, but it rises moderately at the position C2 positioned apart from the power MOSFET Q2, as compared with the rise at the position C1. In the case in FIGS. 30 and 31, at the position C1, the temperature reaches the peak of about 160° C. after about 0.02 seconds from the start of the heat generation of the power MOSFET Q2. After the temperature at the position C1 reaches about 160° C. to be the peak after about 0.02 seconds, it turns to the descent, which reflects the situation that the diode DD2 detected the excessive heat generation of the power MOSFET Q2 to switch over the power MOSFET Q2 to the OFF state. Therefore, in the graphs in FIGS. 30 and 31, the power MOSFET Q2 lies in a state of heat generation for from 0 to about 0.02 seconds on the horizontal axis. On the other hand, the temperature rise at the position C2 is moderate as compared with the rise at the position C1. The temperature reaches about 110° C. to be the peak temperature after about 0.1 second from the start of the heat generation of the power MOSFET Q2, and, after that, the temperature goes down. The reason why the peak temperature is lower and the time showing the peak temperature is later at the position C2 as compared with the position C1 is that the position C2 is farther from the power MOSFET Q2 than the position C1.

Consequently, when the diode DD1 is arranged at a position corresponding to the position C1, as is the case for the second Comparative Example in FIG. 22, the temperature of the diode DD1 might reach about 160° C. at the excessive heat generation of the power MOSFET Q2, and the diode DD1 might function erroneously. In contrast, when the diode DD1 is arranged at a position corresponding to the position C2 as in FIGS. 24 and 25 (corresponding to Embodiment 1), even when the power MOSFET Q2 generates excessive heat, the temperature of the diode DD1 rises to about 110° C. at the highest, and, therefore, the malfunction of the diode DD1 can be prevented appropriately.

For example, a case where the condition is preset so that the power MOSFET Q1 is turned off forcibly when the temperature of the diode DD1 reaches 170° C. and the power MOSFET Q2 is turned off forcibly when the temperature of the diode DD2 reaches 170° C., is assumed. In this case, when the diode DD1 is arranged at the position corresponding to the position C1, the malfunction of the diode DD1 is feared, but the malfunction can be prevented by arranging the diode DD1 at the position corresponding to the position C2.

Consequently, in Embodiment 1, the malfunction of the diodes DD1 and DD2 can be prevented, and the sensitivity of the diode DD1 for the power MOSFET Q1 and the sensitivity of the diode DD2 for the power MOSFET Q2 can be improved because the detection temperature of the diode DD1 for turning off forcibly the power MOSFET Q1 and the detection temperature of the diode DD2 for turning off forcibly the power MOSFET Q2 can be preset on a lower side. Accordingly, it is possible to improve the performance of the semiconductor device PKG equipped with the semiconductor chip CP1 having the power MOSFETs Q1 and Q2 and the diodes DD1 and DD2, and to improve the reliability.

Embodiment 2

Figure 32:
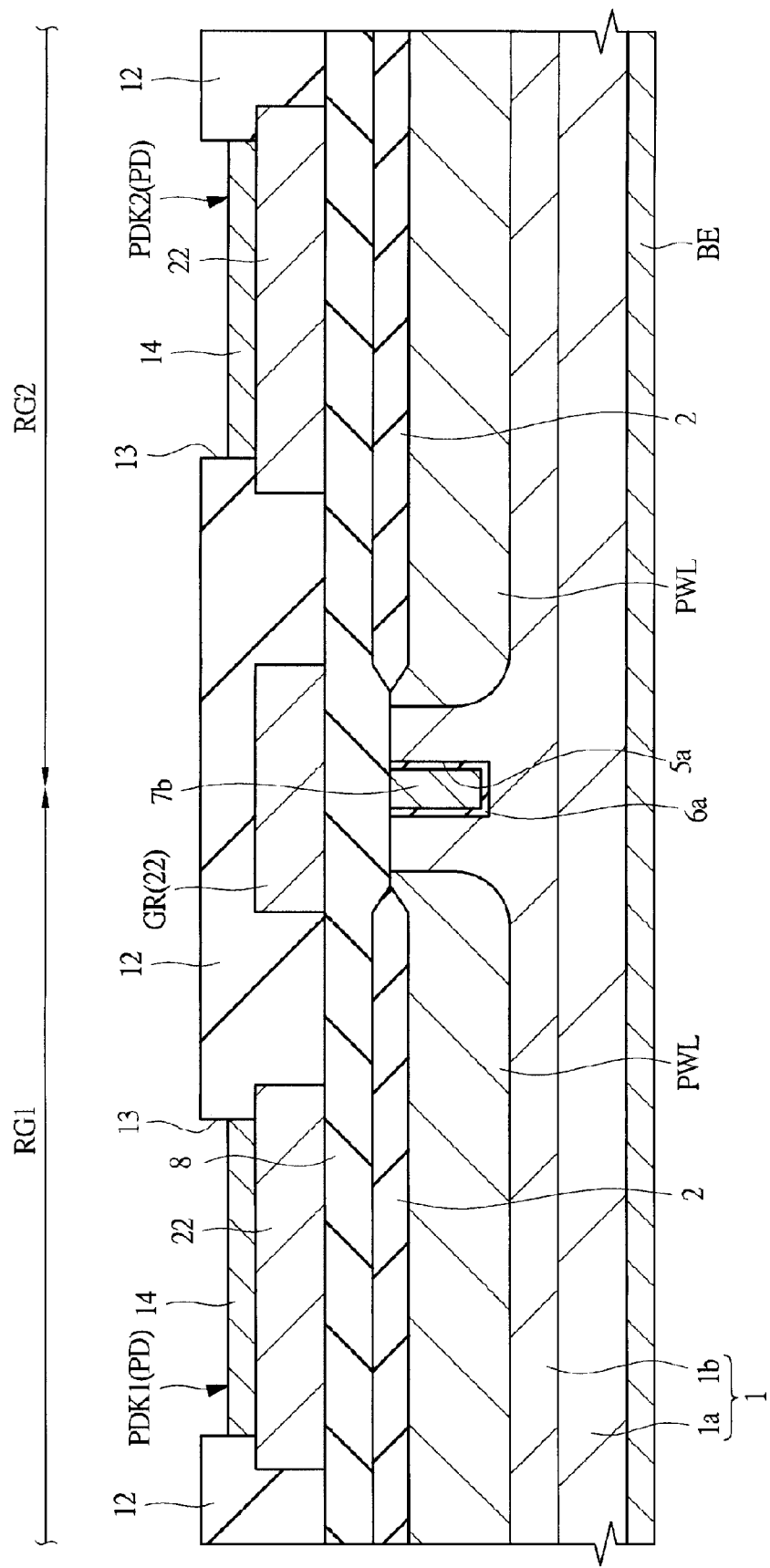
FIG. 32 is a principal part cross-sectional view of the semiconductor chip in another embodiment of the present invention.

FIG. 32 is a principal part cross-sectional view of a semiconductor chip CP1 in Embodiment 2, which corresponds to FIG. 18 in Embodiment 1. FIG. 32 also shows a cross-sectional view intersecting with the boundary between the first MOSFET region RG1 and the second MOSFET region RG2 in the semiconductor chip CP1, in the same manner as FIG. 18.

Embodiment 2 differs from Embodiment 1 in that the semiconductor chip CP1 in Embodiment 2 has a trench 5a provided in the substrate 1, and that, in the trench 5a, a gate electrode 7b of a dummy is embedded via a gate insulating film 6a of a dummy.

The trench 5a is a trench that is formed in the same process as that for the trench 5 constituting the trench gate of the trench gate type MISFET for the power MOSFETs Q1 and Q2. Consequently, the trench 5a and the trench 5 have the same depth.

The gate insulating film 6a of a dummy is an insulating film formed in the same process as that for the gate insulating film 6 of the trench gate type MISFET for the power MOSFETs Q1 and Q2. Consequently, the gate insulating film 6a of a dummy and the gate insulating film 6 are formed from the same insulating material, and, for example, when the gate insulating film 6 is a silicon oxide film, the gate insulating film 6a of a dummy is also constituted by a silicon oxide film. And, the gate insulating film 6a of a dummy and the gate insulating film 6 have approximately the same thickness, reflecting that they are formed in the same process.

The gate electrode 7b of a dummy is formed from an electroconductive body film in the same process as that for the gate electrode 7 constituting the trench gate of the trench gate type MISFET for the power MOSFETs Q1 and Q2. Consequently, the gate electrode 7b of a dummy and the gate electrode 7 are formed from the same material, and, for example, when the gate electrode 7 is a polycrystalline silicon film, the gate electrode 7b of a dummy is also constituted by a polycrystalline silicon film. But, when an impurity has been introduced into the gate electrode 7 by ion implantation in the manufacturing process of the semiconductor chip CP1, there may be such cases that the impurity has also been introduced into the gate electrode 7b of a dummy, and that the impurity is not introduced into the gate electrode 7b of a dummy upon the ion implantation.

Although the gate electrode 7b of a dummy and the gate insulating film 6a of a dummy are formed in the same process as that for the gate electrode 7 and that for the gate insulating film 6 constituting the trench gate type MISFET, respectively, the gate electrode 7b of a dummy and the gate insulating film 6a of a dummy do not constitute the trench gate type MISFET. That is, the gate electrode 7b of a dummy does not function as the gate electrode of the MISFET, and the gate insulating film 6a of a dummy does not function as the gate insulating film of the MISFET. Therefore, the gate electrode 7b of a dummy and the gate insulating film 6a of dummy are referred to as "dummy." Since a floating potential is given to the gate electrode 7b of a dummy, no wiring (the internal wiring of the semiconductor chip CP1, that is, the wiring formed from the electroconductive body film 22) is connected to the gate electrode 7b of a dummy in the semiconductor chip CP1. Accordingly, the gate electrode 7b of a dummy may also be considered as an electroconductive body (electroconductive body part, electroconductive body film) having a floating potential. And, the trench 5a may be considered as a trench in which an electroconductive body having a floating potential (that is, the gate electrode 7b of a dummy) is embedded.

Figure 33:
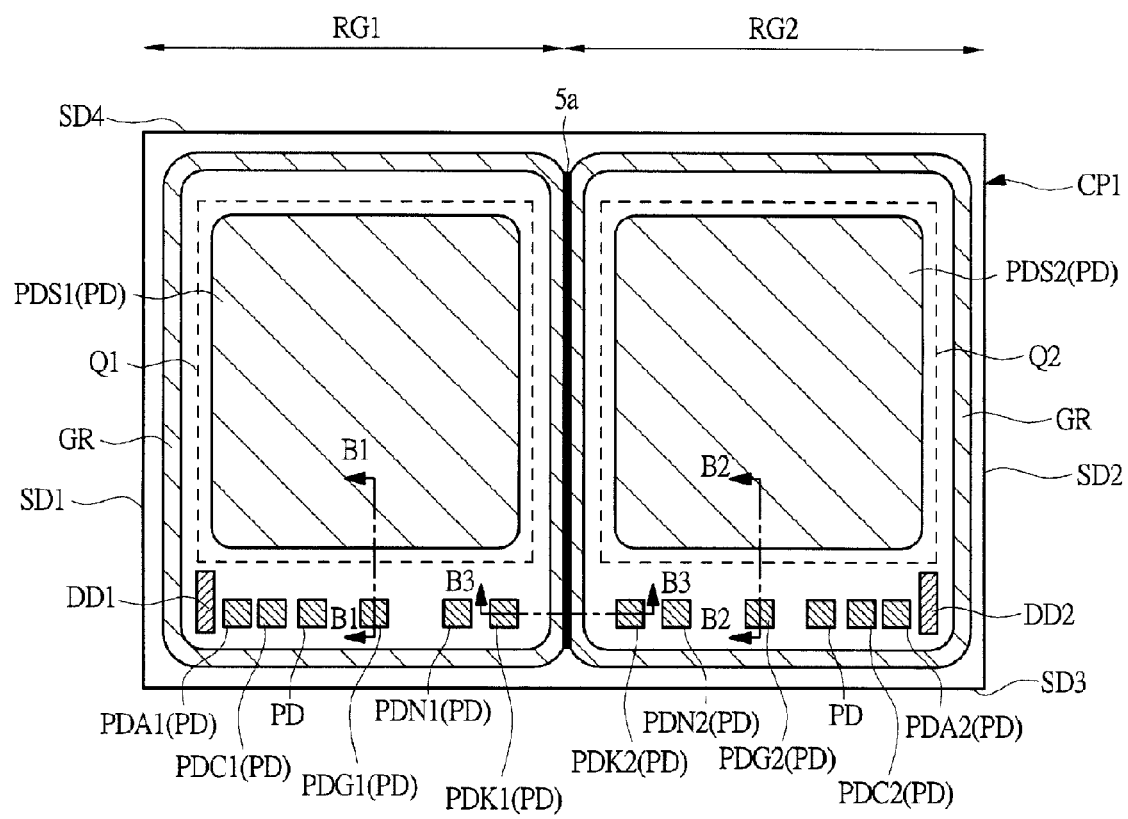
FIG. 33 is a plan view showing the chip layout of the semiconductor chip in another embodiment of the present invention.

In Embodiment 2, the trench 5a, in which the gate electrode 7b of a dummy is embedded via the gate insulating film 6a of a dummy, is provided in the substrate 1, and the forming position of the trench 5a is devised as follows. FIG. 33 is a plan view showing the chip layout of a semiconductor chip CP1 in Embodiment 2, wherein the forming position of the trench 5a in the semiconductor chip CP1 is shown by a thick black line. FIG. 33 corresponds to a drawing formed by adding the forming position of the trench 5a to FIG. 12, and the cross-sectional view at the B2-B2 line in FIG. 33 corresponds approximately to FIG. 32.

That is, in Embodiment 2, as can be known also from FIGS. 32 and 33, the trench 5a is formed (arranged) between the region where the trench gate type MISFET for the power MOSFET Q1 is formed (the region surrounded by the dotted line with the symbol Q1 in FIG. 33) and the region where the trench gate type MISFET for the power MOSFET Q2 is formed (the region surrounded by the dotted line with the symbol Q2 in FIG. 33), in the main surface of the substrate 1 constituting the semiconductor chip CP1. Since the trench 5a extends up to a position between the diode DD1 and the diode DD2 (the middle of the diode DD1 and the diode DD2 in the case in FIG. 33), it is also possible to say that the trench 5a is formed between the diode DD1 and the diode DD2. From another standpoint, the trench 5a is formed (arranged) at the boundary between the first MOSFET region RG1 and the second MOSFET region RG2, in the main surface of the substrate 1 constituting the semiconductor chip CP1. When the guard ring GR is provided for the semiconductor chip CP1, since the guard ring GR is formed between the region where the trench gate type MISFET for the power MOSFET Q1 is formed and the region where the trench gate type MISFET for the power MOSFET Q2 is formed in the main surface of the substrate 1 constituting the semiconductor chip CP1, the trench 5a is formed (arranged) below the guard ring GR. The gate electrode 7b of a dummy embedded in the trench 5a is not connected electrically to the guard ring GR, because a floating potential is to be given to it.

The other configuration in Embodiment 2 is the same as that in Embodiment 1, and the explanation thereof is omitted here.

The trench 5a, in which the gate electrode 7b of a dummy is embedded via the gate insulating film 6a of a dummy, can function so as to hinder the heat transfer. That is, when the region where the trench 5a is not formed is compared with the region where the trench 5a is formed, the region where the trench 5a is not formed transfers heat easier in the planer direction of the substrate 1 (the direction parallel to the main surface of the substrate 1). Accordingly, by providing the trench 5a at the above-described position, in which the gate electrode 7b of a dummy is embedded via the gate insulating film 6a of a dummy, it is possible not to allow the heat generated by the power MOSFET Q1 to transfer easily to the second MOSFET region RG2 by the existence of the trench 5a, and not to allow the heat generated by the power MOSFET Q2 to transfer easily to the first MOSFET region RG1 by the existence of the trench 5a. As described above, by providing the trench 5a, the diode DD2 in the second MOSFET region RG2 is more hardly influenced by the heat generated by the power MOSFET Q1 in the first MOSFET region RG1, and the diode DD1 in the first MOSFET region RG1 is more hardly influenced by the heat generated by the power MOSFET Q2 in the second MOSFET region RG2. Therefore, the malfunction of the diodes DD1 and DD2 can be prevented more appropriately. This can improve more appropriately the performance of the semiconductor device, and improve more appropriately the reliability of the semiconductor device. Embodiment 2 can also be applied to Embodiment 3 to be described later.

Embodiment 3

Figure 34:
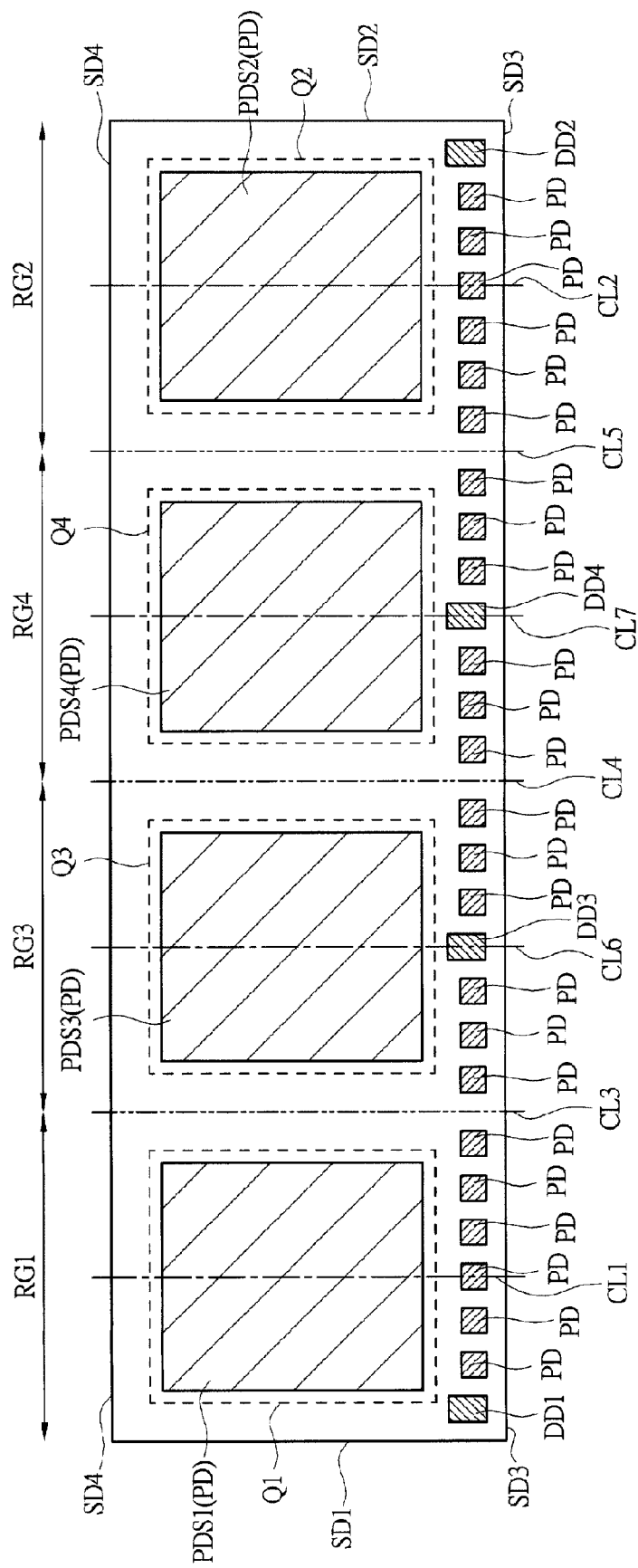
FIG. 34 is a plan view showing of the chip layout of the semiconductor chip in another embodiment of the present invention.

FIG. 34 is a plan view (top view) showing the chip layout of a semiconductor chip CP1 in Embodiment 3, and corresponds to FIGS. 12 and 13, FIGS. 26 to 28 etc. Meanwhile, although FIG. 34 is a plan view, in order to make the understanding easy, it is shown with hatching attached to pad electrodes PD, and regions where the diode DD1, DD2, DD3, or DD4 is formed. In FIG. 34, the region, where the vertical power MOSFET corresponding to a power MOSFET Q1a is formed, is schematically shown by surrounding it by a dotted line with a symbol Q1, and the region, where the vertical power MOSFET corresponding to a power MOSFET Q2a is formed, is schematically shown by surrounding it by a dotted line with a symbol Q2. And, in FIG. 34, the region, where the vertical power MOSFET corresponding to a power MOSFET Q3a is formed, is schematically shown by surrounding it by a dotted line with a symbol Q3, and the region, where the vertical power MOSFET corresponding to a power MOSFET Q4a is formed, is schematically shown by surrounding it by a dotted line with a symbol Q4.

In Embodiment 1, the semiconductor chip CP1 has two built-in power MOSFETs Q1 and Q2 as two switching elements, and two built-in diodes DD1 and DD2 for detecting the heat generation (temperature) thereof. In contrast, in Embodiment 3, the semiconductor chip CP1 has n (here, n is an integer of three or more) built-in power MOSFETs (in FIG. 34, four power MOSFETs Q1, Q2, Q3 and Q4) as a switching element, and n built-in diodes (in FIG. 34, four diodes DD1, DD2, DD3 and DD4) for detecting the heat generation (temperature) thereof. In the main surface of the semiconductor chip CP1, n power MOSFETs are arranged in a line in order from the side SD1 toward the side SD2. In FIG. 34, the power MOSFET Q1, the power MOSFET Q3, the power MOSFET Q4 and the power MOSFET Q2 are arranged in a line in the order from the side SD1 toward the side SD2, between the side SD1 and the side SD2 in the main surface of the semiconductor chip CP1. Hereinafter, a case where the number of power MOSFETs as a switching element formed in the semiconductor chip CP1 is four, is taken as an example and explained. But, the number is not limited to 4, if only the number is 3 or more.

Respective power MOSFETs Q1, Q2, Q3 and Q4 formed for the semiconductor chip CP1 function as switching elements that are controlled independently from one another, and are controlled by the semiconductor chip CP2. In Embodiment 3, too, the configuration of respective power MOSFETs Q1, Q2, Q3 and Q4 is approximately the same as the configuration of respective power MOSFETs Q1 and Q2 in Embodiment 1, and the configuration of respective diodes DD1, DD2, DD3 and DD4 is approximately the same as the configuration of respective diodes DD1 and DD2 in Embodiment 1. Accordingly, each of power MOSFETs Q1, Q2, Q3 and Q4 built in the semiconductor chip CP1 is formed by the vertical power MOSFET formed for the semiconductor chip CP1, more specifically, by the MISFET of the trench gate type formed for the semiconductor chip CP1, as is the case for the power MOSFETs Q1 and Q2 in Embodiment 1.

The drain of the power MOSFETs Q1, Q2, Q3 and Q4 is connected electrically to the back electrode BE of the semiconductor chip CP1. The pad electrode PDS1 shown in FIG. 34 is the pad electrode (bonding pad) connected electrically to the source of the power MOSFET Q1 formed in the semiconductor chip CP1, and the pad electrode PDS2 shown in FIG. 34 is the pad electrode (bonding pad) connected electrically to the source of the power MOSFET Q2 formed in the semiconductor chip CP1, as is the case for Embodiment 1. The pad electrode PDS3 shown in FIG. 34 is the pad electrode (bonding pad) connected electrically to the source of the power MOSFET Q3 formed in the semiconductor chip CP1, and the pad electrode PDS4 shown in FIG. 34 is the pad electrode (bonding pad) connected electrically to the source of the power MOSFET Q4 formed in the semiconductor chip CP1. Plural pad electrodes PD belonging to the semiconductor chip CP1 include the pad electrodes PDS1, PDS2, PDS3 and PDS4 for the source, and furthermore include pad electrodes connected electrically to respective gates of the power MOSFETs Q1, Q2, Q3 and Q4, pad electrodes connected electrically to respective anodes of the diodes DD1, DD2, DD3 and DD4, pad electrodes connected electrically to respective cathodes of the diodes DD1, DD2, DD3 and DD4, etc. In FIG. 34, to pad electrodes PD other than the pad electrodes PDS1, PDS2, PDS3 and PDS4 for the source, the same symbol PD is given without discrimination. When the semiconductor chip CP1 in Embodiment 3 is packaged in the same manner as in Embodiment 1 to constitute the semiconductor device PKG, metal plates similar to the metal plates MPL1 and MPL2 are connected not only to the pad electrodes PDS1 and PDS2 for the source, but also to PDS3 and PDS4 for the source.

In Embodiment 3, too, as is the case for Embodiment 1, the diode DD1 is a diode for detecting the heat generation (temperature) of the power MOSFET Q1 and is arranged in the first MOSFET region RG1 with the power MOSFET Q1, and the diode DD2 is a diode for detecting the heat generation (temperature) of the power MOSFET Q2 and is arranged in the second MOSFET region RG2 with the power MOSFET Q2. The diode DD3 is a diode for detecting the heat generation (temperature) of the power MOSFET Q3 and is arranged in the third MOSFET region RG3 with the power MOSFET Q3, and the diode DD4 is a diode for detecting the heat generation (temperature) of the power MOSFET Q4 and is arranged in the fourth MOSFET region RG4 with the power MOSFET Q4.

As shown in FIG. 34, in the semiconductor chip CP1 in Embodiment 3, the semiconductor chip CP1 is divided into approximately equal four sections (regions), in the plan view, between two sides SD1 and SD2 of the semiconductor chip CP1 facing each other (that is, quadrisected), and these four sections are the first MOSFET region RG1, the second MOSFET region RG2, the third MOSFET region RG3 and the fourth MOSFET region RG4, respectively. In the main surface of the semiconductor chip CP1, from the side of the side SD1 toward the side of the side SD2, the first MOSFET region RG1, the third MOSFET region RG3, the fourth MOSFET region RG4 and the second MOSFET region RG2 are in a row in this order. In FIG. 34, lines CL3, CL4 and CL5 shown by a dashed two-dotted line are imaginary boundary lines (dividing lines) when the semiconductor chip CP1 is quadrisected between the side SD1 and the side SD2, and are parallel to the sides SD1 and SD2. The boundary between the first MOSFET region RG1 and the third MOSFET region RG3 approximately corresponds to the line CL3, the boundary between the third MOSFET region RG3 and the fourth MOSFET region RG4 approximately corresponds to the line CL4, and the boundary between the fourth MOSFET region RG4 and the second MOSFET region RG2 approximately corresponds to the line CL5.

The configuration of the first MOSFET region RG1 and the second MOSFET region RG2 in the semiconductor chip CP1 in Embodiment 3 is approximately the same as the configuration of the first MOSFET region RG1 and the second MOSFET region RG2 in the semiconductor chip CP1 in Embodiment 1. Therefore, here, the configuration of the third MOSFET region RG3 and the fourth MOSFET region RG4 in the semiconductor chip CP1 in Embodiment 3 will be explained mainly.

In the third MOSFET region RG3 of the semiconductor chip CP1, the power MOSFET Q3 and the diode DD3, and the pad electrode PD connected electrically to either the power MOSFET Q3 or the diode DD3 are arranged. Pad electrodes PD arranged in the third MOSFET region RG3 include the pad electrode PDS3 connected electrically to the source of the power MOSFET Q3, the pad electrode PD connected electrically to the gate of the power MOSFET Q3, the pad electrode PD connected electrically to the anode of the diode DD3, and the pad electrode PD connected electrically to the cathode of the diode DD3. In the fourth MOSFET region RG4 of the semiconductor chip CP1, the power MOSFET Q4 and the diode DD4, and the pad electrode PD connected electrically to either the power MOSFET Q4 or the diode DD4 are arranged. Pad electrodes PD arranged in the fourth MOSFET region RG4 include the pad electrode PDS4 connected electrically to the source of the power MOSFET Q4, the pad electrode PD connected electrically to the gate of the power MOSFET Q4, the pad electrode PD connected electrically to the anode of the diode DD4, and the pad electrode PD connected electrically to the cathode of the diode DD4.

In order to prevent the malfunction of the diode DD3, desirably the diode DD3 is sensitive to the heat generation of the power MOSFET Q3 and insensitive to the heat generation of the power MOSFETs Q1, Q2 and Q4. Therefore, it preferably lies near the power MOSFET Q3 and apart from the power MOSFETs Q1, Q2 and Q4 as far as possible. And, in order to prevent the malfunction of the diode DD4, desirably the diode DD4 is sensitive to the heat generation of the power MOSFET Q4 and insensitive to the heat generation of the power MOSFETs Q1, Q2 and Q3. Therefore, it preferably lies near the power MOSFET Q4 and apart from the power MOSFETs Q1, Q2 and Q3 as far as possible.

Since the third MOSFET region RG3 where the diode DD3 is formed is sandwiched between the first MOSFET region RG1 where the power MOSFET Q1 is formed and the fourth MOSFET region RG4 where the power MOSFET Q4 is formed, if the diode DD3 lies near either of the power MOSFETs Q1 and Q4, there is the anxiety of the malfunction of the diode DD3 when either of the power MOSFETs positioned nearer to the diode DD3 in the power MOSFETs Q1 and Q4 generates heat.

In order to prevent the malfunction of the diode DD3, the diode DD3 for detecting the heat generated by the power MOSFET Q3 is arranged so that intervals from the power MOSFETs Q1 and Q4 positioned on both sides of the power MOSFET Q3 for which the heat generation should be detected are approximately the same, in the main surface of the semiconductor chip CP1. That is, the diode DD3 is arranged so that the interval (spacing) between the diode DD3 and the power MOSFET Q1 and the interval (spacing) between the diode DD3 and the power MOSFET Q4 are approximately the same, in the main surface (the third MOSFET region RG3) of the semiconductor chip CP1. In other words, the diode DD3 is arranged at the position positioned in the third MOSFET region RG3 with an equal interval from the power MOSFETs Q1 and Q4, in the main surface of the semiconductor chip CP1. Consequently, since the diode DD3 lies nearer to neither the power MOSFET Q1 nor the power MOSFET Q4, the malfunction of the diode DD3 can be suppressed or prevented.

As to the diode DD4, too, from the same standpoint, in order to prevent the malfunction of the diode DD4, the diode DD4 for detecting the heat generated by the power MOSFET Q4 is arranged so that intervals from the power MOSFETs Q2 and Q3 positioned on both sides of the power MOSFET Q4 for which the heat generation should be detected are approximately the same, in the main surface of the semiconductor chip CP1. That is, the diode DD4 is arranged so that the interval (spacing) between the diode DD4 and the power MOSFET Q3 and the interval (spacing) between the diode DD4 and the power MOSFET Q2 are approximately the same, in the main surface (the fourth MOSFET region RG4) of the semiconductor chip CP1. In other words, the diode DD4 is arranged at the position positioned in the fourth MOSFET region RG4 with an equal interval from the power MOSFETs Q2 and Q3, in the main surface of the semiconductor chip CP1. Consequently, since the diode DD4 lies nearer to neither the power MOSFET Q3 nor the power MOSFET Q2, the malfunction of the diode DD4 can be suppressed or prevented.

In order to arrange the diodes DD3 and DD4 so that the interval between the diode DD3 and the power MOSFET Q1 and the interval between the diode DD3 and the power MOSFET Q4 are approximately the same, and the interval between the diode DD4 and the power MOSFET Q3 and the interval between the diode DD4 and the power MOSFET Q2 are approximately the same, in the main surface of the semiconductor chip CP1, specifically it is enough to employ a method as described below.

That is, as shown in FIG. 34, diode DD3 is arranged near the center in the third MOSFET region RG3 in the direction along the side SD3, and the diode DD4 is arranged near the center in the fourth MOSFET region RG4 in the direction along the side SD3. Based on the expression according to another standpoint, the diode DD3 is arranged approximately on the centerline CL6 of the third MOSFET region RG3, and the diode DD4 is arranged approximately on the centerline CL7 of the fourth MOSFET region RG4.

Here, the centerlines CL6 and CL7 are imaginary lines, which are shown by a dashed one-dotted line in FIG. 34. The centerline CL6 is parallel to the sides SD1 and SD2, and is a line bisecting the third MOSFET region RG3 between the line CL3 and the line CL4. The centerline CL7 is parallel to the sides SD1 and SD2, and is a line bisecting the fourth MOSFET region RG4 between the line CL4 and the line CL5. Between the line CL3 and the line CL4 (more specifically, at the center), the centerline CL6 lies, and, between the line CL4 and the line CL5 (more specifically, at the center), the centerline CL7 lies. Meanwhile, in Embodiment 3, the centerline CL1 is a line bisecting the first MOSFET region RG1 between the side SD1 and the line CL3, and the centerline CL2 is a line bisecting the second MOSFET region RG2 between the side SD2 and the line CL5.

When the position of the diode DD3 is shifted from the position on the centerline CL6 to the first MOSFET region RG1 side, differing from Embodiment 3, the interval between the diode DD3 and the power MOSFET Q1 is shortened, and there is an anxiety of the malfunction of the diode DD3 when the power MOSFET Q1 generates excessive heat. On the other hand, when the position of the diode DD3 is shifted from the position on the centerline CL6 to the fourth MOSFET region RG4 side, differing from Embodiment 3, the interval between the diode DD3 and the power MOSFET Q4 is shortened, and there is an anxiety of the malfunction of the diode DD3 when the power MOSFET Q4 generates excessive heat.

In contrast, in Embodiment 3, the diode DD3 is arranged near the center in the third MOSFET region RG3 in the direction along the side SD3 (that is, the diode DD3 is arranged approximately on the centerline CL6), and, consequently, the interval between the diode DD3 and the power MOSFET Q1 and the interval between the diode DD3 and the power MOSFET Q4 are approximately the same. Therefore, since the diode DD3 lies nearer to neither the power MOSFET Q1 nor the power MOSFET Q4, the malfunction of the diode DD3 can be suppressed or prevented. In the same manner, the diode DD4 is arranged near the center in the fourth MOSFET region RG4 in the direction along the side SD3 (that is, the diode DD4 is arranged approximately on the centerline CL7), and, consequently, the interval between the diode DD4 and the power MOSFET Q3 and the interval between the diode DD4 and the power MOSFET Q2 are approximately the same. Therefore, since the diode DD4 lies nearer to neither the power MOSFET Q3 nor the power MOSFET Q2, the malfunction of the diode DD4 can be suppressed or prevented.

Moreover, it is more preferable to set the relative position of the diode DD3 in the third MOSFET region RG3 and the relative position of the diode DD4 in the fourth MOSFET region RG4 to be the same. This makes it possible to give the same configuration (structure) to the third MOSFET region RG3 and the fourth MOSFET region RG4, in the semiconductor chip CP1. When the same configuration is given to the third MOSFET region RG3 and the fourth MOSFET region RG4, the semiconductor chip CP1 can be manufactured easily to reduce the manufacturing cost of the semiconductor chip CP1.

When the number n of power MOSFETs for a switch (which correspond to each of the power MOSFETs Q1, Q2, Q3 and Q4) formed for the semiconductor chip CP1 is 3, it may be constituted so that, in the semiconductor chip CP1 in Embodiment 3 shown in FIG. 34, the fourth MOSFET region RG4 is omitted and the third MOSFET region RG3 is directly linked with the second MOSFET region RG2. When the number of power MOSFETs for a switch (which correspond to each of the power MOSFETs Q1, Q2, Q3 and Q4) formed for the semiconductor chip CP1 is 5 or more, in the semiconductor chip CP1 in Embodiment 3 shown in FIG. 34, it is sufficient to add a MOSFET region having the same configuration as the third MOSFET region RG3 between the third MOSFET region RG3 and the fourth MOSFET region RG4.

The configuration of the first MOSFET region RG1 and the second MOSFET region RG2 is approximately the same as that of the first MOSFET region RG1 and the second MOSFET region RG2 in the semiconductor chip CP1 in Embodiment 1, and the arrangement of the diodes DD1 and DD2 needs to satisfy the first requisite.

But, in Embodiment 3, as the result of the configuration that the first MOSFET region RG1 and the second MOSFET region RG2 are not adjacent to each other in the main surface of the semiconductor chip CP1, the first requisite is represented as follows.

That is, as the first requisite in Embodiment 3, the diode DD1 for detecting the heat generation (temperature) of the power MOSFET Q1 is arranged so as to lie nearer to the side SD1 of the semiconductor chip CP1, instead of the third MOSFET region RG3 (more specifically the power MOSFET Q3) adjacent to the first MOSFET region RG1 (more specifically the power MOSFET Q1), in the main surface of the semiconductor chip CP1 (the first MOSFET region RG1 thereof). And, the diode DD2 for detecting the heat generation (temperature) of the power MOSFET Q2 is arranged so as to lie nearer to the side SD2 of the semiconductor chip CP1, instead of the fourth MOSFET region RG4 (more specifically the power MOSFET Q4) adjacent to the second MOSFET region RG2 (more specifically the power MOSFET Q2), in the main surface of the semiconductor chip CP1 (the second MOSFET region RG2 thereof). As described above, it is sufficient to read "the third MOSFET region RG3" and "the power MOSFET Q3" in Embodiment 3 for "the second MOSFET region RG2" and "the power MOSFET Q2" when the position of the diode DD1 was explained on the basis of the first requisite in Embodiment 1. In the same manner, it is sufficient to read "the fourth MOSFET region RG4" and "the power MOSFET Q4" in Embodiment 3 for "the first MOSFET region RG1" and "the power MOSFET Q1" when the position of the diode DD2 was explained on the basis of the first requisite in Embodiment 1. In Embodiment 3, too, the malfunction of the diodes DD1 and DD2 can be suppressed or prevented, as in Embodiment 1.

That is, in the semiconductor chip CP1 for which n (n is an integer of 3 or more) power MOSFETs (which correspond to each of the power MOSFETs Q1, Q2, Q3 and Q4) and n diodes for detecting the heat generation thereof are formed, when n power MOSFETs are arranged from the side SD1 toward the side SD2 in a row in the order in the main surface of the semiconductor chip CP1, the first requisite is represented as follows.

That is, a first diode (the diode DD1 in the case in FIG. 34) for detecting the heat generation of a first power MOSFET (the power MOSFET Q1 in the case in FIG. 34) positioned nearest to the side SD1 among n power MOSFETs is arranged so as to lie nearer to the side SD1, instead of a second power MOSFET (the power MOSFET Q3 in the case in FIG. 34) positioned adjacent to the first power MOSFET (Q1) in the main surface of the semiconductor chip CP1. An nth diode (the diode DD2 in the case in FIG. 34) for detecting the heat generation of an nth power MOSFET (the power MOSFET Q2 in the case in FIG. 34) positioned nearest to the side SD2 among n power MOSFETs is arranged so as to lie nearer to the side SD2, instead of an (n−1)th MOSFET (the power MOSFET Q4 in the case in FIG. 34) positioned adjacent to the nth power MOSFET (Q2) in the main surface of the semiconductor chip CP1. And, each of from the second to the (n−1)th diodes (diodes DD3 and DD4 in the case in FIG. 34) for detecting the heat generation of from the second to the (n−1)th power MOSFETs (power MOSFETs Q3 and Q4 in the case in FIG. 34) is arranged so as to have approximately the same interval from power MOSFETs on both sides of the power MOSFET for which the heat generation is to be detected, in the main surface of the semiconductor chip CP1. Here, n power MOSFETs formed for the semiconductor chip CP1 are referred to as the first power MOSFET, the second power MOSFET, . . . , and the nth power MOSFET from the side SD1 toward the side SD2 in this order, and diodes for detecting the heat generation (temperature) thereof are referred to as the first diode, the second diode, . . . , and the nth diode.

This makes it possible to suppress or prevent the malfunction of diodes in the semiconductor chip CP1 for which n power MOSFETs and n diodes for detecting the heat generation thereof are formed. This can improve the performance of the semiconductor device, and improve the reliability of the semiconductor device.

In Embodiment 3, too, as in Embodiment 1, preferably the diode DD1 is arranged along the side SD1 in the main surface of the semiconductor chip CP1 and the diode DD2 is arranged along the side SD2 in the main surface of the semiconductor chip CP1, as shown in FIG. 34. This can enhance the effect of preventing the malfunction of the diodes DD1 and DD2.

As described above, by devising the arrangement position of the diodes DD1, DD2, DD3 and DD4 in the main surface of the semiconductor chip CP1, the malfunction of the diodes DD1, DD2, DD3 and DD4 can be prevented.

Moreover, in Embodiment 3, too, as in Embodiment 1, among plural pad electrodes PD belonging to the semiconductor chip CP1, preferably the pad electrodes PD excluding the pad electrodes PDS1, PDS2, PDS3 and PDS4 for the source are arranged (arrayed) along the side SD3 of the semiconductor chip CP1, as shown in FIG. 34.

In Embodiment 1, all pad electrodes PD excluding the pad electrodes PDS1 and PDS2 for the source are arranged between the diode DD1 and the diode DD2, in the main surface of the semiconductor chip CP1. Corresponding to it, in Embodiment 3, too, preferably all pad electrodes PD excluding the pad electrodes PDS1, PDS2, PDS3 and PDS4 for the source are arranged between the diodes DD1, DD2, DD3 and DD4, as shown in FIG. 34, too. This can suppress the temperature rise of the diode DD1 caused by the heat generation of the power MOSFET Q2, Q3 or Q4, the temperature rise of the diode DD2 caused by the heat generation of the power MOSFET Q1, Q3 or Q4, the temperature rise of the diode DD3 caused by the heat generation of the power MOSFET Q1, Q2 or Q4, and the temperature rise of the diode DD4 caused by the heat generation of the power MOSFET Q1, Q2 or Q3. Accordingly, the effect of preventing the malfunction of the diodes DD1, DD2, DD3 and DD4 can be enhanced.

In the above, the invention accomplished by the present inventors has been specifically explained based on the embodiments. However, needless to say, the present invention is not restricted to the embodiments, and it can be changed variously in the range which does not deviate from the gist.

The present invention is favorable when applied to semiconductor devices in a form of a semiconductor package and the manufacturing method thereof.

What is claimed is:

1. A semiconductor device comprising a first semiconductor chip having a first side and a second side facing the first side,
wherein:
a first circuit, a second circuit, a first diode for detecting the heat generation of the first circuit, a second diode for detecting the heat generation of the second circuit, and plural first pad electrodes are formed for the first semiconductor chip,
the first circuit is arranged so as to lie nearer to the first side instead of the second side in the main surface of the first semiconductor chip,
the second circuit is arranged between the first circuit and the second side in the main surface of the first semiconductor chip,
the first diode is arranged so as to lie nearer to the first side instead of the second circuit in the main surface of the first semiconductor chip,
the second diode is arranged so as to lie nearer to the second side instead of the first circuit in the main surface of the first semiconductor chip,
the plural first pad electrodes include a first pad electrode for the source connected electrically to the first circuit and a second pad electrode for the source connected electrically to the second circuit, and
at least one among the plural first pad electrodes excluding the first and second pad electrodes for the source is arranged between the first diode and the second diode in the main surface of the first semiconductor chip.

2. The semiconductor device according to claim 1,
wherein:
the first diode is arranged along the first side in the main surface of the first semiconductor chip, and
the second diode is arranged along the second side in the main surface of the first semiconductor chip.

3. The semiconductor device according to claim 2,
wherein the plural first pad electrodes excluding the first and second pad electrodes for the source are arranged between the first diode and the second diode in the main surface of the first semiconductor chip.

4. The semiconductor device according to claim 3,
wherein:
the first semiconductor chip has a third side intersecting with the first and second sides and a fourth side facing the third side, and
the plural first pad electrodes excluding the first and second pad electrodes for the source are arranged along the third side between the first diode and second diode in the main surface of the first semiconductor chip.

5. The semiconductor device according to claim 4,
wherein:
the first diode is arranged near a first corner part formed by the first side and the third side in the main surface of the first semiconductor chip, and
the second diode is arranged near a second corner part formed by the second side and the third side in the main surface of the first semiconductor chip.

6. The semiconductor device according to claim 5,
wherein:
among the plural first pad electrodes, the first pad electrode connected electrically to the first circuit or the first diode is arranged so as to lie nearer to the first side instead of the second side in the main surface of the first semiconductor chip, and
among the plural first pad electrodes excluding the first and second pad electrodes for the source, the first pad electrode connected electrically to the second circuit or the second diode is arranged so as to lie nearer to the second side instead of the first side in the main surface of the first semiconductor chip.

7. The semiconductor device according to claim 6,
wherein:
the first and second pad electrodes for the source are arranged between the plural first pad electrodes excluding the first and second pad electrodes for the source and the fourth side in the main surface of the first semiconductor chip,
the first pad electrode for the source is arranged so as to lie nearer to the first side instead of the second side in the main surface of the first semiconductor chip, and
the second pad electrode for the source is arranged between the first pad electrode for the source and the second side in the main surface of the first semiconductor chip.

8. The semiconductor device according to claim 7,
wherein the first and second pad electrodes for the source have a larger planar area than the plural first pad electrodes excluding the first and second pad electrodes for the source.

9. The semiconductor device according to claim 8,
wherein:
the first pad electrode for the source is formed at the upper part of the first circuit, and
the second pad electrode for the source is formed at the upper part of the second circuit.

10. The semiconductor device according to claim 9,
wherein the plural first pad electrodes include a first pad electrode for the gate connected electrically to the first circuit, a first pad electrode for the anode and a first pad electrode for the cathode connected electrically to the first diode, a second pad electrode for the gate connected electrically to the second circuit, and a second pad electrode for the anode and a second pad electrode for the cathode connected electrically to the second diode.

11. The semiconductor device according to claim 10, wherein, to the plural first pad electrodes arranged between the first diode and the second diode among the plural first pad electrodes, plural wires are connected respectively.

12. The semiconductor device according to claim 11, further comprising a second semiconductor chip for controlling the first semiconductor chip,
wherein:
the second semiconductor chip is arranged so as to lie nearer to the third side instead of the fourth side of the first semiconductor chip, and
the second semiconductor chip has plural second pad electrodes to which the plural wires are connected respectively.

13. The semiconductor device according to claim 12, wherein:
the second semiconductor chip has a fifth side,
the first and the second semiconductor chips are arranged so that the fifth side of the second semiconductor chip faces the third side of the first semiconductor chip, and
the plural second pad electrodes are arranged along the fifth side in the main surface of the second semiconductor chip.

14. The semiconductor device according to claim 13, wherein each of the first circuit and the second circuit is formed from a trench gate type MISFET.

15. The semiconductor device according to claim 14, wherein:
the first semiconductor chip has a back electrode for the drain, and
the back electrode is connected electrically to the drain of the first circuit and the drain of the second circuit.

16. The semiconductor device according to claim 15, wherein each of the first circuit and the second circuit is a MISFET for a switch and is controllable independently from each other.

17. The semiconductor device according to claim 16, wherein a first trench, in which an electroconductive body of a floating potential is embedded, is formed between a region where a trench gate type MISFET for the first circuit is formed and a region where a trench gate type MISFET for the second circuit is formed in the main surface of a semiconductor substrate constituting the first semiconductor chip.

18. The semiconductor device according to claim 17, wherein the first trench is a trench formed in the same process as that for forming the trench gate of the trench gate type MISFET.

19. A semiconductor device comprising a first semiconductor chip having a first side, a second side facing the first side, a third side intersecting with the first and the second sides and a fourth side facing the third side,
wherein:
n first circuits and n diodes for each detecting the heat generation of the n first circuits are formed for the first semiconductor chip, n being an integer of 3 or more,
the n first circuits are arranged in a row in the order from the first side toward the second side in the main surface of the first semiconductor chip,
a first diode of the diodes for detecting the heat generation of the first circuits positioned nearest to the first side among the n first circuits is arranged so as to lie nearer to the first side instead of the second first circuits adjacent to the first circuit in the main surface of the first semiconductor chip,
an nth diode of the diodes for detecting the heat generation of the nth first circuits positioned nearest to the second side among the n first circuits is arranged so as to lie nearer to the second side instead of an (n−1)th first circuits adjacent to the nth first circuits in the main surface of the first semiconductor chip, and
each of the second to the (n−1)th diodes for detecting the heat generation of the second first circuits to the (n−1)th first circuits is arranged so as to have an approximately the same interval from the first circuits positioned on both sides of the first circuit for which the heat generation is to be detected in the main surface of the first semiconductor chip.

20. The semiconductor device according to claim 19, wherein the second to the (n−1)th diodes are arranged along the third side in the main surface of the first semiconductor chip.

21. The semiconductor device according to claim 20, wherein:
the first diode is arranged along the first side in the main surface of the first semiconductor chip, and
the second diode is arranged along the second side in the main surface of the first semiconductor chip.

22. The semiconductor device according to claim 21, wherein:
the first semiconductor chip further comprises plural pad electrodes,
the plural pad electrodes include n pad electrodes for the source each connected electrically to the n first circuits, and
the plural pad electrodes excluding the n pad electrodes for the source are arranged between the n diodes along the third side in the main surface of the first semiconductor chip.

* * * * *